(12) United States Patent
Kasakura et al.

(10) Patent No.: US 9,332,599 B2
(45) Date of Patent: May 3, 2016

(54) CIRCUIT BOARD FOR SUPPORTING SEMICONDUCTOR LIGHT-EMITTING DEVICE MOUNTED THEREON, LIGHT-EMITTING MODULE, LIGHTING APPARATUS, AND LIGHTING SYSTEM

(71) Applicant: MITSUBISHI CHEMICAL CORPORATION, Chiyoda-ku (JP)

(72) Inventors: Akeo Kasakura, Chiyoda-ku (JP); Shuuji Onaka, Chiyoda-ku (JP); Toru Takeda, Chiyoda-ku (JP); Yoshihito Satou, Chiyoda-ku (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 214 days.

(21) Appl. No.: 14/155,782

(22) Filed: Jan. 15, 2014

(65) Prior Publication Data

US 2014/0191655 A1  Jul. 10, 2014

Related U.S. Application Data

(63) Continuation of application No. PCT/JP2011/069739, filed on Aug. 31, 2011.

(30) Foreign Application Priority Data

Jul. 15, 2011 (JP) ................................. 2011-157038

(51) Int. Cl.
*H05B 33/08* (2006.01)
*H01L 25/075* (2006.01)
(Continued)

(52) U.S. Cl.
CPC .......... *H05B 33/0803* (2013.01); *F21V 29/004* (2013.01); *H01L 25/0753* (2013.01);
(Continued)

(58) Field of Classification Search
USPC ............. 315/32–34, 185 R–363; 257/78–103
See application file for complete search history.

(56) References Cited

U.S. PATENT DOCUMENTS 8,508,141 B2    8/2013  Takeda et al.
2003/0189829 A1  10/2003  Shimizu et al.
(Continued)

FOREIGN PATENT DOCUMENTS

EP    1 760 784 A2    3/2007
JP    2001-203396 A   7/2001
(Continued)

OTHER PUBLICATIONS

Extended Search Report issued May 14, 2014 in European Patent Application No. 11869629.3.
(Continued)

*Primary Examiner* — Douglas W Owens
*Assistant Examiner* — Jonathan Cooper
(74) *Attorney, Agent, or Firm* — Oblon, McClelland, Maier & Neustadt, L.L.P

(57) ABSTRACT

The present invention provides a technology related to an improvement in the performance of releasing heat generated in a semiconductor light-emitting device. In a light-emitting module including a semiconductor light-emitting device provided with at least a semiconductor light-emitting element and a phosphor, and a circuit board, on the circuit board, at least a semiconductor light-emitting device including a plurality of semiconductor light-emitting elements each having a different path of a drive current to be supplied thereto, or a plurality of semiconductor light-emitting devices each having a different path of a drive current to be supplied to the semiconductor light-emitting elements is mounted. The circuit board is provided with a base material portion formed using a heat-conducting material, and a power supply conductor layer for supplying the drive currents of the semiconductor light-emitting elements to the semiconductor light-emitting device. The power supply conductor layer is planarly formed using a heat-conducting material, so as to cover a planar surface of the base material portion, and the planar region of the power supply conductor layer is planarly divided by an insulator for each drive current path.

17 Claims, 40 Drawing Sheets

(51) Int. Cl.
   *H01L 33/50*   (2010.01)
   *H05K 1/05*   (2006.01)
   *F21V 29/00*   (2015.01)
   *F21V 5/00*   (2015.01)
   *F21V 5/04*   (2006.01)
   *F21Y 101/02*   (2006.01)
   *F21Y 113/00*   (2016.01)
   *H05K 1/02*   (2006.01)
   *F21K 99/00*   (2016.01)
   *F21Y 105/00*   (2016.01)
   *F21V 29/77*   (2015.01)

(52) U.S. Cl.
   CPC .............. *H01L33/504* (2013.01); *H05K 1/056* (2013.01); *F21K 9/00* (2013.01); *F21V 5/007* (2013.01); *F21V 5/04* (2013.01); *F21V 29/773* (2015.01); *F21Y 2101/02* (2013.01); *F21Y 2105/003* (2013.01); *F21Y 2113/007* (2013.01); *H01L 2224/45144* (2013.01); *H01L 2224/48091* (2013.01); *H01L 2224/73265* (2013.01); *H01L 2924/01322* (2013.01); *H01L 2924/3025* (2013.01); *H05K 1/0207* (2013.01); *H05K 2201/10106* (2013.01)

(56) References Cited

U.S. PATENT DOCUMENTS

| | | |
|---|---|---|
| 2005/0207165 A1 | 9/2005 | Shimizu et al. |
| 2005/0237747 A1 | 10/2005 | Shimizu et al. |
| 2005/0242362 A1 | 11/2005 | Shimizu et al. |
| 2006/0160409 A1 | 7/2006 | Shimizu et al. |
| 2007/0057364 A1 | 3/2007 | Wang et al. |
| 2007/0187708 A1 | 8/2007 | Setomoto et al. |
| 2008/0111944 A1 | 5/2008 | Sakai |
| 2009/0140633 A1 | 6/2009 | Tanimoto et al. |
| 2009/0278162 A1 | 11/2009 | Wang et al. |
| 2010/0219745 A1 | 9/2010 | Tanimoto et al. |
| 2010/0244731 A1 | 9/2010 | Kaihotsu et al. |
| 2010/0295464 A1 | 11/2010 | Kasakura et al. |
| 2010/0320928 A1 | 12/2010 | Kaihotsu et al. |
| 2011/0012134 A1 | 1/2011 | Takeuchi |
| 2013/0009564 A1 | 1/2013 | Kaihotsu et al. |
| 2013/0221866 A1 | 8/2013 | Kasakura et al. |

FOREIGN PATENT DOCUMENTS

| | | |
|---|---|---|
| JP | 2005-100799 | 4/2005 |
| JP | 2007-123160 A | 5/2007 |
| JP | 2007-299590 | 11/2007 |
| JP | 2007-265818 | 10/2008 |
| JP | 2009-54801 A | 3/2009 |
| JP | 2009/140718 | 6/2009 |
| JP | 2009-231525 | 10/2009 |
| JP | 2009-238729 | 10/2009 |
| JP | 2011-40366 | 2/2011 |
| JP | 2011-138722 | 7/2011 |
| JP | 2011-175950 | 9/2011 |
| WO | WO 2007/052777 A1 | 5/2007 |
| WO | 2011/004572 | 1/2011 |

OTHER PUBLICATIONS

Office Action issued Aug. 19, 2014, in Japanese Patent Application No. 2011-187675 with English translation.
International Search Report issued Oct. 11, 2011 in PCT/JP2011/069739 filed Aug. 31, 2011.
Office Action issued Oct. 29, 2015, in Chinese Patent Application No. 201180072120.7 with English Translation and Search Report.

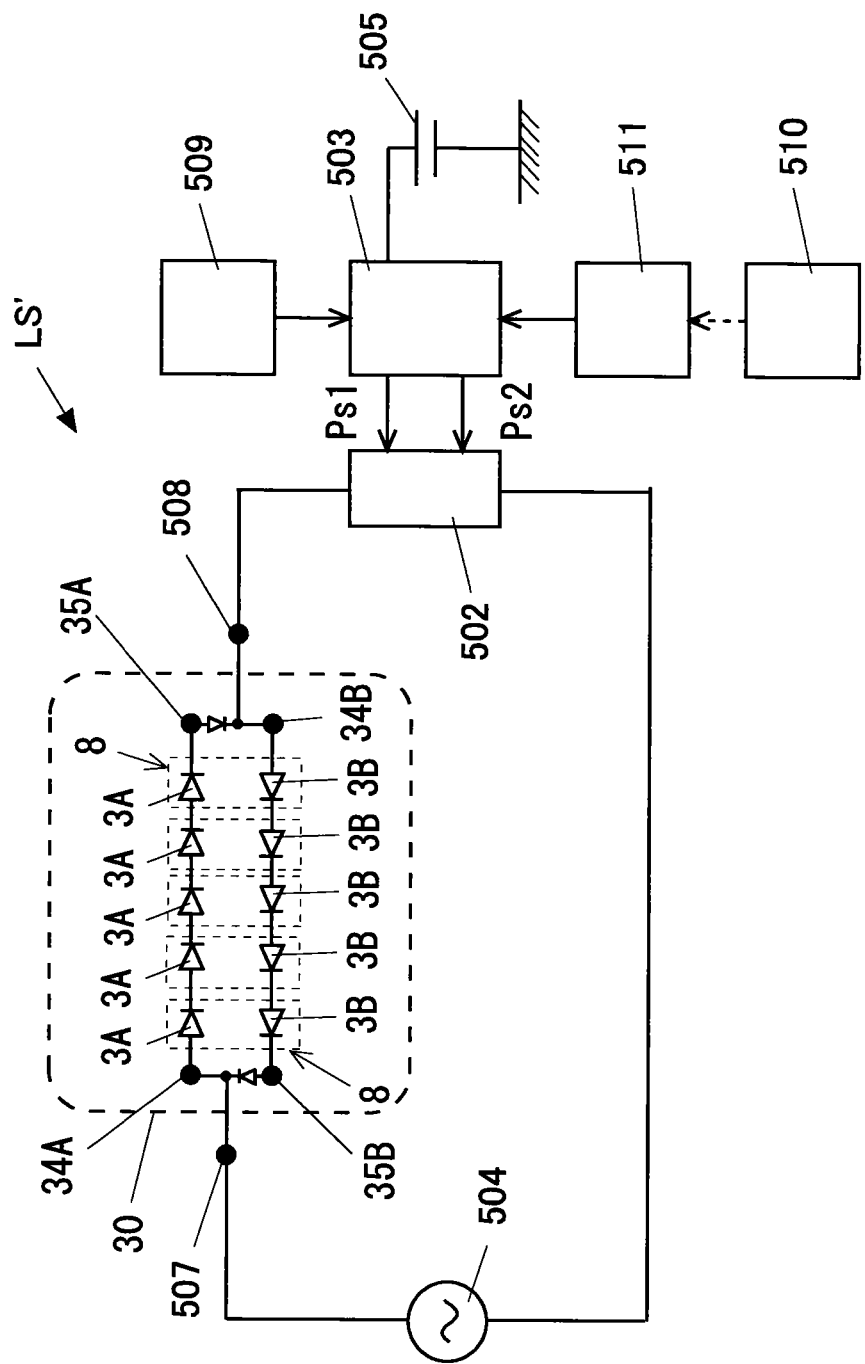

CIRCUIT BOARD FOR SUPPORTING SEMICONDUCTOR LIGHT-EMITTING DEVICE MOUNTED THEREON, LIGHT-EMITTING MODULE, LIGHTING APPARATUS, AND LIGHTING SYSTEM

CROSS-REFERENCE TO RELATED APPLICATION

This is a continuation of International Application PCT/JP2011/069739, filed on Aug. 31, 2011, and designated the U.S., (and claims priority from Japanese Patent Application 2011-157038 which was filed on Jul. 15, 2011,) the entire contents of which are incorporated herein by reference.

TECHNICAL FIELD

The present invention relates to a circuit board for supporting a semiconductor light-emitting device mounted thereon, the semiconductor light-emitting device emitting light to the outside by means of light emission from a semiconductor light-emitting element, and to a light-emitting module, a lighting apparatus, and a lighting system.

BACKGROUND ART

Nowadays, a lighting apparatus using a light-emitting diode (LED) which is a semiconductor light-emitting element is widely proposed as a substitute for a conventional lighting apparatus for the purpose of energy conservation and for other various purposes. In addition, the LED holds promise also as a light source for color tone-variable illumination which has been difficult to realize with a conventional light source. As one example of the lighting apparatus, there has been disclosed a lighting apparatus in which a red LED, a green LED and a blue LED are built into a single package to output white light (see, for example, Patent Document 1). In this technology, contrivances are made to adjust drive currents supplied to the abovementioned three types of LEDs according to the forward voltage of each LED, in order to keep the luminous efficiency of each LED constant and stabilize the luminance of white light, as well as to emit light having various hues.

In addition, as lighting techniques utilizing LEDs, there have been disclosed techniques to combine semiconductor light-emitting devices for emitting red, blue and green light using a blue LED and phosphors for red and green color development and control the output of the LED, thereby tracing a black body radiation locus and emitting white light close to natural light (see, for example, Patent Documents 1 to 3).

Yet additionally, there have been proposed a color-tunable (color tone-variable) semiconductor light-emitting device, a light-emitting module, and the like, configured to emit light to the outside by means of light emission from a package in which semiconductor light-emitting elements are mounted, wherein the output plane of light from the package is divided into a plurality of regions, and semiconductor light-emitting elements and fluorescent portions are disposed in the respective regions in correspondence with each other, so that the spectrums of light output from the output plane differ from each other (see, for example, Patent document 4). In this type of semiconductor light-emitting device or the like, power to be supplied to a corresponding semiconductor light-emitting element is controlled for each region of the output plane of the package divided into a plurality of regions, for example, so as to be able to adjust the color temperature of light output from the semiconductor light-emitting device.

Patent Document 1: Japanese Patent Laid-Open No. 2005
Patent Document 2: Japanese Patent Laid-Open No. 2007-265818
Patent document 3: Japanese Patent Laid-Open No. 2007-299590
Patent document 4: Japanese Patent Laid-Open No. 2009-231525

SUMMARY OF THE INVENTION

A semiconductor light-emitting device has the characteristic of decreasing in luminous intensity (becoming dark) and becoming shorter in service life along with the temperature rise of the device. Accordingly, in a semiconductor light-emitting device adopted for lighting purposes in particular, it is necessary to enhance, as much as possible, the heat dissipation performance of releasing (letting out) heat generated in the semiconductor light-emitting device to the outside. In addition, in a color-tunable semiconductor light-emitting device, electrical power supply to a corresponding semiconductor light-emitting element is controlled independently for each of regions into which an output plane is divided within a package. Consequently, local heat concentration is liable to occur in the semiconductor light-emitting device. The actual situation of a color-tunable semiconductor light-emitting device or light-emitting module, therefore, has been that such problems as a decrease in luminous efficiency and the thermal degradation of a semiconductor light-emitting element due to the local heat concentration of the semiconductor light-emitting device are liable to become actualized.

In view of the abovementioned actual situation, it is an object of the present invention to provide a technology related to an improvement in the performance of releasing heat generated in a semiconductor light-emitting device.

The present invention has adopted the below-described means, in order to solve the above-described problems.

That is, the present invention provides a light-emitting module including: a semiconductor light-emitting device provided with at least a semiconductor light-emitting element and a phosphor; and a circuit board for supporting the semiconductor light-emitting device mounted thereon, wherein, on the circuit board, at least a semiconductor light-emitting device including a plurality of semiconductor light-emitting elements each having a different path of a drive current to be supplied or a plurality of semiconductor light-emitting devices each having a different path of a drive current to be supplied to each semiconductor light-emitting element is mounted, the circuit board is provided with a base material portion formed using a heat-conducting material; and a power supply conductor layer for supplying the drive currents for semiconductor light-emitting elements to the semiconductor light-emitting devices, the power supply conductor layer is formed planarly using the heat-conducting material so as to cover a planar surface of the base material portion, and the planar region of the power supply conductor layer is planarly divided by an insulator for each of the drive current paths. Alternatively, each region of the power supply conductor layer divided off by the insulator for each of the drive current paths may be configured so that a drive current in a different control system flows in the region.

Both the power supply conductor layer and the base material portion are configured using a heat-conducting material. Accordingly, heat generated in the semiconductor light-emitting device transmits through the power supply conductor layer to the base material portion. Since the power supply conductor layer according to the present configuration is planarly formed so as to cover the base material portion, locally-concentrated heat in the semiconductor light-emitting device can be suitably dispersed in the planar direction of the base material portion. It is therefore possible to efficiently draw heat from the semiconductor light-emitting device and, thereby, suitably enhance the heat dissipation performance of the semiconductor light-emitting device. Consequently, it is possible to suitably prevent the decrease of luminous efficiency and the occurrence of thermal degradation due to local temperature rise which are liable to become actualized in a color-tunable semiconductor light-emitting device.

Here, the regions of the power supply conductor layer each having a different path of the drive current are preferably formed so as not to overlap one on top of another. Consequently, it is possible to prevent the power supply conductor layers in different control systems from short-circuiting to one another, without having to increase the number of insulating layers.

A heat-radiating housing member is preferably attached to the base material portion, so as to be in thermal contact with a non-mounting surface thereof on which the semiconductor light-emitting device is not mounted, thereby dissipating heat transmitted from the semiconductor light-emitting device side through the power supply conductor layer to the base material portion into the atmosphere from the heat-radiating housing member. Consequently, heat conducted in order from the semiconductor light-emitting device is released from the heat-radiating housing member into the atmosphere by the power supply conductor layer and the base material portion of the circuit board. It is therefore possible to more efficiently cool the semiconductor light-emitting device.

In a first aspect of the light-emitting module, the semiconductor light-emitting device may include a package for housing the semiconductor light-emitting element and the phosphor, the package may be provided with an opening open in the emission direction of the semiconductor light-emitting device and at least two or more divided regional sections open in divided openings which are defined by dividing the interior of the package into two or more regions and are parts of the opening, each of the divided regional sections may include a fluorescent portion including the phosphor and a translucent material for sealing the divided regional sections, spectrums of light output from the fluorescent portion being different from each other between at least one divided regional section and another divided regional section, and a drive current (for example, a drive current in a different control system) may be supplied to a divided regional section different in the spectrum of output light through a different path of the power supply conductor layer. Note that the interior of the package is preferably divided by a partition having lightproofness and reflectiveness.

The interior of the package may be segmented into two divided regional sections by a partition erected from the base member, two trace sections for supporting semiconductor light-emitting elements mounted thereon, which are housed in the respective divided regional sections, may be arranged in the base member, and each trace section may intersect with the partition as a result of a pair of electrodes being provided in regions opposed to each other across the partition within the planar region of the base member. In this case, the semiconductor light-emitting element provided in one divided regional section and the semiconductor light-emitting element provided in another divided regional section, the semiconductor light-emitting elements being different in the spectrum of output light from each other, may be configured so as to be opposite in polarity to each other and connected in parallel with each other.

In addition, the insulator may include a first insulator circularly formed within the plane of the circuit board, and regions of the power supply conductor layer each having a different path of the drive current may be insulated from each other by the first insulator. In this case, the light-emitting module may be configured so that, for example, drive currents in different control systems flow through mutually different paths.

Yet additionally, the insulator may further include a second insulator for planarly dividing off the regions of the power supply conductor layer divided off by the first insulator. In this case, the semiconductor light-emitting device may be mounted on the circuit board, so as to cross the upper portion of the one second insulator, and one and the other regions (for example, regions of the power supply conductor layer which are the same in control system) divided off by the one second insulator may be electrically connected to each other by the internal trace of the semiconductor light-emitting device.

In a second aspect of the light-emitting module, the semiconductor light-emitting device may include a package for housing the semiconductor light-emitting element and the phosphor, the package may be provided with an opening open in the emission direction of the semiconductor light-emitting device, and a fluorescent portion including the phosphor and a translucent material for sealing the opening, the circuit board may support a plurality of the semiconductor light-emitting devices mounted thereon, the spectrums of light output from the fluorescent portions may differ from each other between at least one semiconductor light-emitting device and another semiconductor light-emitting device, and drive currents may be supplied to the fluorescent portions different in the spectrum of output light through different paths of the power supply conductor layer. In this case, the light-emitting module may be configured so that, for example, drive currents in different control systems flow through paths different from each other.

In this second aspect, if the planar region of the power supply conductor layer of the circuit board is bisected into a first region and a second region by a virtual straight line, it is preferable that an area of the planar region belonging to the first region, and an area of the planar region belonging to the second region in each drive current path are substantially the same. Consequently, it is possible to prevent the distribution of heat conducted from the semiconductor light-emitting device to the power supply conductor layer of the circuit board from excessively deviating to the planar direction of the circuit board. Consequently, it is possible to further enhance the heat dissipation performance of the semiconductor light-emitting device.

In addition, the plurality of the semiconductor light-emitting devices is preferably disposed circularly and equiangularly on the circuit board, and one and another semiconductor light-emitting devices supplied with drive currents in control systems different from each other through different paths of the power supply conductor layer are preferably annularly disposed in an alternate manner.

A plurality of the semiconductor light-emitting devices may be mounted on the circuit board, and the power supply conductor layer may be such that, among traces for implementing the semiconductor light-emitting elements provided in each semiconductor light-emitting device, those that use the same drive current control system are connected in series with one another.

In addition, from the viewpoint of suitably securing the heat dissipation performance of the semiconductor light-emitting devices, the power supply conductor layer is preferably formed so that the ratio of an area in which the power supply conductor layer is formed to the entire surface area of the base material portion is 70% or higher. More preferably, the area ratio is 80% or higher.

In the light-emitting module, the plurality of the semiconductor light-emitting devices mounted on the base material portion of the circuit board may be disposed circularly and at equal angular intervals. In addition, in the relative positional relationship between one and another divided regional sections within the package in which one semiconductor light-emitting device is taken as a reference with respect to an adjacent semiconductor light-emitting device, the semiconductor light-emitting devices may be laid out in increments of predetermined angles defined by dividing 360° by the number of semiconductor light-emitting devices to be mounted on the base material portion in a rotational direction within the aperture plane of the opening.

Here, the present invention may also be regarded as a circuit board for supporting semiconductor light-emitting device mounted thereon. The present invention provides a circuit board for supporting a semiconductor light-emitting device mounted thereon, the semiconductor light-emitting device being provided with at least a semiconductor light-emitting element and a phosphor, wherein, on the circuit board, at least a semiconductor light-emitting device including a plurality of semiconductor light-emitting elements each having a different path of a drive current to be supplied or a plurality of semiconductor light-emitting devices each having a different path of a drive current to be supplied to each semiconductor light-emitting element is mounted, the circuit board is provided with a base material portion formed using a heat-conducting material; and a power supply conductor layer for supplying the drive currents for semiconductor light-emitting elements to the semiconductor light-emitting devices, the power supply conductor layer is formed planarly using the heat-conducting material so as to cover a planar surface of the base material portion, and the planar region of the power supply conductor layer is planarly divided by an insulator for each drive current path. In addition, in the circuit board according to the present invention, a heat-radiating housing member is preferably attached to the base material portion, so as to be in thermal contact with a non-mounting surface thereof on which the semiconductor light-emitting device is not mounted, thereby dissipating heat transmitted from the semiconductor light-emitting device side through the power supply conductor layer to the base material portion into the atmosphere from the heat-radiating housing member.

The present invention may also be regarded as a lighting apparatus provided with any one of the above-described light-emitting modules. Alternatively, the present invention may be regarded as a lighting system provided with any one of the above-described light-emitting modules, and a control apparatus for independently controlling electrical power to be supplied to the power supply conductor layer for each of the drive current paths to adjust the color of light emitted from the semiconductor light-emitting device.

Note that in the present invention, the means for solving the problems can be used in all possible combinations.

According to the present invention, it is possible to improve the performance of dissipating heat generated in a semiconductor light-emitting device.

BRIEF DESCRIPTION OF THE DRAWINGS

FIG. 35 is a block diagram illustrating an internal configuration of a second lighting system according to an embodiment.

DESCRIPTION OF THE EMBODIMENTS

Hereinafter, modes for carrying out the present invention will be described illustratively and detailedly with reference to the accompanying drawings. Note that unless otherwise specifically stated, the technical scope of the present invention is not intended to be limited only to the sizes, materials, shapes, relative arrangement, and the like of constituent elements described in the present embodiment.

Practical Example 1

Figure 1A:
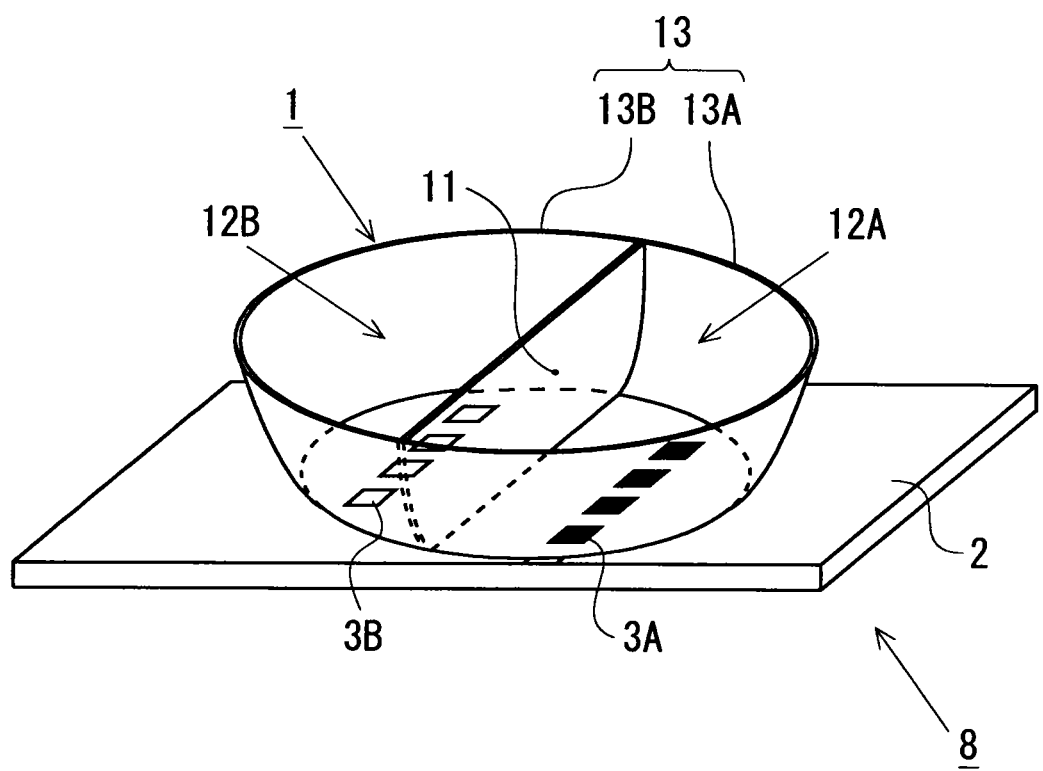
FIG. 1A is a perspective view of the schematic configuration of a package in each LED device constituting a light-emitting module according to Practical Example 1.
Figure 1B:
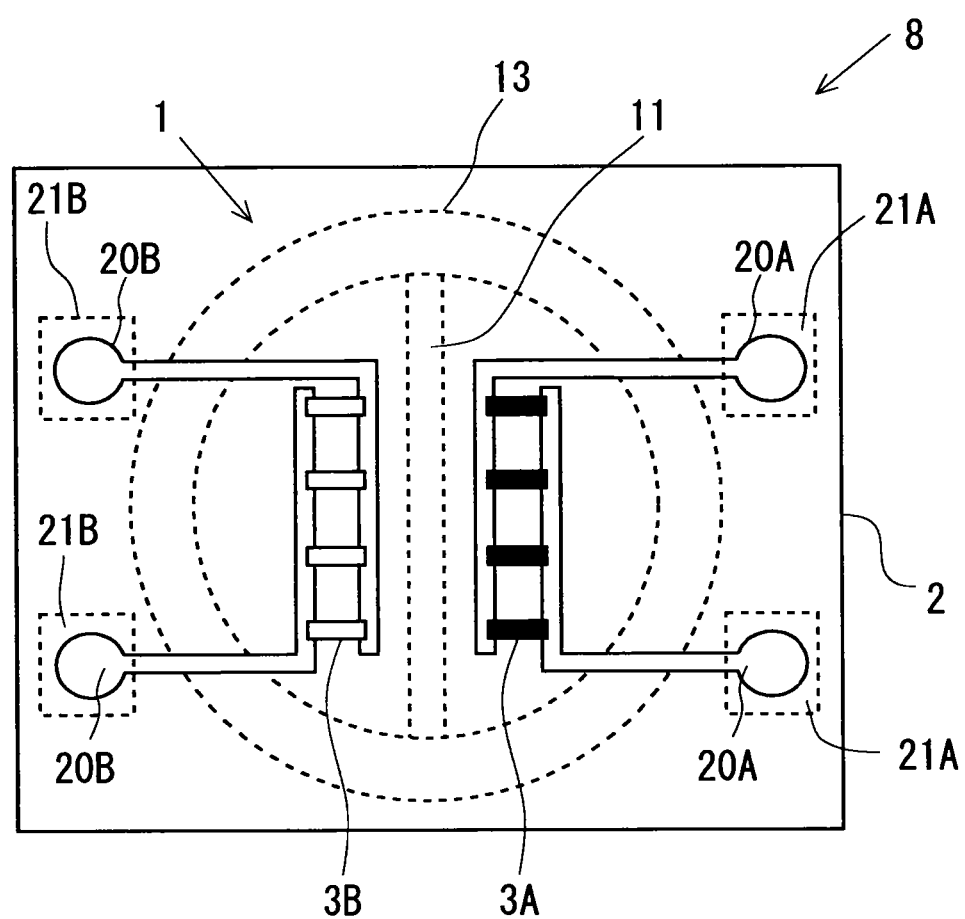
FIG. 1B is a drawing illustrating a laid-out state of traces for supplying electrical power to LED elements indicated in FIG. 1A.
Figure 1C:
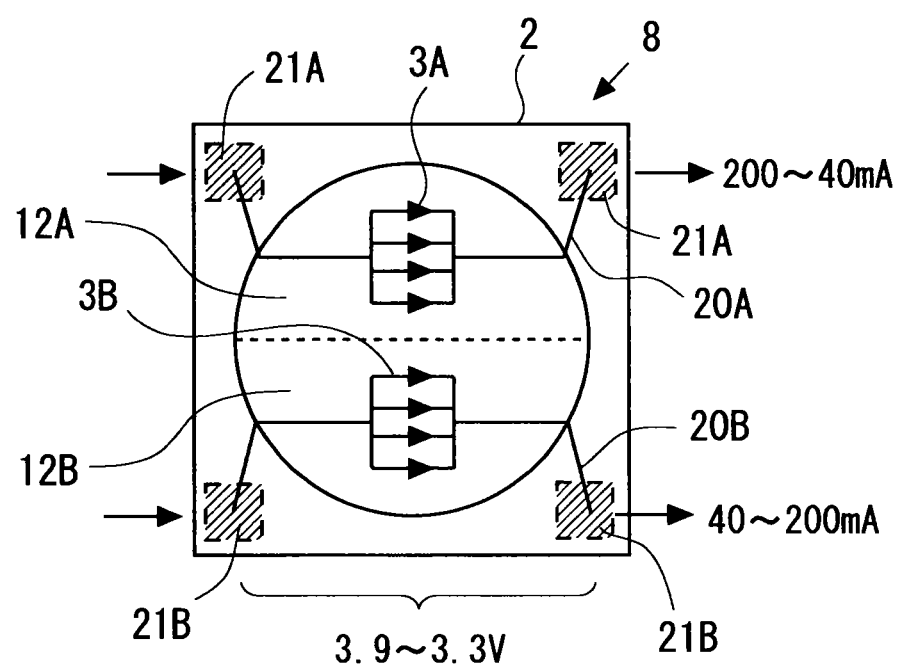
FIG. 1C is a drawing in which the LED device illustrated in FIGS. 1A and 1B is diagrammatized using electrical symbols.

Here, FIG. 1A is a perspective view of the schematic configuration of a package 1 in a semiconductor light-emitting device (hereinafter simply referred to as "LED device") 8 constituting a light-emitting module 30 according to the present practical example. FIG. 1B is a drawing illustrating a laid-out state of traces 20A and 20B for supplying electrical power to semiconductor light-emitting elements 3A and 3B arranged in the package 1. In addition, FIG. 1C is a drawing in which the LED device 8 illustrated in FIGS. 1A and 1B is diagrammatized using electrical symbols. Yet additionally, FIG. 2 is a cross-sectional view taken when the LED device 8 illustrated in FIG. 1A is cut across a plane including the traces 20A and 20B. Note that the light-emitting module 30 in the present practical example is configured by including the LED device 8 and the circuit board for supporting the LED device mounted thereon.

As illustrated in FIG. 1A, the LED device 8 is configured by including the package 1. The package 1 is a reflector located on a base 2 and formed into an annular truncated cone shape. The package 1 is composed of a material having lightproofness and reflectiveness. This package 1 has the function to guide part of output light from each divided regional section 12 to be described later to the emission direction of the LED device 8. Note that the upper surface side of the truncated cone shape of the package 1 is the outgoing direction of light emitted by the LED device 8 and forms an opening 13. On the other hand, the base 2 is located on the lower surface side of the truncated cone shape of the package 1. In addition, as will be described in detail later, traces for supplying electrical power to each semiconductor light-emitting element are laid on the base 2 (the traces are not illustrated in FIG. 1A).

Figure 2A:
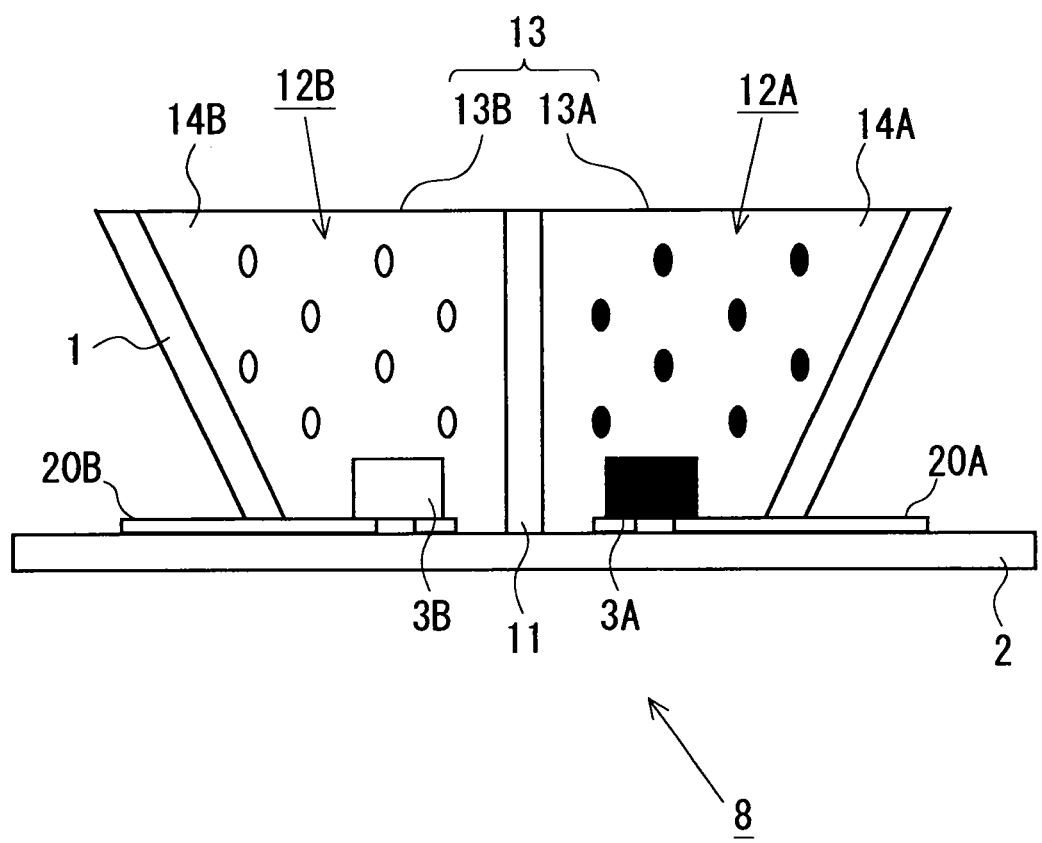
FIG. 2A is a cross-sectional view of the LED device illustrated in FIG. 1.

A partition 11 for equally dividing the internal space of this annular package 1 into two regions is provided perpendicularly to the base 2 (base member), as illustrated in FIGS. 1A and 2A. The partition 11 is composed of a material having lightproofness and reflectiveness. Two divided regional sections 12A and 12B are defined within the package 1 by this partition 11. The opening of the divided regional section 12A occupies a right half of the opening 13 of the package 1, whereas the opening of the divided regional section 12B occupies a left half of the opening 13 of the package 1. In the present specification, the opening of the divided regional section 12A is referred to as a divided opening 13A, whereas the opening of the divided regional section 12B is referred to as a divided opening 13B. That is, the opening 13 is partitioned into the divided openings 13A and 13B by the partition 11.

Four each of near-ultraviolet semiconductor light-emitting elements (hereinafter simply referred to as "LED elements") 3A and 3B which are semiconductor light-emitting elements and the output light of which is near-ultraviolet light are arranged in these divided regional sections 12A and 12B, respectively. These LED elements 3A and 3B (referred to as LED elements 3 when comprehensively referring to these LED elements) are connected to paired traces 20A and 20B (which may be comprehensively referred to as traces 20), respectively, and emit light when supplied with electrical power. Note that for connection of the LED elements 3 to the traces 20 in each divided regional section, four LED elements 3A are mounted on the traces 20A and four LED elements 3B are mounted on the traces 20B, as illustrated in FIG. 1B. Four LED elements 3 in each divided region are parallel-connected in a forward direction to corresponding traces. Note that reference characters 21A and 21B in FIG. 1B denote electrodes (terminals). These electrodes 21A and 21B are formed on the lower surface of the base 2 (the surface thereof on which the package 1 is not located) and connected to the traces 20A and 20B, respectively, by way of through-holes. In the example cited here, four each of the LED elements 3A and 3B are arranged in the divided regional sections 12A and 12B. Alternatively, however, semiconductor light-emitting elements arranged respectively in the two sections may be differentiated in number from each other. In addition, at least one LED element has only to be provided in each of the divided regional sections 12A and 12B.

Figure 10:
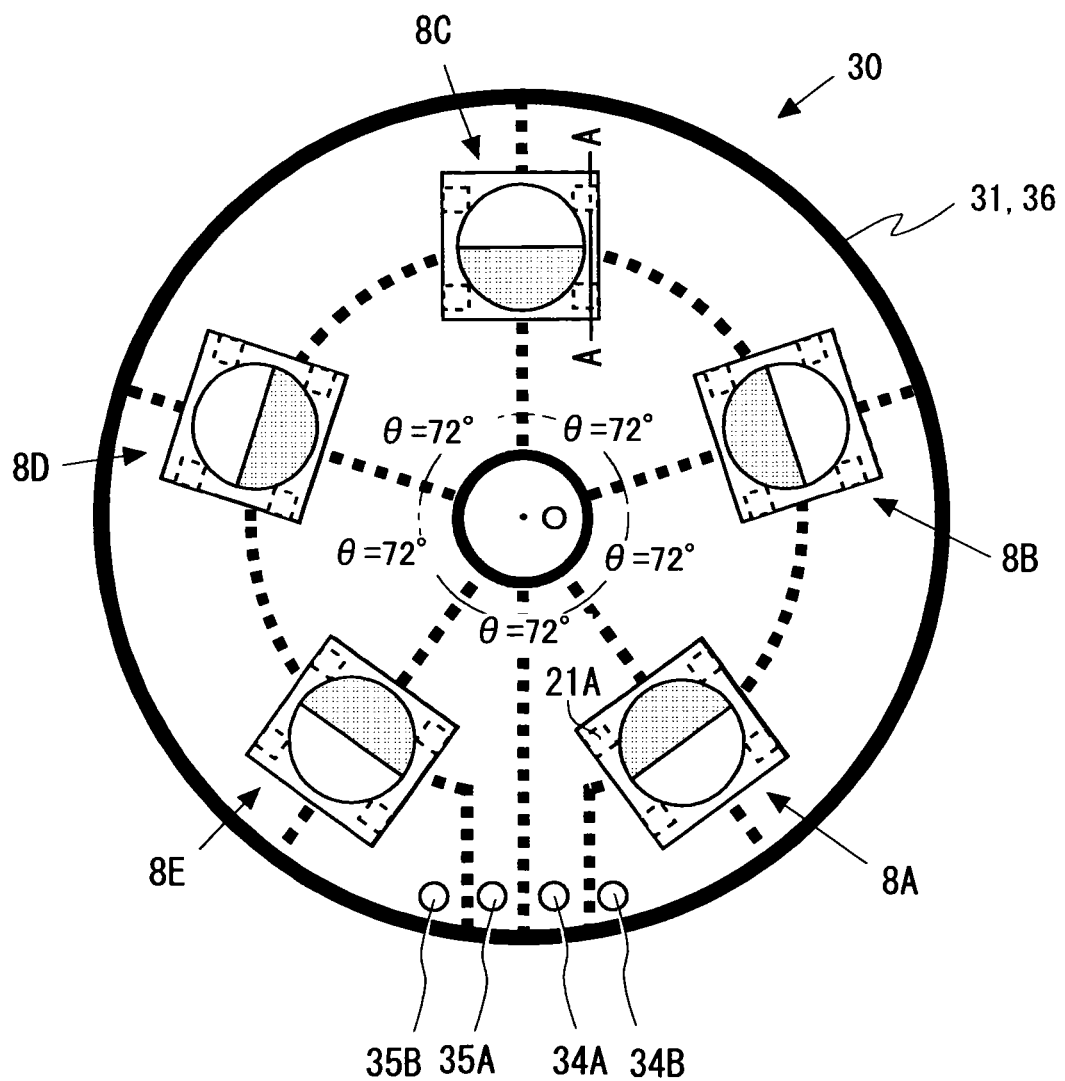
FIG. 10 is a drawing illustrating a state of the LED devices being mounted on the circuit board according to Practical Example 1.

FIG. 10 is the result of diagrammatically illustrating the mounted state of the LED elements 3A and 3B. That is, electrical power is supplied by the traces 20A through the electrodes 21A to the four LED elements 3A disposed in the divided regional section 12A. Likewise, electrical power is supplied by the traces 20B through the electrodes 21B to the four LED elements 3B disposed in the divided regional section 12B. At this time, a voltage applied to each LED element 3 is within the range of 3.3 V to 3.9V, and a supply current is within the range of 40 mA to 200 mA. This supply of electrical power may be performed in consideration of the luminescence intensity of the light-emitting module 30 as a whole. This will be discussed later.

Here, the way the LED elements 3 are mounted on the base 2 will be described according to FIG. 3. The base 2 is a base part used to hold the LED device 8 including the LED elements 3. The base 2 includes a metal base member 2A, an insulating layer 2D formed on the metal base member 2A, and paired traces 20C and 20D formed on the insulating layer 2D. Each LED element 3 includes a pair of p and n electrodes on opposed bottom and top surfaces. An electrode on the bottom surface side of the LED element 3 is joined to the upper surfaces of the paired traces 20C through AuSn eutectic solder 5. An electrode on the upper surface side of the LED element 3 is connected to the opposite paired traces 20D by a metal wire 6. A pair of these paired traces 20C and 20D forms one pair of traces 20A or 20B illustrated in FIG. 1B and, thereby, electrical power is supplied to four LED elements 3 of each divided regional section.

Figure 3:
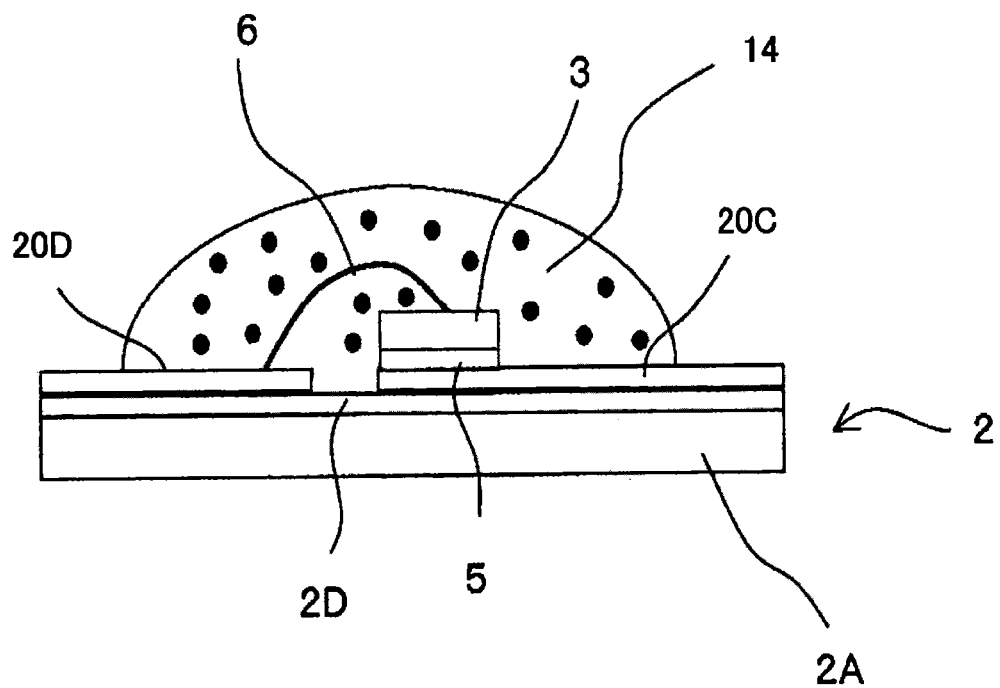
FIG. 3 is a drawing illustrating the connective relationship between LED elements and a base part in the LED device illustrated in FIG. 1.

Note that electrical connection between each LED element 3 and the pair of paired traces 20C and 20D on the base 2 is not limited to the mode illustrated in FIG. 3, but may be made in an appropriate manner, according to the layout of pairs of electrodes in the LED element 3. For example, if an electrode pair is provided on only one side of the LED element 3, the LED element 3 may be placed with the surface thereof on which the electrodes are provided facing up, and each pair of electrodes and the paired traces 20C and 20D may respectively be connected to each other by, for example, a gold wire 6. The paired traces 20C and 20D and the LED element 3 can thus be electrically connected to each other. If the LED element 3 is a flip-chip (face-down), the electrodes of the LED element 3 and the paired traces 20C and 20D can be electrically connected to each other by joining them together with gold bumps or solder.

Here, the LED element 3 emits light in a near-ultraviolet region (a region having an emission wavelength of 360 nm to 430 nm) as a result of electrical power being supplied to the LED element 3, thereby exciting fluorescent portions 14A and 14B (which may be comprehensively referred to as fluorescent portions 14) to be described later. A GaN-based semiconductor light-emitting element using a GaN-based compound semiconductor is preferred among other things. This is because the GaN-based semiconductor light-emitting element emits light in this region with extraordinarily high light emission output and external quantum efficiency, and therefore, makes extremely bright emission available at extremely low electrical power when used in combination with a later-described phosphor. The GaN-based semiconductor light-emitting element preferably includes an $Al_xGa_yN$ luminescent layer, a GaN luminescent layer, or an $In_xGa_yN$ luminescent layer. A GaN-based semiconductor light-emitting element including the $In_xGa_yN$ luminescent layer, among those layers, is extremely high in luminescence intensity and is, therefore, more preferable. A GaN-based semiconductor light-emitting element having a multiquantum well structure composed of $In_xGa_yN$ and GaN layers, among those layers, is extremely high in luminescence intensity and is, therefore, particularly preferable.

Note that in the abovementioned composition formula, the value of x+y is generally within the range of 0.8 to 1.2. A GaN-based semiconductor light-emitting element including any of these luminescent layers doped with Zn or Si or a luminescent layer containing no dopants is preferable from the viewpoint of adjusting light-emitting properties.

The GaN-based semiconductor light-emitting element includes these luminescent layer, p layer, n layer, electrodes, and substrate as basic constituent elements. A GaN-based semiconductor light-emitting element having a heterostructure in which a luminescent layer is sandwiched by n- and p-type $Al_xGa_yN$ layers, GaN layers, $In_xGa_yN$ layers or the like is high in luminous efficiency and is, therefore, preferable. In particular, a GaN-based semiconductor light-emitting element the heterostructure of which has been transformed into a quantum well structure is higher in luminous efficiency and is, therefore, more preferable.

Examples of methods for growing a GaN-based crystal layer used to form a GaN-based semiconductor light-emitting element include an HVPE method, an MOVPE method, and an MBE method. While an HVPE method is preferred when forming thick films, an MOVPE method or an MBE method is preferred when forming thin films.

As illustrated in FIG. 3, a fluorescent portion 14 containing a plurality of or a single phosphor for absorbing part of light emitted from this LED element 3 and emitting light having a different wavelength, and a translucent material for sealing the phosphor are arranged on the base 2, while covering the LED element 3. Note that although the package 1 is omitted in FIG. 3, this form can also be one aspect of a semiconductor light-emitting device composed of the package 1. Part of light emitted from the LED element 3 is absorbed in whole or in part by a light-emitting material (phosphor) within the fluorescent portion 14 as exciting light. By way of more specific description of the fluorescent portion of the LED device 8 according to FIG. 2, a fluorescent portion 14A covers the LED elements 3A and is exposed through the divided opening 13A in the divided regional section 12A. Likewise, a fluorescent portion 14B covers the LED elements 3B and is exposed through the divided opening 13B in the divided regional section 12B. Accordingly, output light from each fluorescent portion 14 is emitted to the outside from each divided opening 13.

Figure 2B:
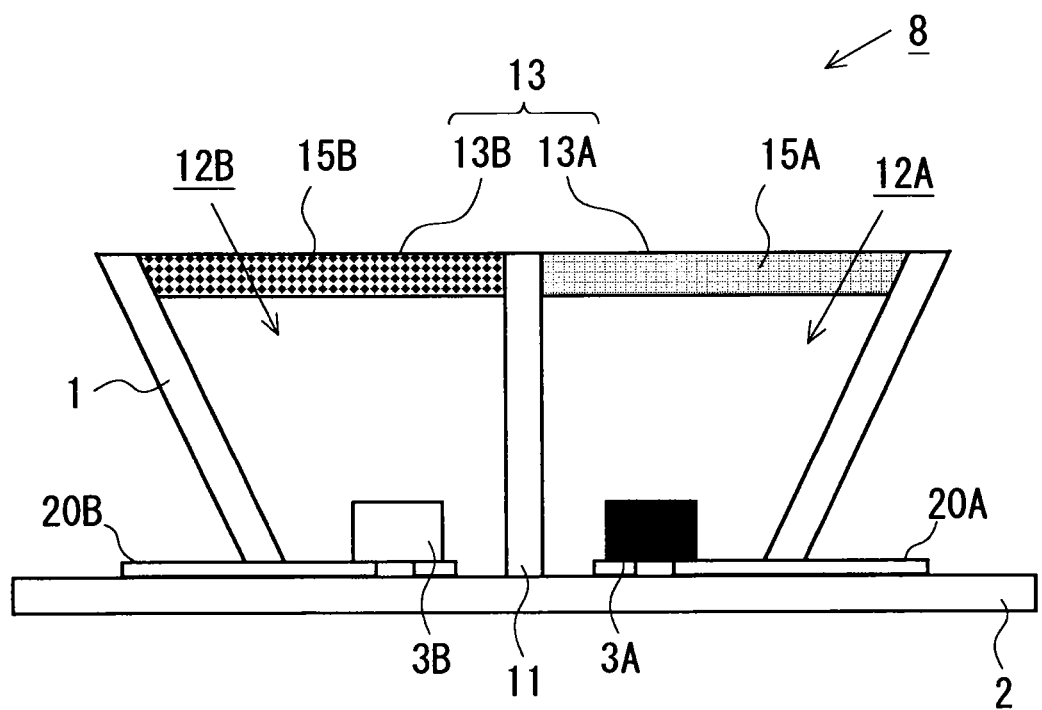
FIG. 2B is a drawing illustrating another cross-sectional configuration example of the LED device.

For the fluorescent portion 14, it is possible to adopt, for example, a type of fluorescent portion composed of a remote phosphor illustrated in FIG. 2B, in addition to a type of fluorescent portion in which phosphor-containing translucent resin is potted in the package 1 as illustrated in FIGS. 2A and 3. The remote phosphor is a technology of placing each LED element 3 and the phosphor at a distance from each other in the fluorescent portion 14 of the package 1. In the configuration example of the remote phosphor illustrated in FIG. 2B, fluorescent sheets 15A and 15B made of translucent materials, which are molded into a sheet-like or plate-like shape and include a phosphor coated onto or kneaded into the sheets, are located at a distance from the LED elements 3A and 3B. In the illustrated configuration, the fluorescent sheets 15A and 15B are located in the divided openings 13A and 13B of the package 1. The fluorescent sheets are not limited to the abovementioned location, however. Note that phosphor layers formed in the fluorescent sheets 15A and 15B may be such that plural types of phosphors are disposed into, for example, a striped, triangular, quadrangular, or circular pattern. As described above, it is possible to improve the heat resistance and weatherability of the phosphor by forming the fluorescent portion 14 from the remote phosphor.

Next, the fluorescent portion 14 will be described in detail. The LED device 8 according to the present practical example is intended to output, for example, white light. In particular, three types of phosphors, i.e., a red phosphor, a green phosphor and a blue phosphor, are adopted for the luminescent colors of the LED device 8, so that a deviation duv from a black body radiation locus satisfies $-0.02 \leq duv \leq 0.02$ in the uv chromaticity diagram of a UCS (u, v) color coordinate system (CIE 1960). Specifically, it is possible to use phosphors mentioned hereinafter. Note that the deviation duv from a black body radiation locus complies with the definition in Notes of Section 5.4 in JIS Z8725 (Methods for determining distribution temperature and color temperature or correlated color temperature of light sources).

By way of citing examples of the specific wavelength range of fluorescence that a red phosphor preferred in the present embodiment generates, a main emission peak wavelength is normally 570 nm or longer, preferably 580 nm or longer, and particularly preferably 610 nm or longer, but is normally 700 nm or shorter, preferably 680 nm or shorter, and particularly preferably 660 nm or shorter. In addition, the half-value width of a main emission peak is normally 1 nm or larger, preferably 10 nm or larger, and particularly preferably 30 nm or larger, but is normally 120 nm or smaller, preferably 110 nm or smaller, and particularly preferably 100 nm or smaller.

Examples of the red phosphor include an europium-activated alkaline earth silicon nitride-based phosphor represented by $(Mg, Ca, Sr, Ba)_2Si_5N_8$:Eu which is composed of broken particles having a red fracture cross section and undertakes luminescence in a red region, and an europium-activated rare-earth oxy-chalcogenide-based phosphor represented by $(Y, La, Gd, Lu)_2O_2S$:Eu which is composed of grown particles having a substantially spherical shape as a regular crystal growth shape and undertakes luminescence in a red region.

It is also possible to use a phosphor which contains an oxynitride and/or oxysulfide containing at least one type of element selected from the group consisting of Ti, Zr, Hf, Nb, Ta, W and Mo, and contains an oxynitride having an alpha sialon structure in which an Al element is substituted in part or in whole by a Ga element. Note that these are phosphors which contain an oxynitride and/or an oxysulfide.

In addition to the abovementioned red phosphors, it is also possible to use, for example, an Eu-activated oxysulphide phosphor such as $(La, Y)_2O_2S$:Eu; an Eu-activated oxide phosphor such as $Y(V, P)O_4$:Eu and $Y_2O_3$:Eu; an Eu, Mn-activated silicate phosphor such as $(Ba, Sr, Ca, Mg)_2SiO_4$:Eu; Mn and $(Ba, Mg)_2SiO_4$:Eu, Mn; an Eu-activated sulfide phosphor such as $(Ca, Sr)S$:Eu; an Eu-activated aluminate phosphor such as $YAlO_3$:Eu; an Eu-activated silicate phosphor such as $LiY_9(SiO_4)_6O_2$:Eu, $Ca_2Y_8(SiO_4)_6O_2$:Eu, $(Sr, Ba, Ca)_3SiO_5$:Eu and $Sr_2BaSiO_5$:Eu; a Ce-activated aluminate phosphor such as $(Y, Gd)_3Al_5O_{12}$:Ce and $(Tb, Gd)_3Al_5O_{12}$:Ce; an Eu-activated nitride phosphor such as $(Ca, Sr, Ba)_2Si_5N_8$:Eu, $(Mg, Ca, Sr, Ba)SiN_2$:Eu and $(Mg, Ca, Sr, Ba)AlSiN_3$:Eu; a Ce-activated nitride phosphor such as $(Mg, Ca, Sr, Ba)AlSiN_3$:Ce; an Eu, Mn-activated halophosphate phosphor such as $(Sr, Ca, Ba, Mg)_{10}(PO_4)_6Cl_2$:Eu, Mn; an Eu, Mn-activated silicate phosphor such as $Ba_3MgSi_2O_8$:Eu, Mn, and $(Ba, Sr, Ca, Mg)_3(Zn, Mg)Si_2O_8$:Eu, Mn; an Mn-activated germanate phosphor such as $3.5MgO·0.5MgF_2·GeO_2$:Mn; an Eu-activated oxynitride phosphor such as an Eu-activated α-sialon; an Eu, Bi-activated oxide phosphor such as $(Gd, Y, Lu, La)_2O_3$:Eu, Bi; an Eu, Bi-activated oxysulphide phosphor such as $(Gd, Y, Lu, La)_2O_2S$:Eu, Bi; an Eu, Bi-activated vanadate phosphor such as $(Gd, Y, Lu, La)VO_4$:Eu, Bi; an Eu, Ce-activated sulfide phosphor such as $SrY_2S_4$:Eu, Ce; a Ce-activated sulfide phosphor such as $CaLa_2S_4$:Ce; an Eu, Mn-activated phosphate phosphor such as $(Ba, Sr, Ca)MgP_2O_7$:Eu, Mn and $(Sr, Ca, Ba, Mg, Zn)_2P_2O_7$:Eu, Mn; an Eu, Mo-activated tungstate phosphor such as $(Y, Lu)_2WO_6$:Eu, Mo; an Eu, Ce-activated nitride phosphor such as $(Ba, Sr, Ca)_xSi_yN_z$:Eu, Ce (where, x, y and z are integers equal to or greater than 1); an Eu, Mn-activated halophosphate phosphor such as $(Ca, Sr, Ba, Mg)_{10}(PO_4)_6(F, Cl, Br, OH)_2$:Eu, Mn; and a Ce-activated silicate phosphor such as $((Y, Lu, Gd, Tb)_{1-x}Sc_xCe_y)_2(Ca, Mg)_{1-r}(Mg, Zn)_{2+r}Si_{z-q}GeqO_{12+\delta}$.

As red phosphors, it is also possible to use a red organic phosphor composed of a rare earth element ion complex having such an anion as β-diketonate, β-diketone, aromatic carboxylic acid or Broensted acid as the ligand of the complex, a perylene-based pigment (for example, dibenzo {[f,f']-4,4',7,7'-tetraphenyl}diindeno [1,2,3-cd:1',2',3'-lm] perylene), an anthraquinone-based pigment, a lake-based pigment, an azo-based pigment, a quinacridone-based pigment, an anthracene-based pigment, an isoindoline-based pigment, an isoindolinone-based pigment, a phthalocyanine-based pigment, a triphenylmethane-based basic dye, an indanthrone-based pigment, an indophenol-based pigment, a cyanine-based pigment, and a dioxazine-based pigment.

By way of citing examples of the specific wavelength range of fluorescence that a green phosphor preferred in the present embodiment generates, a main emission peak wavelength is normally 500 nm or longer, preferably 510 nm or longer, and particularly preferably 520 nm or longer, but is normally 580 nm or shorter, preferably 570 nm or shorter, and particularly preferably 560 nm or shorter. In addition, the half-value width of a main emission peak is normally 1 nm or larger, preferably 10 nm or larger, and particularly preferably 30 nm or larger, but is normally 120 nm or smaller, preferably 90 nm or smaller, and particularly preferably 60 nm or smaller.

Examples of such green phosphors include an europium-activated alkaline earth silicon oxynitride-based phosphor represented by $(Mg, Ca, Sr, Ba)Si_2O_2N_2$:Eu which is composed of broken particles having a fracture cross section and undertakes luminescence in a green region; and an europium-activated alkaline earth silicate-based phosphor represented by $(Ba, Ca, Sr, Mg)_2SiO_4$:Eu which is composed of broken particles having a fracture cross section and undertakes luminescence in a green region.

In addition to the abovementioned green phosphors, it is also possible to use, for example, an Eu-activated aluminate phosphor such as $Sr_4Al_{14}O_{25}$:Eu and $(Ba, Sr, Ca)Al_2O_4$:Eu; an Eu-activated silicate phosphor such as $(Sr, Ba)Al_2Si_2O_8$:Eu, $(Ba, Mg)_2SiO_4$:Eu, $(Ba, Sr, Ca, Mg)_2SiO_4$:Eu and $(Ba, Sr, Ca)_2(Mg, Zn)Si_2O_7$:Eu; a Ce, Tb-activated silicate phosphor such as $Y_2SiO_5$:Ce, Tb; an Eu-activated borate phosphate phosphor such as $Sr_2P_2O_7$—$Sr_2B_2O_5$:Eu; an Eu-activated halosilicate phosphor such as $Sr_2Si_3O_8·2SrCl_2$:Eu; an Mn-activated silicate phosphor such as $Zn_2SiO_4$:Mn; a Tb-activated aluminate phosphor such as $CeMgAl_{11}O_{19}$:Tb and $Y_3Al_5O_{12}$:Tb; a Tb-activated silicate phosphor such as $Ca_2Y_8(SiO_4)_6O_2$:Tb and $La_3Ga_5SiO_{14}$:Tb; an Eu, Tb, Sm-activated thiogallate phosphor such as $(Sr, Ba, Ca)Ga_2S_4$:Eu, Tb, Sm; a Ce-activated aluminate phosphor such as $Y_3(Al, Ga)_5O_{12}$:Ce and $(Y, Ga, Tb, La, Sm, Pr, Lu)_3(Al, Ga)_5O_{12}$:Ce; a Ce-activated silicate phosphor such as $Ca_3Sc_2Si_3O_{12}$:Ce and $Ca_3(Sc, Mg, Na, Li)_2Si_3O_{12}$:Ce; a Ce-activated oxide phosphor such as $CaSc_2O_4$:Ce; an Eu-activated oxynitride phosphor such as $SrSi_2O_2N_2$:Eu, $(Sr, Ba, Ca)Si_2O_2N_2$:Eu and Eu-activated β-sialon; an Eu, Mn-activated aluminate phosphor such as $BaMgAl_{10}O_{17}$:Eu, Mn; an Eu-activated aluminate phosphor such as $SrAl_2O_4$:Eu; a Tb-activated oxysulphide phosphor such as $(La, Gd, Y)_2O_2S$:Tb; a Ce, Tb-activated phosphate phosphor such as $LaPO_4$:Ce, Tb; a sulfide phosphor such as ZnS:Cu, Al and ZnS:Cu, Au, Al; a Ce, Tb-activated borate phosphor such as $(Y, Ga, Lu, Sc, La)BO_3$:Ce, Tb, $Na_2Gd_2B_2O_7$:Ce, Tb and $(Ba, Sr)_2(Ca, Mg, Zn)B_2O_5$:K, Ce, Tb; an Eu, Mn-activated halosilicate phosphor such as $Ca_8Mg(SiO_4)_4Cl_2$:Eu, Mn; an Eu-activated thioaluminate phosphor and an Eu-activated thiogallate phosphor such as (Sr, Ca, Ba) (Al, Ga, In)$_2$S$_4$:Eu; and an Eu, Mn-activated halosilicate phosphor such as (Ca, Sr)$_8$(Mg, Zn)(SiO$_4$)$_4$Cl$_2$: Eu, Mn.

As green phosphors, it is also possible to use a pyridine-phthalimide condensed derivative, fluorescent dyes based on benzoxazinone, quinazolinone, coumarin, quinophthalone, naphthalic imide, and the like, and an organic phosphor such as a terbium complex.

By way of citing examples of the specific wavelength range of fluorescence that a blue phosphor preferred in the present embodiment generates, a main emission peak wavelength is normally 430 nm or longer and preferably 440 nm or longer, but is normally 500 nm or shorter, preferably 480 nm or shorter, and particularly preferably 460 nm or shorter. In addition, the half-value width of a main emission peak is normally 1 nm or larger, preferably 10 nm or larger, and particularly preferably 30 nm or larger, but is normally 100 nm or smaller, preferably 80 nm or smaller, and particularly preferably 70 nm or smaller.

Examples of such blue phosphors include an europium-activated barium magnesium aluminate-based phosphor represented by BaMgAl$_{10}$O$_{17}$:Eu which is composed of grown particles having a substantially hexagonal shape as a regular crystal growth shape and undertakes luminescence in a blue region; an europium-activated calcium halophosphate-based phosphor represented by (Ca, Sr, Ba)$_5$(PO$_4$)$_3$Cl:Eu which is composed of grown particles having a substantially spherical shape as a regular crystal growth shape and undertakes luminescence in a blue region; an europium-activated alkaline earth chloroborate-based phosphor represented by (Ca, Sr, Ba)$_2$B$_5$O$_9$Cl:Eu which is composed of grown particles having a substantially cubic shape as a regular crystal growth shape and undertakes luminescence in a blue region; and an europium-activated alkaline earth aluminate-based phosphor represented by (Sr, Ca, Ba)Al$_2$O$_4$:Eu or (Sr, Ca, Ba)$_4$Al$_{14}$O$_{25}$: Eu which is composed of broken particles having a fracture cross section and undertakes luminescence in a blue-green region.

In addition to the abovementioned blue phosphors, it is also possible to use, for example, an Sn-activated phosphate phosphor such as Sr$_2$P$_2$O$_7$:Sn; an Eu-activated aluminate phosphor such as Sr$_4$Al$_{14}$O$_{25}$:Eu, BaMgAl$_{10}$O$_{17}$:Eu and BaAl$_8$O$_{13}$:Eu; a Ce-activated thiogallate phosphor such as SrGa$_2$S$_4$:Ce and CaGa$_2$S$_4$:Ce; an Eu, Tb, Sm-activated aluminate phosphor such as (Ba, Sr, Ca)MgAl$_{10}$O$_{17}$:Eu and BaMgAl$_{10}$O$_{17}$:Eu, Tb, Sm; an Eu, Mn-activated aluminate phosphor such as (Ba, Sr, Ca)MgAl$_{10}$O$_{17}$:Eu, Mn; an Eu, Tb, Sm-activated halophosphate phosphor such as (Sr, Ca, Ba, Mg)$_{10}$(PO$_4$)$_6$Cl$_2$:Eu and (Ba, Sr, Ca)$_5$(PO$_4$)$_3$(Cl, F, Br, OH): Eu, Mn, Sb; an Eu-activated silicate phosphor such as BaAl$_2$Si$_2$O$_8$:Eu and (Sr, Ba)$_3$MgSi$_2$O$_8$:Eu; an Eu-activated phosphate phosphor such as Sr$_2$P$_2$O$_7$:Eu; a sulfide phosphor such as ZnS:Ag and ZnS:Ag, Al; a Ce-activated silicate phosphor such as Y$_2$SiO$_5$:Ce; a tungstate phosphor such as CaWO$_4$; an Eu, Mn-activated borate phosphate phosphor such as (Ba, Sr, Ca)BPO$_5$:Eu, Mn, (Sr, Ca)$_{10}$(PO$_4$)$_6$.nB$_2$O$_3$: Eu and 2SrO.0.84P$_2$O$_5$.0.16B$_2$O$_3$:Eu; and an Eu-activated halosilicate phosphor such as Sr$_2$Si$_3$O$_8$.2SrCl$_2$:Eu.

As blue phosphors, it is also possible to use, for example, fluorescent dyes composed of naphthalic imide-, benzoxazole-, styryl-, coumarin-, pyrazoline- and triazole-based compounds, and an organic phosphor such as a thulium complex.

Note that the above-described red, green and blue phosphors may be used in combination as appropriate, according to a desired emission spectrum, color temperature, chromaticity coordinates, color rendering properties, luminous efficiency, and the like.

In the LED device 8, the LED elements 3 and the fluorescent portions 14 generally produce luminescence as a result of the phosphors being excited by the light emission of the LED elements 3. The LED elements 3 and the fluorescent portions 14 are arranged so that this luminescent light is taken out to the outside. If the LED device 8 has such a structure as described above, the above-described LED elements 3 and phosphors 14 are generally sealed and protected with a translucent material (sealing material). Specifically, this sealing material is adopted for the purpose of dispersing the phosphor to constitute luminescent portions and bonding the LED elements 3, the phosphors and the base 2 to one another as a result of being contained in the abovementioned fluorescent portions 14.

Examples of the translucent material to be used generally include thermoplastic resin, thermosetting resin, and photo-curable resin. Since the wavelengths of the output light of the LED elements 3 belong to a 360 nm to 430 nm near-ultraviolet region, however, resin having sufficient transparency to and durability against the output light is preferred as the sealing material. Hence, examples of the sealing material specifically include (meth)acrylic resin such as poly(meth) acrylic acid methyl; styrene resin such as polystyrene, styrene-acrylonitrile copolymer; polycarbonate resin; polyester resin; phenoxy resin; butyral resin; polyvinyl alcohol; cellulosic resin such as ethyl cellulose, cellulose acetate and cellulose acetate butylate; epoxy resin; phenol resin; and silicone resin. It is also possible to use an inorganic material prepared by solidifying a solution made by hydrolytically polymerizing, for example, metal alkoxide, ceramic precursor polymer, or a solution containing metal alkoxide, by a sol-gel method, or a combination of these substances, for example, an inorganic material or glass having a siloxane bond.

From the viewpoint of heat resistance, resistance to ultraviolet light (UV), and the like, it is preferable to use, among these inorganic materials, silicone resin which is a silicon-containing compound, or an inorganic material prepared by solidifying a solution made by hydrolytically polymerizing metal alkoxide, ceramic precursor polymer, or a solution containing metal alkoxide, by a sol-gel method, or a combination of these substances, for example, an inorganic material having a siloxane bond. Particularly preferred are a silicone-based material and silicone resin (which may be hereinafter referred to as "silicone-based materials of the present practical example") having one of more, preferably all, of the below-described characteristics (1) to (3).

(1) The resin has at least one of peaks (i) and/or (ii) described below in a solid-state Si-nuclear magnetic resonance (NMR) spectrum.
(i) A peak whose peak top is positioned in a region having a chemical shift of −40 ppm or greater but no greater than 0 ppm and whose half-value width is 0.3 ppm or greater but no greater than 3.0 ppm.
(ii) A peak whose peak top is positioned in a region having a chemical shift of −80 ppm or greater but less than −40 ppm and whose half-value width is 0.3 ppm or greater but no greater than 5.0 ppm.
(2) The resin is 20% by weight or higher in silicon content.
(3) The resin is 0.01% by weight or higher but 10% by weight or lower in the ratio of silanol content.

Here, a silicone-based material to serve as the abovementioned sealing material is preferably 20% by weight or higher in silicon content, as described above. The basic skeleton of the conventional silicone-based material is organic resin, such as epoxy resin, having carbon-carbon and carbon-oxygen bonds as the basic skeleton. In contrast, the basic skeleton of the silicone-based material of the present practical example is an inorganic siloxane bond the same as that of glass (silicate glass). A silicone-based material having this siloxane bond has excellent characteristics, including being (I) high in bond energy and less liable to thermodecomposition and photodecomposition, and therefore, superior in light resistance; (II) electrically-polarized slightly; (III) high in the degree of freedom of a chain-like structure, capable of having a highly flexible structure, and freely rotatable around a siloxane chain; (IV) high in the degree of oxidation and not oxidized any further; and (V) rich in electrical insulating properties.

From these characteristics, it is understood that a silicone-based material formed from a skeleton in which siloxane bonds are combined three-dimensionally with a high degree of cross-linkage is close to an inorganic substance, such as glass or rock, and serves as a protective coating rich in heat resistance and light resistance. In particular, a silicone-based material having a methyl group as a substituent has no absorption in an ultraviolet region and is, therefore, less liable to photodecomposition and superior in light resistance.

As described above, the silicon content of the silicone-based material of the present practical example is 20% by weight or higher. Among other silicon content ratios, however, the silicon content is preferably 25% by weight or higher, and more preferably 30% by weight or higher. On the other hand, the upper limit of the silicon content is generally 47% by weight or lower for the reason that the silicon content of glass composed solely of $SiO_2$ is 47% by weight.

The LED device 8 configured as described above is such that each fluorescent portion 14 including four LED elements 3 as light sources and excited by near-ultraviolet light is provided in each of the two divided regional sections 12A and 12B divided by the partition 11. In addition, the two divided regional sections 12A and 12B are integrally provided inside the package 1 with the exit apertures of output light, i.e., the divided openings 13A and 13B arranged side by side. White light which is output light from the fluorescent portions 14A and 14B is emitted to the outside from the divided openings 13A and 13B. Here, white light released from these divided openings is available through the phosphor-containing fluorescent portions 14. Accordingly, output light from the LED elements 3A and 3B is sufficiently scattered and emitted with a Lambertian distribution of light. Consequently, it is possible to synthesize primary light from the abovementioned three types of phosphors to make the light white, and thus obtain a uniform white color. Accordingly, uniform white light and luminance are available in synthetic light emitted by the LED device 8.

Figure 4:
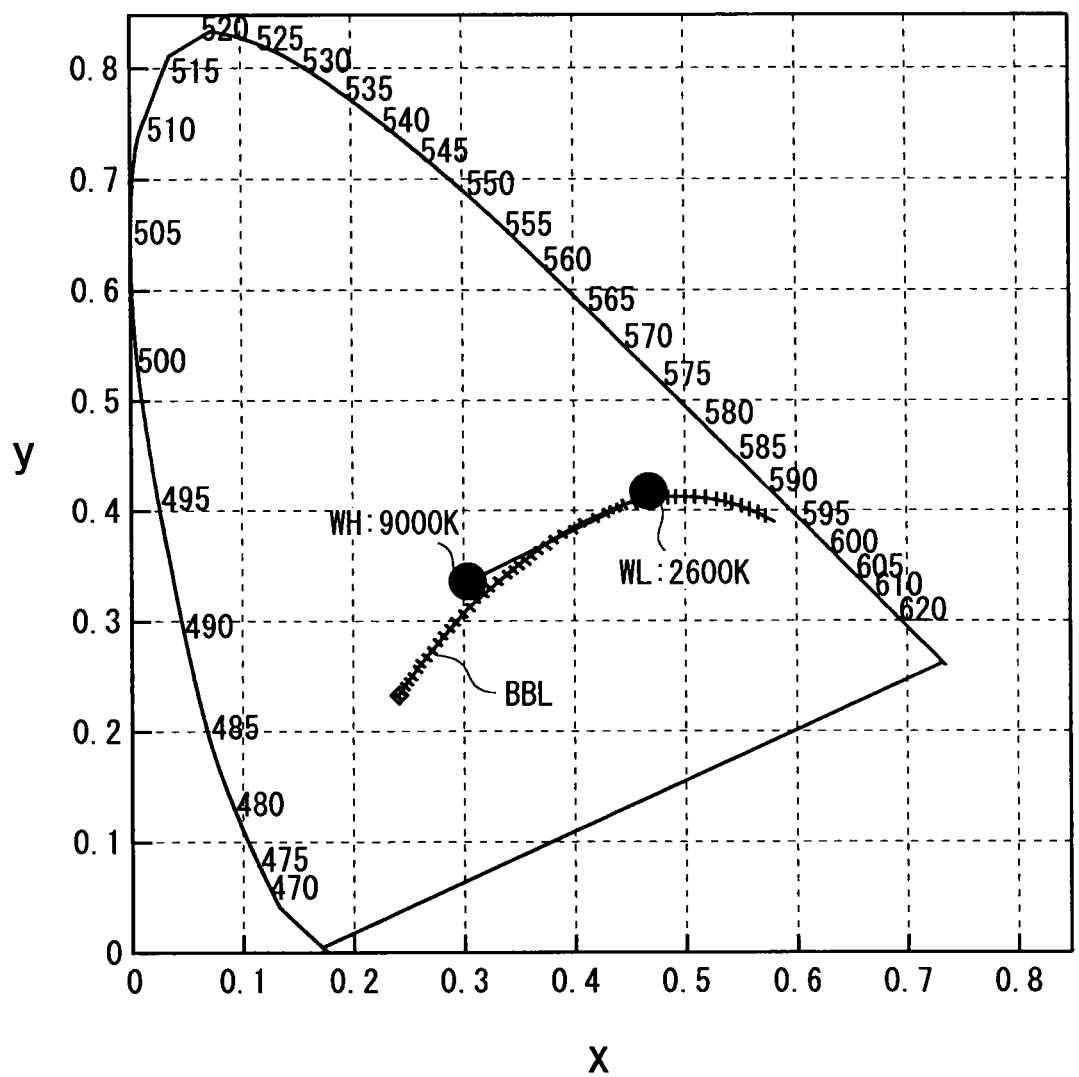
FIG. 4 is a drawing illustrating the relationship between chromaticity points and a black body radiation locus of white light set in output light from each divided regional section in the LED device illustrated in FIG. 1.
Figure 5:
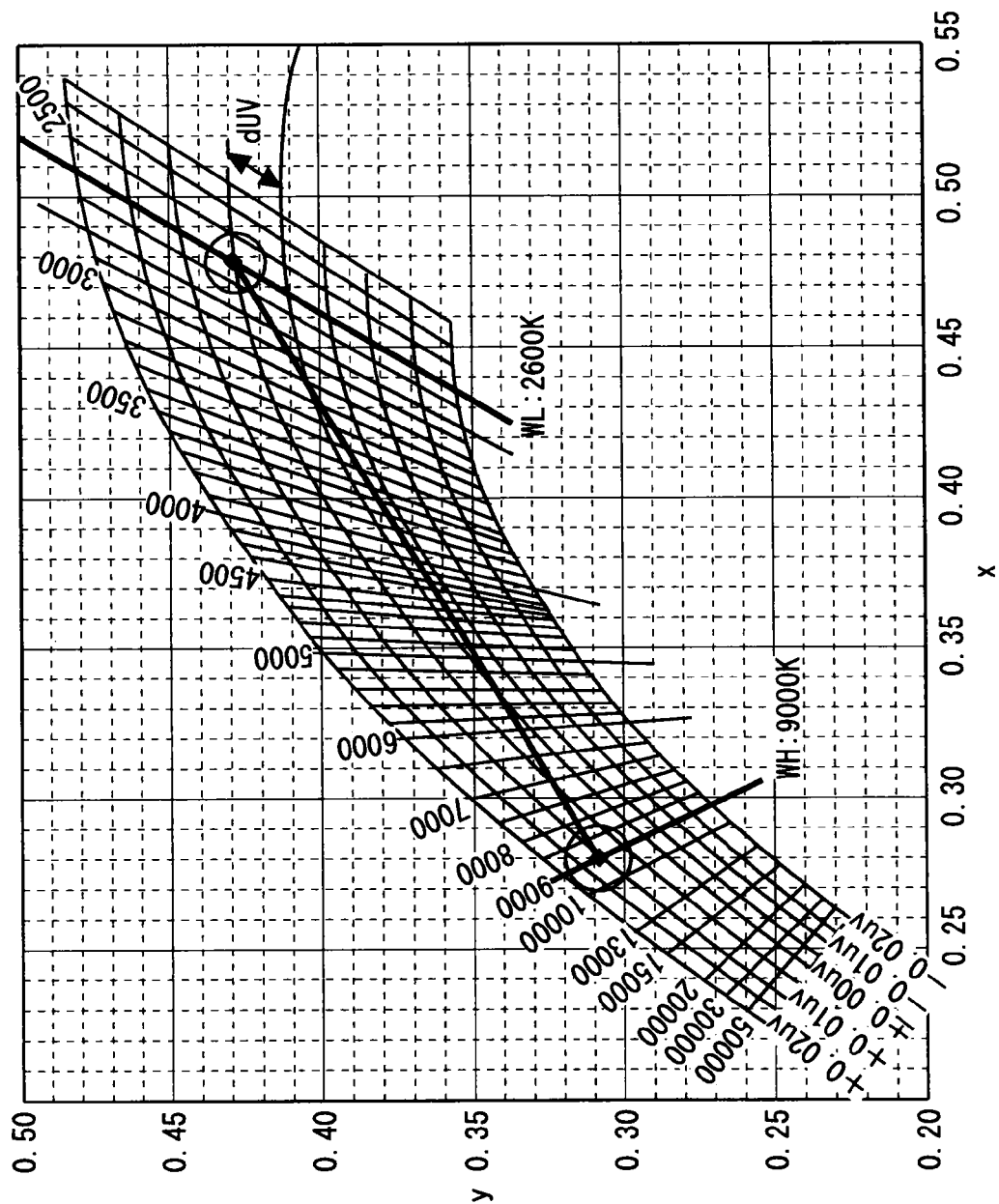
FIG. 5 is an enlarged view of a principal part with regard to the relationship between the chromaticity points and the black body radiation locus of white light illustrated in FIG. 4.

Here, a phosphor to be contained in the fluorescent portion 14A and a phosphor to be contained in the fluorescent portion 14B are selected as appropriate, so that the spectrums of white light (hereinafter referred to as "white light A") output from the divided regional section 12A and white light (hereinafter referred to as "white light B") output from the divided regional section 12B differ from each other. Assuming that chromaticity points on an xy chromaticity diagram (CIE 1931) corresponding to white light A and B are represented by $W_L$ and $W_H$, then the correlated color temperature of the chromaticity point $W_L$ is 2600K, and the correlated color temperature of the chromaticity point $W_H$ is 9000K, as illustrated in FIGS. 4 and 5. It is also assumed here that the deviation duv of the chromaticity point $W_L$ from the black body radiation locus BBL is +0.005 and the deviation duv of the chromaticity point $W_H$ from the black body radiation locus BBL is +0.01. Note that FIG. 5 is an enlarged view of a principal part in FIG. 4 taken by converting the range $-0.02 \leq duv \leq 0.02$ of deviations from the black body radiation illustrated in the figure from a UCS color coordinate system (CIE 1960) onto an xy chromaticity diagram (CIE 1931).

In the above-described case, it can be said that the output light of the LED device 8 is made to substantially conform to the black body radiation locus BBL by setting up the LED device 8 so that the white light A from the divided regional section 12A and the white light B from the divided regional section 12B differ in correlated color temperature from each other, and keeping the deviations duv of respective chromaticity points corresponding to the white light A and B from the black body radiation locus BBL within the range $-0.02 \leq duv \leq 0.02$. In addition, it is possible to freely vary the energy ratio between the white light A and B for each of the white light A and B by controlling the drive conditions, such as the light emission time and the drive current value or the amount of electrical power, of the LED elements 3A and 3B arranged in the respective divided regional sections. Thus, it is possible to adjust a chromaticity point of synthetic light which is the eventual output light of the LED device 8 to correlated color temperature corresponding to an arbitrary chromaticity point on a straight line connecting between the abovementioned chromaticity points $W_L$ and $W_H$. That is, in the LED device 8, it is possible to adjust the correlated color temperature of the synthetic light which is the output light of the LED device 8 to an arbitrary value from 2600K to 9000K, by respectively controlling supply power to the LED elements 3 arranged in the corresponding divided regional sections 12A and 12B, respectively, through the traces 20A and 20B. Yet additionally, since the chromaticity point of the synthetic light substantially conforms to the black body radiation locus BBL, the LED device 8 can provide extremely near-natural white light in terms of human visual sense. Furthermore, it is possible to freely vary the color temperature from 2600K to 9000K, i.e., to adjust the color of the output light of the LED device 8.

In the practical examples having been described thus far, the LED elements 3 are combined with red, green and blue phosphors, and the units thus obtained are arranged in the respective divided regional sections 12, as illustrated in, for example, FIG. 1, in order to output white light as synthetic light in the LED device 8. As a matter of course, however, other combinations of the semiconductor light-emitting elements and phosphors may be adopted and arranged in the respective divided regional sections 12, in order to output white light. Hence, assume that the combination of each LED element 3 and the red, green and blue phosphors having been discussed thus far is a combination A. Then, a combination of a blue LED element and red and green phosphors (combination B) and a combination of a blue LED element and a yellow phosphor (combination C) can also be arranged in the divided regional sections 12 illustrated in, for example, FIG. 1 as other combinations in which white light is available. Technologies themselves to output white light by means of the combinations B and C are heretofore-known, and therefore, will not be discussed in detail here.

Figure 6:
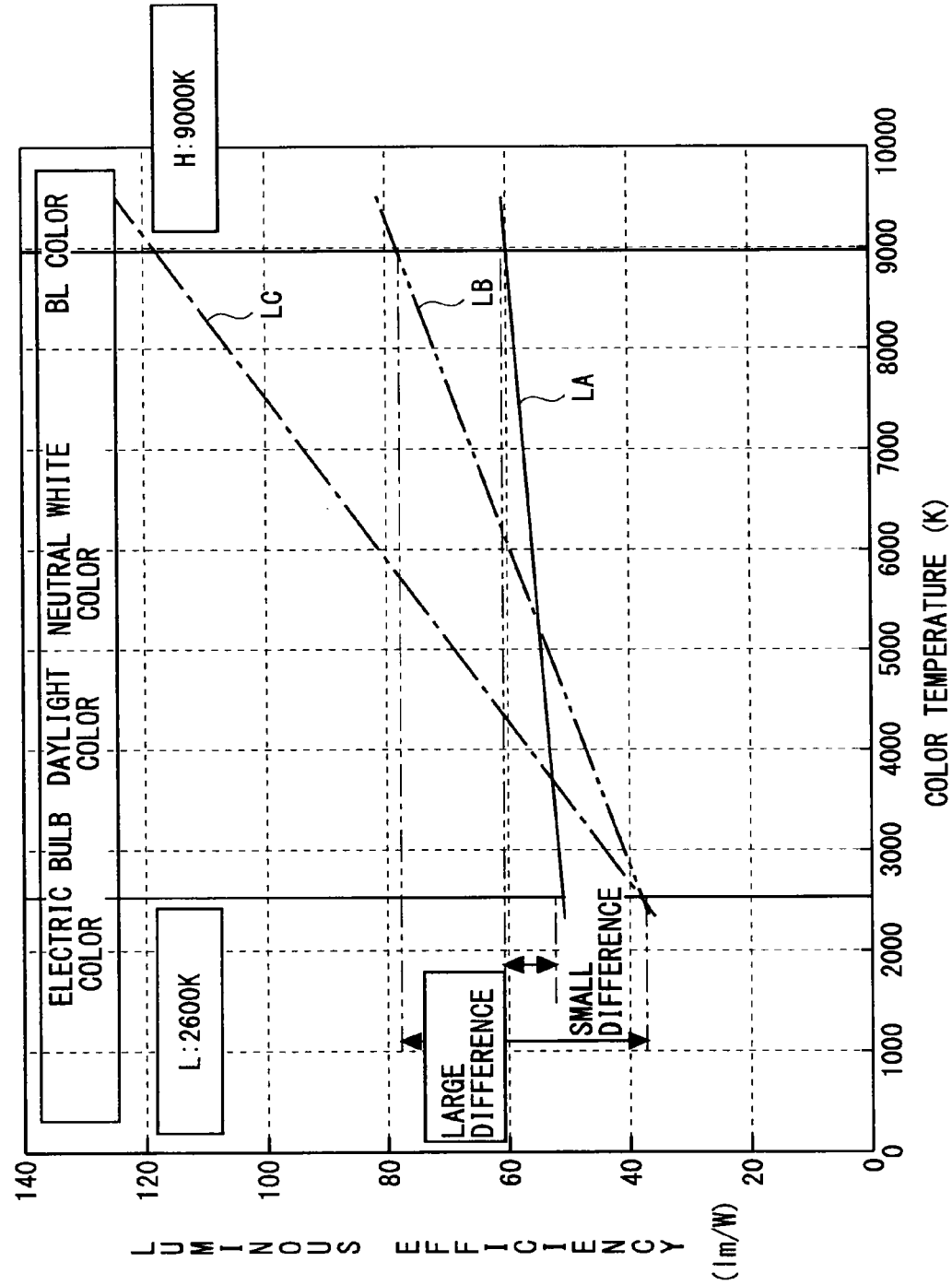
FIG. 6 is a drawing illustrating the correlationship between the color temperature and the luminous efficiency of output light with regard to combinations of various LED elements and phosphors adoptable in the LED device illustrated in FIG. 1.

Here, the correlation between the color temperature of white light available by adjusting the concentration of phosphors and the luminous efficiency of the white light in the above-described combinations A, B and C is illustrated in FIG. 6. The axis of abscissas of FIG. 6 represents color temperature (K), whereas the axis of ordinates represents luminous efficiency (lm/W). A line LA in the figure corresponds to the combination A, a line LB corresponds to the combination B, and a line LC corresponds to the combination C. As can be understood from FIG. 6, the line LA corresponding to the combination A, among the abovementioned three combinations, has the smallest slope, and is an almost horizontal straight line, whereas the slope of the line LC corresponding to the combination C is largest. A larger slope of each straight line means that the luminous efficiency of the straight line varies more greatly when an attempt is made to change color temperature.

Hence, an increase in the slope of each illustrated straight line means that if electrical power supplied to an LED element is kept constant when color temperature is varied, the luminance of the LED element varies greatly. In other words, if the slope of each of the straight lines is relatively large, it is increasingly necessary to reliably control supply power to the LED element, in order to stabilize luminance. As a result, the overall drive and control of the LED device 8 is likely to become cumbersome. Accordingly, in order to configure an LED device 8 stable in luminance, it is preferable to adopt a combination in which the slope of any of the straight lines illustrated in FIG. 6 is as small as possible, i.e., a combination A of the LED element 3 and corresponding phosphors having three colors. However, this does not mean precluding application of the combinations B and C and other combinations of an LED element and phosphors to the LED device 8 according to the present invention.

Note that the light itself of a blue LED element which is a source of phosphor excitation is utilized as blue light in color mixing for whitening in the combinations B and C. It is therefore necessary to increase the amount of red, green or yellow phosphor to reduce the proportion of blue light, in order to produce low-color temperature regions. In addition, since blue light is more efficient than phosphor-converted light, the LED device 8 degrades in efficiency as the proportion of blue light decreases. On the other hand, if an LED element is used as in the combination A, near-ultraviolet light hardly contributes to whitening, and most of the light is used for phosphor excitation. Thus, whitening is based mostly on blue, green and red phosphor-converted light. Accordingly, any significant effects do not develop in luminous efficiency even if the composition ratio of a phosphor is changed in order to vary color temperature.

As described above, according to the LED device 8 in accordance with the present practical example, it is possible to easily output white light having color temperature between 2600K and 9000K. In addition, by adopting the structure illustrated in, for example, FIG. 2, it is possible to sufficiently prevent the possibility of the synthetic light of output light from the respective divided regional sections 12 being separated on an irradiation surface.

Figure 7A:
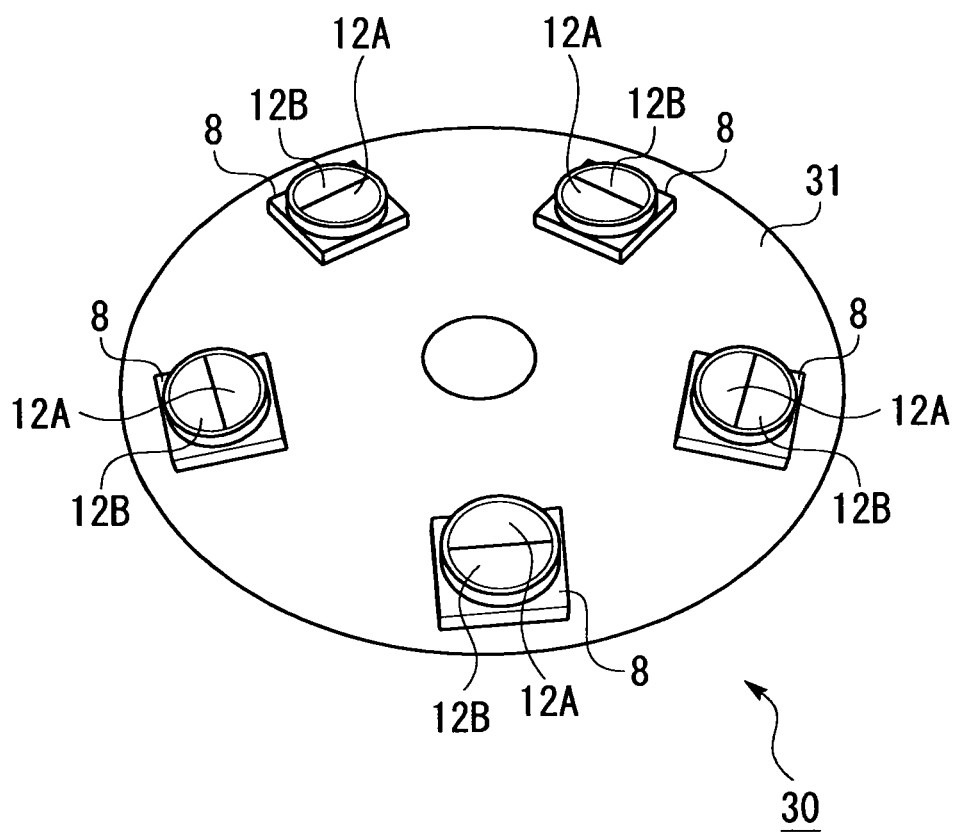
FIG. 7A is a perspective view illustrating a configuration of the light-emitting module according to Practical Example 1.
Figure 7B:
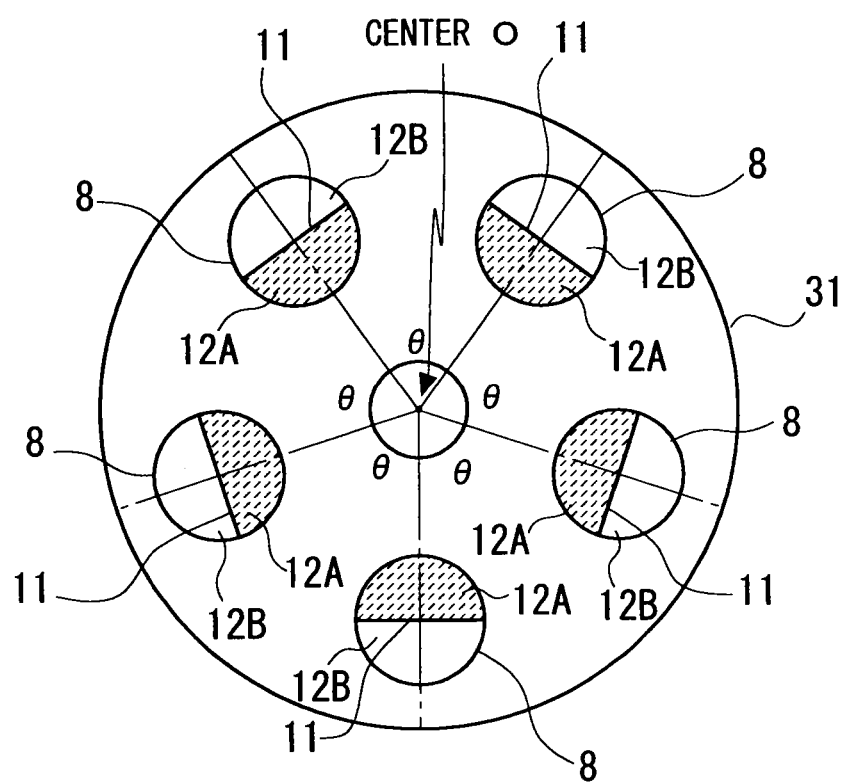
FIG. 7B is a drawing schematically illustrating the layout of LED devices in the light-emitting module.

Here, the configuration of a light-emitting module 30 configured as discussed above and capable of easily outputting white light having color temperature between two color temperature points, i.e., a light-emitting module 30 provided with a color temperature-tunable LED device 8 and a circuit board 31 for implementing this LED device 8 will be described according to FIGS. 7A and 7B. FIG. 7A is a perspective view illustrating a specific configuration of the light-emitting module 30. FIG. 7B is a drawing schematically illustrating a layout of five LED devices 8 in the light-emitting module illustrated in FIG. 7A. Note that a system of electrical power supply to each LED device 8 is not illustrated in FIG. 7A. In addition, the divided regional section 12A is patterned with dashed lines in FIG. 7B for the sake of convenience, in order to distinguish between the divided regional sections 12A and 12B. Specifically, the light-emitting module 30 is such that the LED devices 8 are circularly disposed on the likewise circular circuit board 31. At this time, the five LED devices 8 are equiangularly disposed on the same circumference with the center O of the circuit board 31 as a central point, as illustrated in FIG. 7B. Accordingly, every angle θ formed between adjacent LED devices 8 (hereinafter referred to as "predetermined arrangement angle θ") equals an angle, i.e., 72°, given by dividing 360° around the center O by 5 which is the number of LED devices 8.

Here, the five LED devices 8 of the light-emitting module 30 are laid out, so that as illustrated in FIG. 7B, a partition 11 in each LED device 8 and the radius of a circle along which the LED devices 8 are disposed are perpendicular to each other, that the divided regional section 12A is positioned inside the circle, and that the divided regional section 12B is positioned outside the circle. As a result, in the light-emitting module 30, the orientation of each partition 11 with respect to the partition 11 of an LED device 8 adjacent thereto is in a state of being rotated in increments of the abovementioned predetermined arrangement angle θ in one rotational direction within the plane of the opening 13 of each LED device 8. Consequently, the orientation of each partition 11 representative of the relative positional relationship between the divided regional sections 12A and the divided regional sections 12B differs from one LED device 8 to another.

By disposing the five LED devices 8 with the orientations of the partitions 11 shifted in increments of the predetermined arrangement angle θ as described above, luminescence from the divided regional section 12A and divided regional section 12B of each LED device 8 is made easy to be synthesized with unevenness in the luminescence suppressed. Accordingly, it is possible to prevent light radiated as luminescence from the light-emitting module 30 from separating on an irradiation surface. In particular, it is possible to avoid luminescence separation even when a lens element, such as a convex lens, is placed over the opening 13 of each LED device 8.

Figure 8:
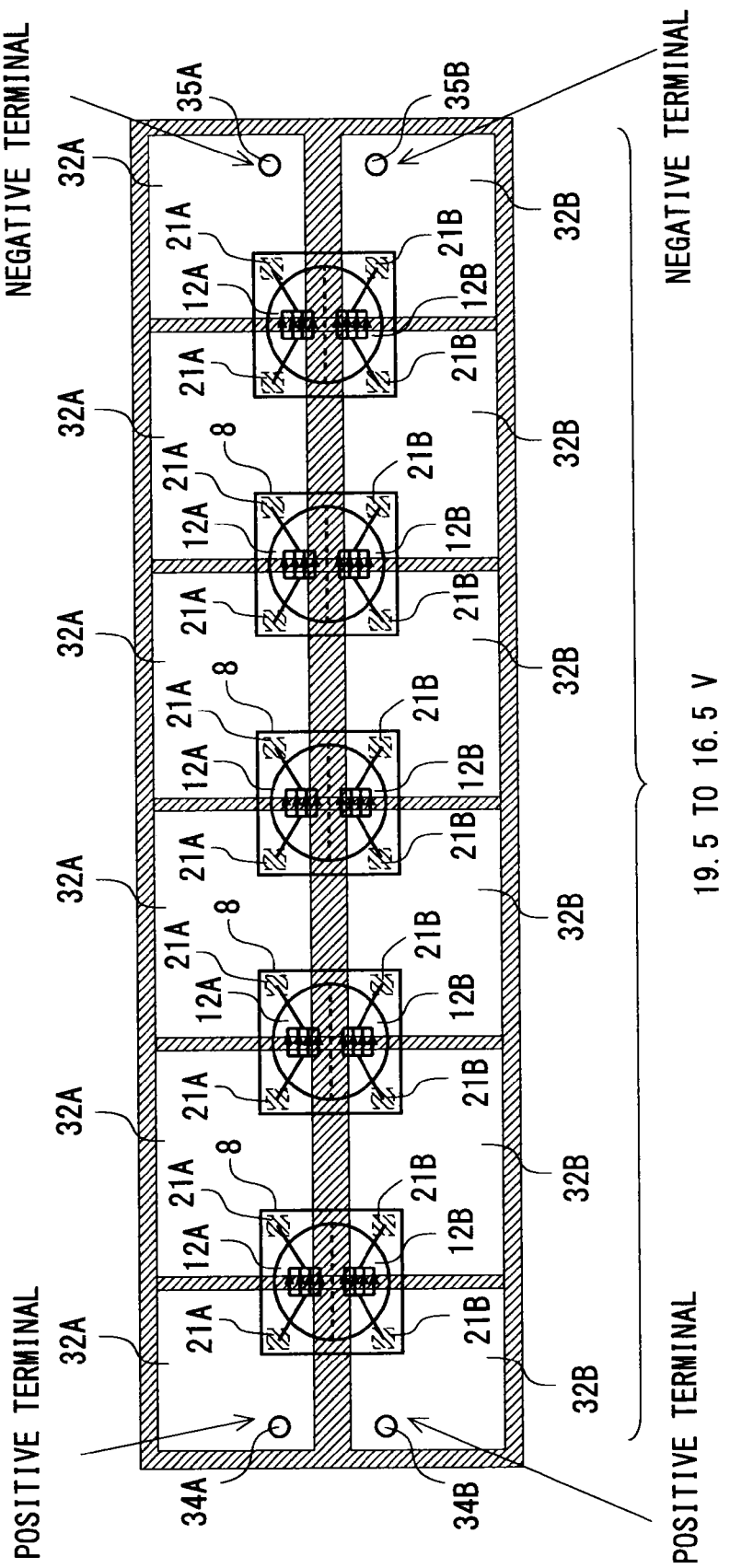
FIG. 8 is a drawing schematically illustrating a state of electrical connection among the respective LED devices of the light-emitting module.

FIG. 8 is a drawing schematically illustrating a state of electrical connection among the respective LED devices 8 of the light-emitting module 30. In the light-emitting module 30, traces 20A of the five divided regional sections 12A that the respective LED devices 8 include are connected in series with one another. Likewise, traces 20B of the five divided regional sections 12B are connected in series with one another. By connecting the respective divided regional sections 12A and 12B of the LED devices 8 in series with one another as described above, the luminescence control of the light-emitting module 30 is made easy.

In the present practical example, respective electrodes 21A corresponding respectively to the divided regional sections 12A are arranged so as to be in contact with power supply conductor layers 32A and 32B (which may be comprehensively referred to as power supply conductor layers 32). Details on the power supply conductor layers 32A and 32B will be described later. These components are major constituent elements of the circuit board 31. The power supply conductor layers 32A and 32B are used to supply drive currents (electrical power) to the respective LED elements 3, with the respective divided regional sections 12A and 12B regarded as separate control systems. The present practical example adopts two control systems. That is, drive currents to the divided regional sections 12A are supplied by the current supply conductor layers 32A, and drive currents to the divided regional sections 12B are supplied by the current supply conductor layers 32B. Thus, current supply to the respective LED elements 3 corresponding to the respective power supply conductor layers 32A and 32B is controlled independently of one another.

Here, the current supply conductor layers 32A and 32B of different control systems are planarly isolated from each other by an insulator (indicated by hatching in the figure). Reference characters 34A and 34B in the figure denote positive polarity external terminal portions, whereas reference characters 35A and 35B denote negative polarity external terminal portions. Although the current supply conductor layers 32 are depicted as being rectangular in FIG. 8, the layers are represented by rectangles in the figure only for the sake of convenience. In addition, the grounding line of each LED device 8 is not illustrated here.

Figure 9:
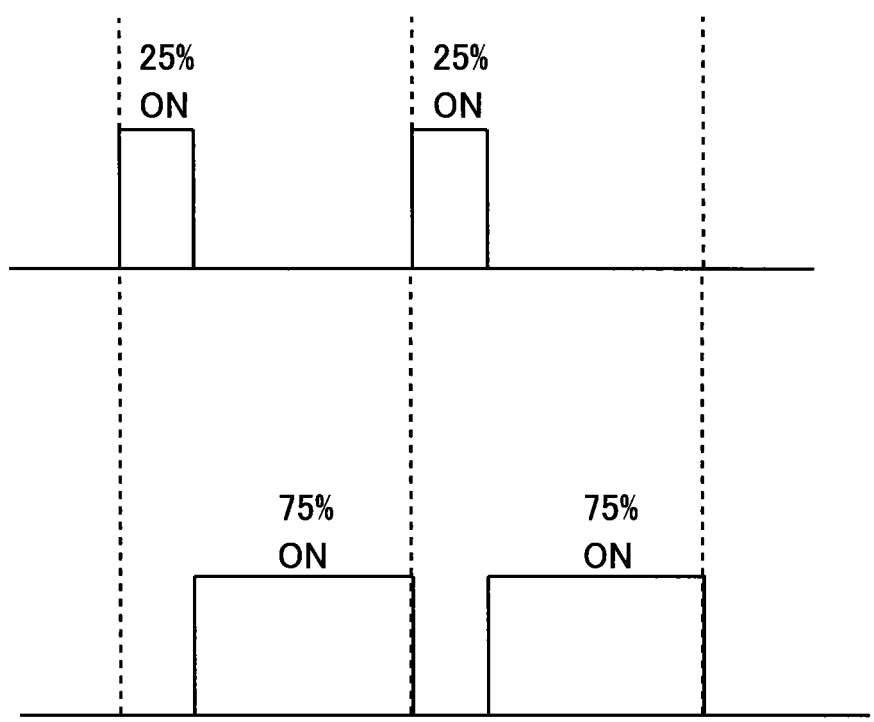
FIG. 9 is a drawing illustrating one mode of current supply to the light-emitting module illustrated in FIGS. 7 and 8.

FIG. 9 illustrates one example of an electric current supplied to each LED device 8 for the luminescence control of the light-emitting module 30. In particular, an upper side in FIG. 9 illustrates the transition of an electric current supplied through a current supply conductor layer 32A to LED elements 3A disposed within the divided regional section 12A of each LED device 8. Likewise, an under side in FIG. 9 illustrates the transition of an electric current supplied through a current supply conductor layer 32B to LED elements 3B disposed within the divided regional section 12B of each LED device 8. In the present practical example, a rectangular electric current is supplied to each LED element 3. In addition, each LED device 8 is controlled so that a total sum of the amount of electrical current supplied to the LED element 3A side and the amount of electrical current supplied to the LED element 3B side is kept constant. Note that under the condition illustrated in FIG. 9, the amount of electrical current supplied to the LED element 3A side is 25% of the total sum, and the amount of electrical current supplied to the LED element 3B side is 75% of the total sum. As a result, the ratio between the intensity of luminescence from the divided regional section 12A of each LED device 8 and the intensity of luminescence from the divided regional section 12B of each LED device 8 is 1:3.

By adjusting a ratio of the amount of electrical current supplied to each semiconductor light-emitting element 3 side, while keeping constant the total sum of the amount of electrical current supplied to the LED element 3A side and the amount of electrical current supplied to the LED element 3B side, as described above, it is possible to vary the ratio between the intensities of luminescence from the divided regional section 12A and divided regional section 12B, while keeping constant the luminescence intensity of the light-emitting module 30's own. As a result, the correlated color temperature of the output light can be adjusted to an arbitrary value between 2600K and 9000K, as illustrated in FIGS. 4 and 5, while keeping the output light of the light-emitting module 30 constant in luminescence intensity. In addition, since the chromaticity point of the synthetic light substantially conforms to the black body radiation locus BBL, as described above, the light-emitting module 30 can provide extremely near-natural white light in terms of human visual sense. Furthermore, it is possible to freely vary the color temperature from 2600K to 9000K.

Note that the ratio between the intensities of luminescence from each divided regional section 12A and each divided regional section 12B may be varied either stepwise or continuously. In the case of the former, the light-emitting module has a plurality of output light different in correlated color temperature. Accordingly, a user selects an output having either one of the correlated color temperatures to use the light-emitting module 30. In the case of the latter, the user selects an arbitrary ratio, so that the output light has a desired correlated color temperature, to use the light-emitting module 30. However, methods of drive and control other than those described above may be adopted for the drive and control of the LED elements 3A and 3B. For example, the input current of each of the LED elements 3A and 3B may be controlled by supplying electrical power independently for each near-ultraviolet LED element, without keeping constant the total sum of the amounts of electrical currents supplied to the LED elements 3A and 3B.

As in the one mode described in FIG. 9, the ratio between the intensities of luminescence from each divided regional section 12A and each divided regional section 12B can be varied, while keeping the output light of the light-emitting module 30 constant in luminescence intensity. Consequently, the color temperature of output light output by the light-emitting module 30 can be made freely and easily variable. On the other hand, local heat concentration is liable to take place in each LED device 8 as a result of varying the luminescence intensity ratio between each divided regional section 12A and each divided regional section 12B. Then, such a problem as a luminous efficiency degradation due to a temperature rise in the LED elements 3, a thermal degradation in the LED elements 3, or the like is more liable to become actualized, compared with a so-called color-nontunable semiconductor light-emitting device. Hence, in the light-emitting module 30 of the present practical example, contrivances have been made, in particular, in the configuration of the circuit board 31 for supporting the LED devices 8 mounted thereon, in order to more efficiently release heat generated in each LED device 8 to the outside to improve heat dissipation performance.

Figure 11:
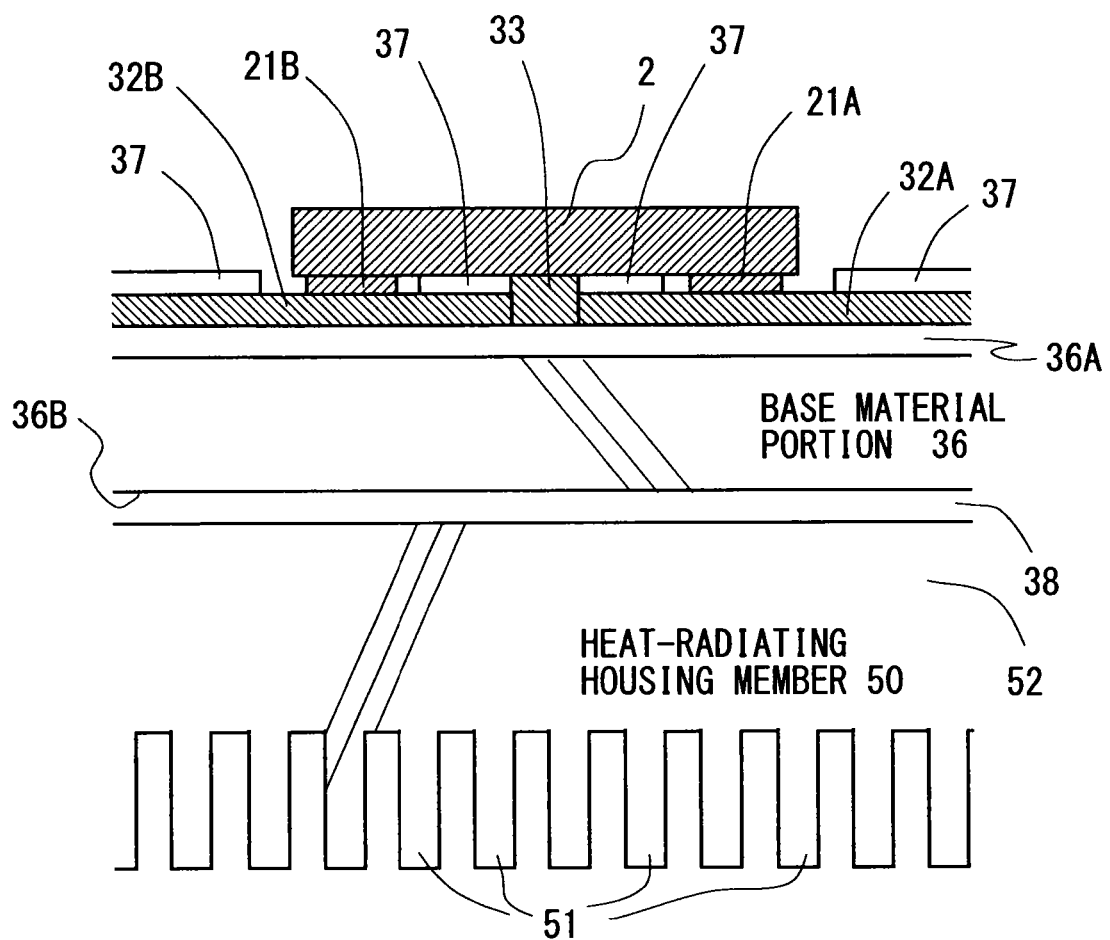
FIG. 11 is a drawing schematically illustrating a cross section of FIG. 10 including the A-A cutting-plane line thereof.
Figure 12:
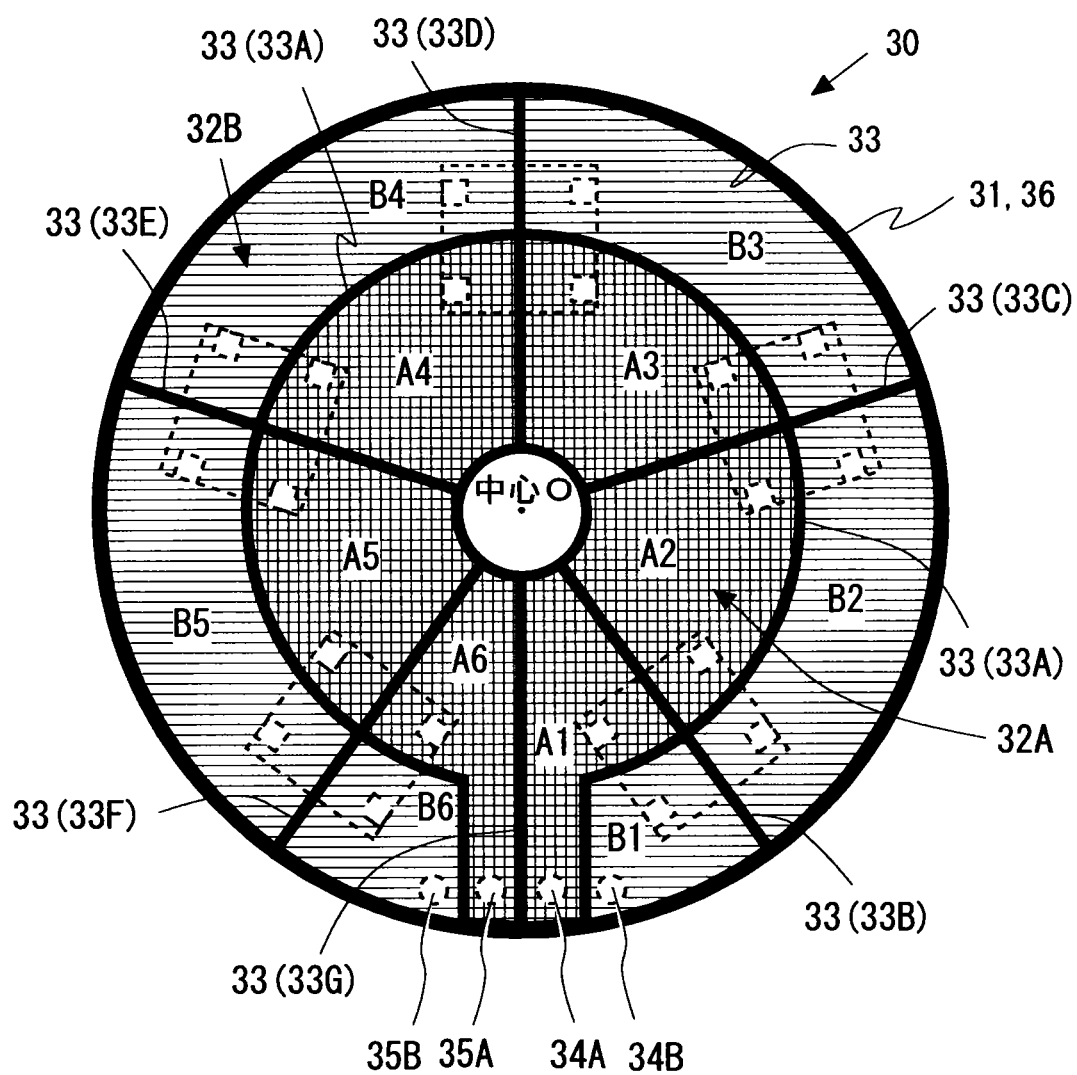
FIG. 12 is a drawing illustrating a current supply conductor layer of the circuit board according to Practical Example 1.
Figure 13:
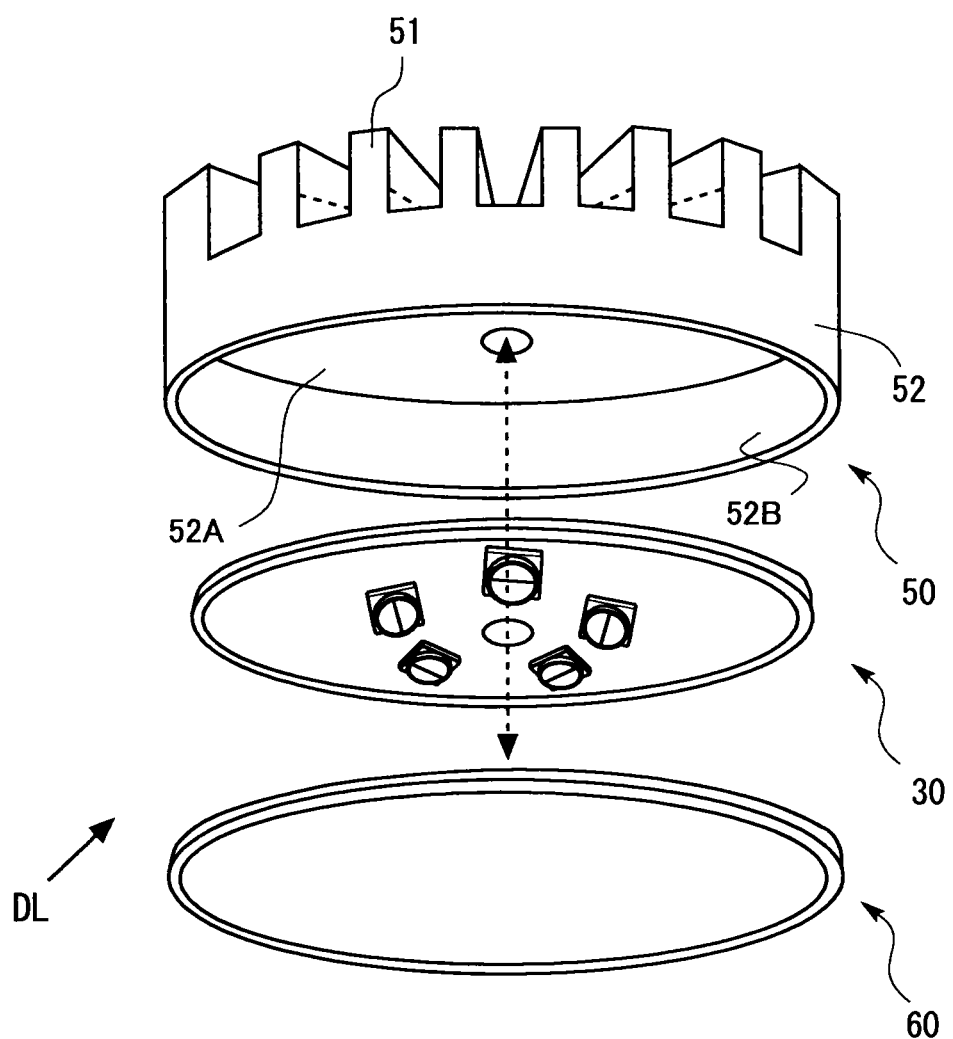
FIG. 13 is a drawing illustrating a lighting apparatus DL including a light-emitting module, a heat-radiating housing member, and a lens.

FIG. 10 is a drawing schematically illustrating the upper surface of the light-emitting module 30. FIG. 11 is a drawing schematically illustrating a cross section of FIG. 10 including the A-A cutting-plane line thereof. FIG. 12 is a drawing illustrating the current supply conductor layers of the circuit board 31. FIG. 13 is a drawing illustrating a lighting apparatus DL including the light-emitting module 30, a heat-radiating housing member 50, and a lens 60.

As illustrated in FIG. 10, the circuit board 31 of the light-emitting module 30 is a board for supporting the LED devices 8 mounted thereon (packaged in). In the present practical example, the circuit board 31 supports five LED devices 8 mounted thereon. In the present practical example, the circuit board 31 has a substantially circular shape. More particularly, the circuit board 31 has an annular (doughnut) shape as a result of a circular hole being formed in the central part O of the circuit board 31. The shape of the circuit board 31 is not limited to this shape, however, but other shapes may be adopted. The upper surface (outermost layer) of the circuit board 31 is covered with an insulating resin layer 37 (solder resist, by way of example), where the underlying current supply conductor layers 32 are exposed only on the locations where the LED devices 8 are mounted, more specifically, only on the portions joined to electrodes on the LED device 8 side. Note that radial dashed lines indicated in FIG. 10 represent insulators 33 to be described later. These insulators 33 are located in a layer underneath the insulating resin layer 37.

The configuration of the circuit board 31 in the laminating direction thereof will be described with reference to FIG. 11. Note that the structure of the upper portion of the base 2 in each LED device 8 is not illustrated in FIG. 11. As illustrated in FIG. 11, the circuit board 31 includes a base material portion 36 serving as a foundation to be fitted with respective LED devices 8 and formed using a heat-conducting material. In the present practical example, the base material portion 36 is made using aluminum. The base material portion 36 is not limited to this material, however. An insulating resin layer 36A is formed on a surface of the base material portion 36.

For this insulating layer 36A, it is possible to use, for example, resin typified by PEEK (polyether ether ketone), or epoxy resin.

The current supply conductor layers 32 are laminated on the insulating layer 36A, and are formed so as to cover almost the entire surface of the base material portion 36 (see FIG. 12). In FIG. 12, portions enclosed with dashed lines indicate the external shapes and electrode positions of the LED devices 8 and the positions of the external terminal portions as illustrated in FIG. 10 using virtual lines. Copper foil superior in electrical conducting properties, for example, is used for the current supply conductor layers 32 in the present practical example. Alternatively, however, other electroconductive materials may be used for the layers. As described in FIG. 8, in the present practical example, two control systems are used to supply drive currents to LED elements 3 included in the respective divided regional sections 12. Among the current supply conductor layers, the current supply conductor layer 32A for supplying the drive current of a control system corresponding to LED elements 3A in each divided regional section 12A is referred to as "first current supply conductor layer", whereas the current supply conductor layer 32B for supplying the drive current of a control system corresponding to LED elements 3B in each divided regional section 12B is referred to as "second current supply conductor layer." The drive current paths of the first current supply conductor layer 32A and the second current supply conductor layer 32B are divided off from each other, so that a drive current of a different control system flows for each drive current path.

As illustrated in FIG. 12, the first current supply conductor layer 32A and the second current supply conductor layer 32B are isolated from each other by an insulator (hereinafter referred to as "annular insulator") 33A formed into a substantially circular shape. In other words, the first current supply conductor layer 32A and the second current supply conductor layer 32B different from each other in the path through which a drive current flows are planarly divided off by the annular insulator 33A in the in-plane direction of the base material portion 36. As a result, the first current supply conductor layer 32A and the second current supply conductor layer 32B, i.e., the regions of the abovementioned power supply conductor layers in different control systems are formed so as not to overlap one on top of another (so as not to be laminated). In this figure, the first current supply conductor layer 32A (cross-hatched) is located inside the annular insulator 33A, whereas the second current supply conductor layer 32B (horizontally hatched) is located outside the annular insulator 33A, with the annular insulator 33A as a boundary. Note that in FIG. 12, portions where external terminal portions are formed, junctions where the current supply conductor layers are solder-joined to the electrodes 21 of the LED devices 8, and the like are indicated by virtual lines.

Six insulators (hereinafter referred to as "radial insulators") 33B to 33G are arranged radially in the radial direction of the circuit board 31 (base material portion 36). By these radial insulators 33B to 33G, the first current supply conductor layer 32A is partitioned (divided off) into six conductor regions A1 to A6, and the second current supply conductor layer 32B is likewise partitioned (divided off) into six conductor regions B1 to B6. The radial insulators 33B to 33G (second insulators) further planarly divide off regions divided off by the annular insulator 33A, i.e., regions identical to one another in drive current control system, among the planar regions of the power supply conductor layers 32. Each LED device 8 is mounted on the circuit board 31, so as to cross the upper portion of one of the radial insulators 33B to 33F. Consequently, regions of the first current supply conductor layer 32A (for example, a pair of conductor regions A1 and A2) divided off by one of the radial insulators 33B to 33F are electrically connected through a pair of electrodes 21A and a trace 20A (internal trace) formed on the lower surface of the base 2 of the LED device 8. Likewise, regions of the second current supply conductor layer 32B (for example, a pair of conductor regions B1 and B2) are electrically connected through a pair of electrodes 21B and a trace 20B (internal trace) formed on the lower surface of the base 2 of the LED device 8. That is, one and the other regions divided off by each of the radial insulators 33B to 33F in the respective current supply conductor layers 32A and 32B are placed in electrical continuity with each other by an internal trace of each LED device 8. Consequently, it is possible to realize a compact light-emitting module 30 superior in heat dissipation.

As illustrated in FIG. 11, the insulating resin layer 37 is further laminated on the current supply conductor layers 32 laminated on the base material portion 36. As illustrated in FIG. 10, in the first current supply conductor layer 32A, portions where the positive external terminal portion 34A and the negative external terminal portion 35A are formed and portions to be solder-joined to the electrodes 21A formed on the lower surfaces of the bases 2 in the respective LED devices 8 are exposed, whereas the rest of the first current supply conductor layer 32A is covered with the insulating resin layer 37.

In the second current supply conductor layer 32B, portions where the positive external terminal portion 34B and the negative external terminal portion 35B are formed and portions to be solder-joined to the electrodes 21B formed on the lower surfaces of the bases 2 in the respective LED devices 8 are exposed, whereas the rest of the second current supply conductor layer 32B is covered with the insulating resin layer 37. In addition to these portions, the current supply conductor layers 32 should preferably be exposed for portions where power controlling electronic components (not illustrated), such as zener diodes, provided for the prevention of current backflow are disposed. Such power controlling electronic components need not necessarily be located on the circuit board 31, however, but may be located outside the circuit board 31. Alternatively, the power controlling electronic components may be located inside the LED devices 8.

As described above, the respective LED devices 8 mounted on the circuit board 31 are disposed circularly and equiangularly on the same circumference of the circuit board 31 with the center O thereof as a central point (see FIG. 7B). Thus, the predetermined arrangement angle θ formed between adjacent LED devices 8 is 72°. In FIG. 10, five LED devices 8 are defined as LED devices 8A to 8E in order from the LED device 8 closest to the positive external terminal portions 34A and 34B.

As has been described heretofore by referring to FIGS. 10 to 12, in the circuit board 31 (base material portion 36) of the present practical example, the current supply conductor layers 32 whose the planar regions are divided by the insulators 33 are such that in the respective LED devices 8, traces 20 relevant to divided regional sections 12 corresponding to one another, more particularly, among the traces 20 for implementing LED elements 3, those that use the same drive current control system are connected in series with one another.

Specifically, in the drive current control system (hereinafter referred to as "first control system") on the divided regional section 12A side of each LED device 8, i.e., the drive current control system corresponding to the LED elements 3A, a drive current from the positive external terminal portion 34A follows the routes of A1→divided regional section of LED device 8A, 12A→A2→divided regional section of LED device 8B, 12A→A3→divided regional sections of LED device 8C, 12A→A4-divided regional sections of LED device 8D, 12A→A5→divided regional section of LED device 8E, and 12A→A6, and reaches the negative external terminal portion 35A. Likewise, in the drive current control system (hereinafter referred to as "second control system") on the divided regional section 12B side of each LED device 8, i.e., the drive current control system corresponding to the LED elements 3B, a drive current from the positive external terminal portion 34B passes through the routes of B1→divided regional section of LED device 8A, 12B→B2→divided regional section of LED device 8B, 12B→B3→divided regional sections of LED device 8C, 12B→B4→divided regional sections of LED device 8D, 12B→B5→divided regional section of LED device 8E, and 12B→B6, and reaches the negative external terminal portion 35B. Consequently, independent luminescence control can be realized for each electrical power control system of the respective LED devices 8. Accordingly, drive currents in different control systems are independently supplied to the divided regional section 12A and divided regional section 12B of each LED device 8 through different paths of the current supply conductor layers 32.

Heat generated in each LED device 8 due to the abovementioned luminescence control is conducted to the current supply conductor layers 32 through the electrodes 21A and 21B of each LED device 8 or unillustrated gold-plated portions for exhaust heat provided on the lower surface of each base 2. Note that the current supply conductor layers 32 should preferably be exposed on the circuit board 31 side with the LED devices 8 mounted thereon, so that lands (not illustrated) to be solder-joined to gold-plated portions for heat conduction to be formed on the lower surface of each base 2 are formed on the current supply conductor layers 32. In this case, the lands should preferably be formed so that the first current supply conductor layer 32A and the second current supply conductor layer 32B do not short-circuit to each other.

The current supply conductor layers 32 are planarly formed from a thermally-conductive material over almost the entire surface of the base material portion 36. Accordingly, heat drawn by the current supply conductor layers 32 from the respective LED devices 8 can be released with the heat spread in the in-plane direction of the circuit board 31 (base material portion 36). That is, locally-concentrated heat in each LED device 8 can be efficiently drawn from the LED device 8, while suitably dispersing the heat in the in-plane direction of the base material portion 36.

Here, the heat dissipation performance of each LED device 8 can be enhanced further with an increase in the area ratio of portions where the current supply conductor layers 32 are formed (hereinafter referred to as "conductor layers' occupied area ratio") to the total surface area of the base material portion 36. This is because it is possible to effectively draw a larger amount of heat from the LED devices 8 with an increase in the conductor layers' occupied area ratio, if the area of the base material portion 36 is the same. Accordingly, in the present practical example, the conductor layers' occupied area ratio is set so that the heat radiation efficiency of the LED devices 8 satisfies a prescribed level. The value of the occupied area ratio should preferably be 70% or higher, and more preferably 80% or higher.

In the light-emitting module 30 of the present practical example, the respective LED devices 8 are disposed circularly and equiangularly on the same circumference of the circuit board 31 with the center O thereof as a central point. In addition, the orientation of each partition 11 with respect to the partition 11 of an LED device 8 adjacent thereto is in a state of being rotated in increments of the predetermined arrangement angle θ in one rotational direction within the plane of the opening 13. In contrast to such a layout pattern of the LED devices 8, in the present practical example, the planar regions of the current supply conductor layers 32 are planarly divided for each control system of a drive current supplied to each LED device 8 using the insulators 33, as illustrated in FIG. 12, so as to be concentrically disposed around the center O (predetermined reference point).

Consequently, the first current supply conductor layer 32A and the second current supply conductor layer 32B are distributed orderly within the plane of the circuit board 31 (base material portion 36), without being scattered. Thus, it is possible to further reduce the number of insulators 33 to be used in order to divide the current supply conductor layers 32 for the respective drive current control systems. Accordingly, it is possible to increase the above-described conductor layers' occupied area ratio as much as possible, thereby contributing to enhancing the heat dissipation performance of the LED devices 8. In addition, the present practical example is also beneficial from the viewpoint of reduction in manufacturing costs since the number of insulators 33 to be used can be reduced as described above. Note that the first current supply conductor layer 32A and the second current supply conductor layer 32B may be concentrically disposed around a reference point other than the central point O.

As can be understood from each figure, the respective external terminal portions 34A, 34B, 35A and 35B (these respective terminal portions, when referred to comprehensively, are referred to as external terminal portions 34) on the circuit board 31 are disposed adjacently to one another. It is thus possible to group respective traces to be connected to an external power supply. Accordingly, this embodiment is one of preferred embodiments also from the viewpoint of improving the degree of freedom in the overall design of the lighting apparatus DL.

As illustrated in FIGS. 11 and 13, the circuit board 31 according to the present practical example is fitted with a heat-radiating housing member 50 for releasing (dissipating) heat drawn from the LED devices 8 into the atmosphere. The heat-radiating housing member 50 is an enclosure for holding the light-emitting module 30. Like the base material portion 36, this heat-radiating housing member 50 is formed using a material superior in thermal conductivity (for example, aluminum). Thus, the heat-radiating housing member 50 also functions as a heat radiation accelerating member to dissipate heat conducted from the base material portion 36 (LED device 8) side into the atmosphere. The heat-radiating housing member 50 is configured by including a radiating fin portion 51 which mainly assumes the role of a heat radiation accelerating member, and a housing portion 52 which assumes the role of an enclosure. The housing portion 52 is formed such that a cylindrical sidewall portion 52B rises from a middle bottom portion 52A having a circular shape toward the opposite side of the radiating fin portion 51. The inner diameter of the cylindrical sidewall portion 52B is substantially the same as the outer diameter of the circuit board 31 (base material portion 36). Thus, a slight clearance is formed between the cylindrical sidewall portion 52B and the outer circumference of the circuit board 31 when the circuit board 31 is attached to the heat-radiating housing member 50.

In the present practical example, the heat-radiating housing member 50 is attached so as to be in thermal contact with a surface of the base material portion 36 on a surface (hereinafter referred to as "non-mounting surface") 36B thereof on which the LED devices 8 are not mounted. Specifically, a thermal interface material (TIM) 38 is located in the interfacial boundary between the non-mounting surface 36B of the base material portion 36 and the middle bottom portion 52A of the heat-radiating housing member 50. In general, the heat-radiating housing member 50 and the base material portion 36 differ in the rate of thermal expansion. Hence, such a material having deformability (followability) as the TIM 38 is located in the interfacial boundary between the base material portion 36 and the heat-radiating housing member 50 to prevent the two members from suffering damage due to a difference in the rate of thermal expansion between the members. In addition, a smooth heat transfer from the base material portion 36 to the heat-radiating housing member 50 can be made by interposing the TIM 38 as described above, even if the surface accuracy (smoothness) of either the heat-radiating housing member 50 or the base material portion 36 is low. Note that the TIM 38 may be arranged so as to fill the slight clearance formed between the cylindrical sidewall portion 52B and the outer circumference of the circuit board 31 (base material portion 36). Consequently, it is possible to further enhance the efficiency of heat transfer between the light-emitting module 30 and the heat-radiating housing member 50.

As described above, heat generated by the LED devices 8 is conducted through the current supply conductor layers 32 and the base material portion 36 of the circuit board 31 of the light-emitting module 30 to the heat-radiating housing member 50. The heat is then released from the radiating fin portion 51 into the atmosphere, thereby accelerating the heat dissipation of the light-emitting module (LED devices 8). According to the circuit board 31, the light-emitting module 30, and the lighting apparatus DL of the present practical example, it is possible to suitably improve the performance of dissipating heat generated in the color-tunable LED devices 8. Consequently, it is possible to prevent luminous efficiency degradation and thermal degradation due to a local temperature rise in the LED devices 8.

Note that the lighting apparatus DL of the present practical example is not limited to any particular types, but may be suitably applied as a downlight (for example, an LED shelf downlight). For example, by embedding and concealing the radiating fin portion 51 of the heat-radiating housing member 50 inside a shelf or a ceiling, it is possible to enhance the heat dissipation performance of the LED devices 8 without causing any aesthetic damage (the housing portion 52 may also be embedded as a matter of course). Also note that the light-emitting module 30, the heat-radiating housing member 50, and the lens 60 can be fixed using various heretofore-known methods. For example, a connecting hole formed in the center of the middle bottom portion 52A of the heat-radiating housing member 50 and a connecting hole formed in the center of the circuit board 31 may be fixed to each other through an unillustrated fixing jig (for example, a screw), as illustrated in FIG. 13. Alternatively, thread grooves may be formed in the outer circumferential surface of the frame of the lens 60 and the inner circumferential surface of the cylindrical sidewall portion 52B of the heat-radiating housing member 50 and these members may be screwed together, thereby mounting the lens 60 on the heat-radiating housing member 50. The functions and specifications of the lens 60 are not limited in particular either. It is possible to adopt, for example, a collecting lens or a diffusing lens.

Modified Examples

Figure 14:
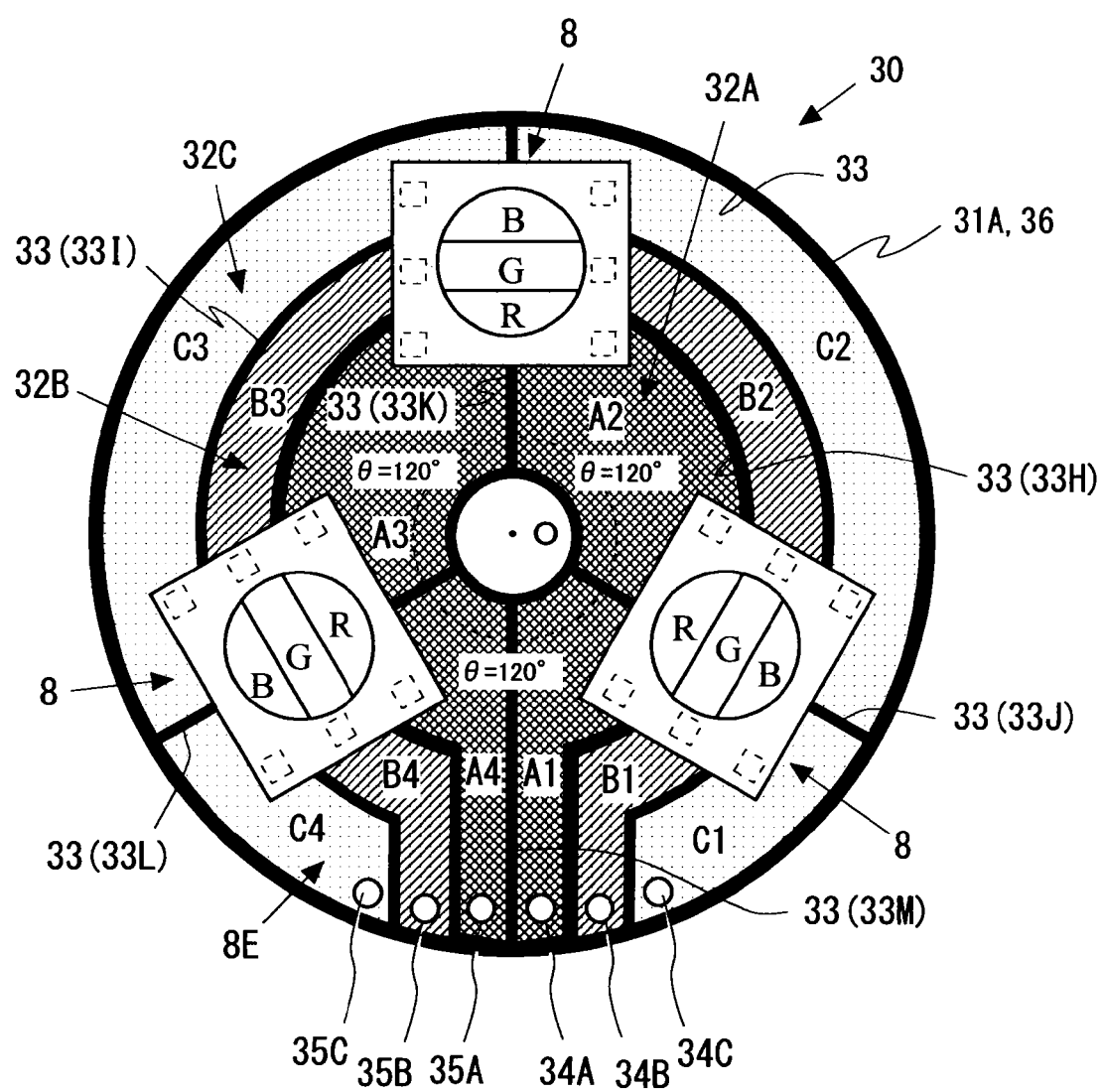
FIG. 14 is a drawing illustrating a state of LED devices being mounted on a circuit board according to a first modified example of Practical Example 1.

Next, a first modified example of the light-emitting module 30 of the present practical example will be described with reference to FIG. 14. FIG. 14 is a drawing illustrating a state in which LED devices 8 are mounted on a circuit board 31A. For ease of understanding the relationship between the LED devices 8 and current supply conductor layer 32, however, FIG. 14 illustrates the current supply conductor layer 32 underlying an insulating resin layer 37 by excluding the insulating resin layer 37 from the illustration for the sake of convenience. In FIG. 14, a description will be made of an example where each LED device 8 in which the interior of a package 1 is divided into three divided regional sections 12A to 12C is mounted on the circuit board 31A. Combinations of semiconductor light-emitting elements and phosphors are adjusted as appropriate, so that output light from the divided regional sections 12A to 12C is, for example, red, green and blue. Thus, white synthetic light is output from the LED devices 8.

In the example illustrated in FIG. 14, three LED devices 8 are arranged on the circuit board 31A. A method for implementing each LED device 8 on the circuit board 31A is the same as has been described heretofore. That is, the three LED devices 8 are equiangularly disposed on the same circumference with the center O of the circuit board 31A as a central point. A predetermined arrangement angle θ formed between adjacent LED devices 8 equals an angle given by dividing 360° by 3 which is the number of LED devices 8, i.e., 120°. Here, reference characters "R", "G" and "B" indicated in each LED device 8 in the figure correspond to the divided regional sections 12A to 12C, respectively. In each LED device 8, the divided regional sections 12A to 12C are disposed in order outward from the center O side of the circuit board 31A in the radial direction thereof.

Also in the present modified example, the current supply conductor layer 32 is planarly divided by insulators 33 for respective drive current control systems corresponding to the respective divided regional sections 12A to 12C, thereby classifying drive current supply paths for the respective control systems. In the present modified example, since the number of control systems of drive currents supplied to the LED elements 3 is 3, the current supply conductor layer 32 are divided by two annular insulating members 33H and 33I (first insulators). Consequently, the first current supply conductor layer 32A through to the third current supply conductor layer 32C are concentrically disposed within the plane of the circuit board 31A with the central point O as a reference.

Four radial insulating members 33J to 33M (second insulators) are radially disposed in the radial direction of the circuit board 31A (base material portion 36). By these radial insulating members 33J to 33M, the first current supply conductor layer 32A is divided into four conductor regions A1 to A4, the second current supply conductor layer 32B is divided into four conductor regions B1 to B4, and the third current supply conductor layer 32C is divided into four conductor regions C1 to C4. Note that reference character 34C included in the conductor region C1 in the figure denotes a positive external terminal portion for externally inputting electrical power to be supplied to LED elements 3 corresponding to the divided regional section 12C of each LED device 8. In addition, reference character 35C included in the conductor region C4 denotes a negative external terminal portion corresponding to the divided regional section 12C of each LED device 8.

As mentioned above, in FIG. 14, a description has been made of an embodiment concerning a modified pattern different in the number of divisions of the interior of the package 1 in each LED device 8, i.e., the number of control systems of drive currents to be supplied to LED elements. Also in such a modified pattern, it is possible to efficiently release heat generated in each LED device 8, in particular, heat generated in each divided regional section 12 in a locally-concentrated manner to the base material portion 36 through the current supply conductor layer 32 planarly formed so as to cover the base material portion 36 of the circuit board 31A. Consequently, the heat dissipation performance of the LED devices 8 is improved, thereby making it possible to suitably prevent luminous efficiency degradation and thermal degradation due to local heat concentration in each LED device 8.

Figure 15:
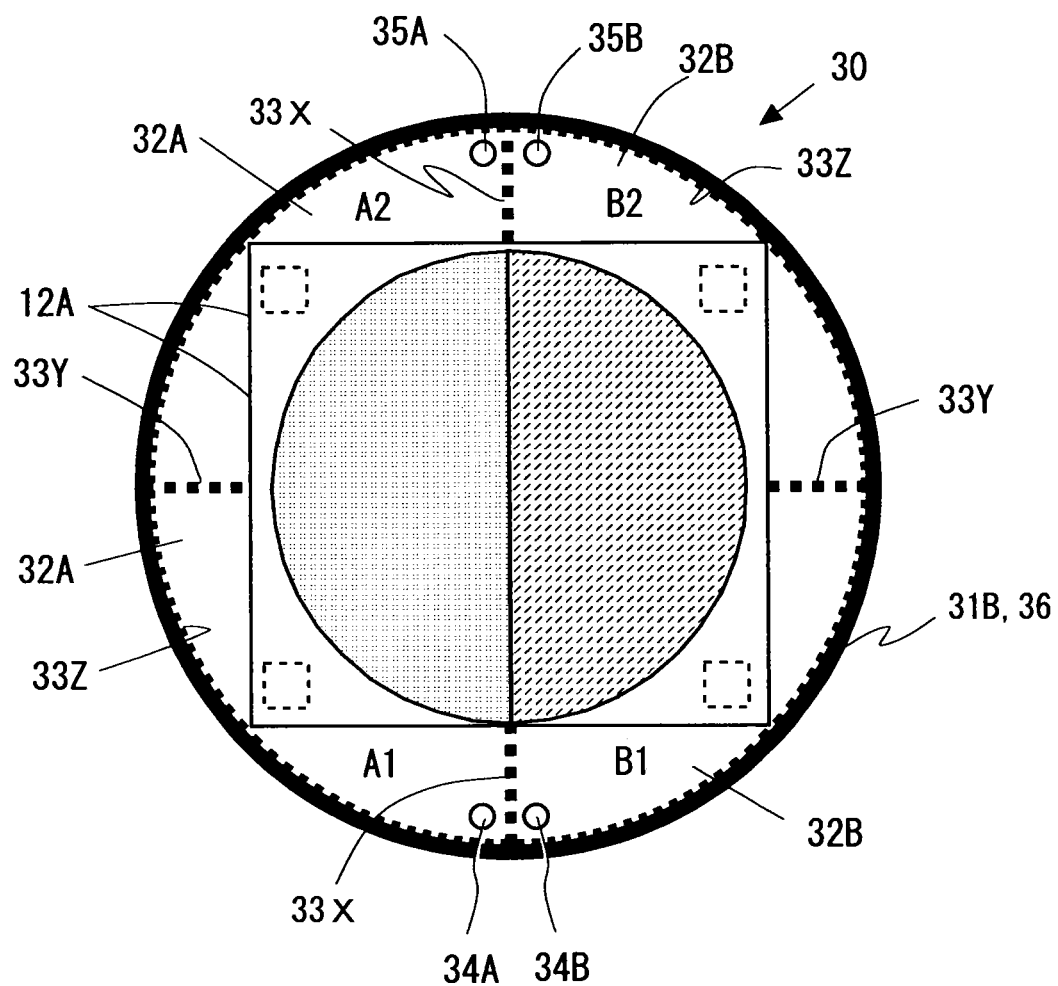
FIG. 15 is a drawing illustrating a state of an LED device being mounted on a circuit board according to a second modified example of Practical Example 1.

Next, a second modified example of the light-emitting module 30 in the present practical example will be described with reference to FIG. 15. In a light-emitting module 30 illustrated in FIG. 15, a single LED device 8, rather than a plurality thereof, is mounted on a circuit board 31B. Like FIG. 14, FIG. 15 is also a drawing illustrating a state in which the LED device 8 is mounted on the circuit board 31B. For ease of understanding the relationship between the LED device 8 and a current supply conductor layer 32, however, FIG. 15 illustrates the current supply conductor layer 32 underlying an insulating resin layer 37 by excluding the insulating resin layer 37 from the illustration for the sake of convenience. In addition, a thick dashed line in the figure represents an insulator used to planarly isolate and divide the current supply conductor layer 32. In the present modified example, the number of LED elements 3A and 3B to be arranged in respective divided regional sections 12A and 12B may be increased in order to sufficiently secure the luminous intensity of light emitted from the light-emitting module 30.

In this figure, the circuit board 31B (base material portion 36) has a circular shape. The basic configuration of the circuit board 31B in the thickness direction thereof (laminating direction) is the same as the basic configuration described in FIG. 11. The current supply conductor layer 32 is planarly formed over almost the entire surface of the base material portion 36, so as to cover the base material portion 36. Reference characters 33X, 33Y and 33Z in the figure denote the already-described insulators. The insulator 33Z is arranged along the outer edge of the base material portion 36. The insulators 33X and 33Y are disposed into an orthogonal crisscross shape, so as to divide the in-plane region of the base material portion 36 into quarters.

The current supply conductor layer 32 is formed in the in-plane direction (planar direction) of the base material portion 36 in regions other than the portions where the above-mentioned insulators 33 are disposed. This current supply conductor layer 32 is divided into a first current supply conductor layer 32A and a second current supply conductor layer 32B by the insulating member 33X. The meanings of these terms have already been explained, and therefore, will not be discussed again here. The first current supply conductor layer 32A corresponds to a control system on the divided regional section 12A side, whereas the second current supply conductor layer 32B corresponds to a control system on the divided regional section 12B side.

The first current supply conductor layer 32A is halved (divided) into conductor regions A1 and A2 by the insulator 33Y, and the second current supply conductor layer 32B is halved (divided) into conductor regions B1 and B2. Note that as in Practical Example 1, the upper portion of the current supply conductor layer 32 is covered with an insulating resin layer 37, except the places of the upper portion where the electrodes 21A and 21B of the LED device 8 are disposed and the places where the external terminal portions 34A, 34B, 35A and 35B are formed, as a result of the insulating resin layer 37 being laminated on the upper portion.

In this configuration, the drive current of a first control system supplied from the positive external terminal portion 34A follows the route of conductor region A1→electrode 21A→divided regional section 12A→electrode 21A→conductor region A2 and reaches the negative external terminal portion 35A. In addition, the drive current of a second control system supplied from the positive external terminal portion 34B follows the route of conductor region B1→electrode 21B→divided regional section 12B→electrode 21B→conductor region B2, and reaches the negative external terminal portion 35B. Consequently, in the LED device 8, independent luminescence control is realized for each drive current control system, i.e., for each of the divided regional sections 12A and 12B. As for the heat dissipation performance of the LED device 8, heat from the LED device 8 is conducted to the current supply conductor layers 32 (32A and 32B), as in the already-described embodiments. Also in this modified example, the heat of the LED device 8 can be efficiently transported to the base material portion 36 since the current supply conductor layers 32 are formed over almost the entire surface of the base material portion 36. Accordingly, the heat dissipation performance of the LED device 8 is improved, thereby making it possible to suitably prevent luminous efficiency degradation, thermal degradation and the like due to local heat concentration in the LED device 8.

In the embodiments described heretofore, examples are cited in which a circuit board (base material portion) has a circular shape. The circuit board is not limited to this shape, however, but various shapes may be adopted for the circuit board as a matter of course. Here, a third modified example of the light-emitting module 30 will be described with reference to FIGS. 16 and 17. Note that in the light-emitting module 30 illustrated in FIG. 16, three LED devices 8 are mounted on a circuit board 31C. As in the layout example described in FIG. 14, the three LED devices 8 are equiangularly disposed on the same circumference of the circuit board 31C (base material portion 316) with the center O thereof as a central point. Thus, the predetermined arrangement angle θ formed between adjacent LED devices 8 is 120°. Note that each LED device 8 is the same as the LED devices 8 described in FIG. 12 and will not therefore be discussed in detail again. Also in the present modified example, the current supply conductor layer 32 is planarly divided within the plane of the base material portion 316 by the insulator 33 into a first current supply conductor layer 32A (cross-hatched) and a second current supply conductor layer 32B (horizontally hatched).

Figure 16:
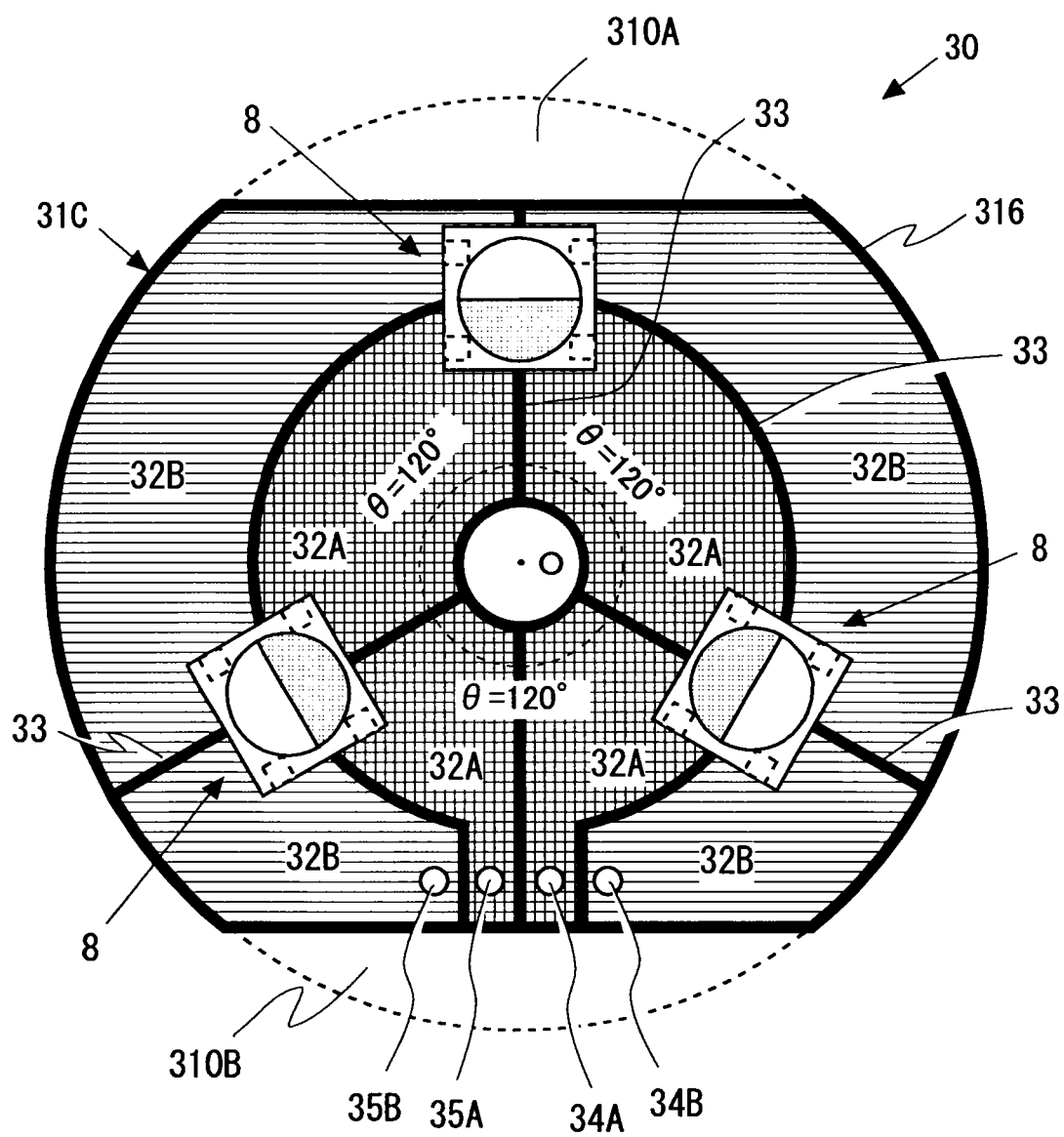
FIG. 16 is a drawing illustrating a state of LED devices being mounted on a circuit board according to a third modified example of Practical Example 1.

As illustrated in FIG. 16, the circuit board 31C (base material portion 316) is formed into a shape in which bow-shaped (segment) cutaway portions (hereinafter referred to as "arched cutout portions") are cut away from a discoid shape (hereinafter referred to as "cutaway circular shape"). Each arched cutout portion is a region surrounded by a circular arc and a string corresponding thereto. In the example illustrated in this figure, a pair of arched cutout portions 310A and 310B (these arched cutout portions, when comprehensively referred to, are referred to as arched cutout portions 310) is arranged in positions symmetrical to each other across the center O (positions displaced 180° from each other around the center O).

Configuring the circuit board 31C (base material portion 316) into a cutaway circular shape as described above is advantageous in the following points. That is, by disposing respective terminal portions 34 of the circuit board 31C in the vicinity of the arched cutout portions 311 adjacently thereto, as illustrated in the figure, the arched cutout portions 311 can be utilized as spaces to insert therethrough wires for connecting an external power supply and the terminal portions 34. These wires are led through the arched cutout portions 311 to the middle bottom portion 52A side of the heat-radiating housing member 50. Through-holes (not illustrated) to let therethrough the wires connected to the respective terminal portions 34 are provided on the middle bottom portion 52A side. The wires are connected to the external power supply (for example, a constant current circuit) by way of these through-holes. By collectively disposing the respective external terminal portions 34 adjacently to each other on the circuit board 31C as described above, it is possible to avoid mutual interference with the LED devices 8 and other electronic components (zener diodes and the like), and effectively utilize limited mounting spaces.

As for the external appearance (design) of the lighting apparatus DL, users generally tend to sensuously and psychologically prefer a circular shape or a polygonal shape close thereto, compared with a shape having acute-angled corners. For example, round-shaped lighting apparatus is lower in stress when viewed, compared with lighting apparatus having an angular shape. Thus, users tend to prefer round-shaped lighting apparatus. In that respect, the circuit board 31C can be suitably attached to the heat-radiating housing member 50 provided with a cylindrical sidewall portion 52 also when the circuit board 31C is formed into a partially cutaway circular shape. Thus, it is possible to provide a lighting apparatus DL having an appearance suited to users' sensuous and psychological preference. In addition, for the abovementioned reason that the lighting apparatus DL having a round appearance is preferred by users, many types of enclosures having a cylindrical shape are in circulation as ready-made products (general-purpose products). On the other hand, as the situation stands, the proportion of the cost of the heat-radiating housing member 50, among the manufacturing costs of the lighting apparatus DL as a whole, is relatively high. In line with such a situation, the circuit board 31C formed into a cutaway circular shape can be easily attached to enclosures widely distributed in the market as general-purpose products. Accordingly, there can be expected an effect of reducing the manufacturing costs of the lighting apparatus DL.

Figure 17:
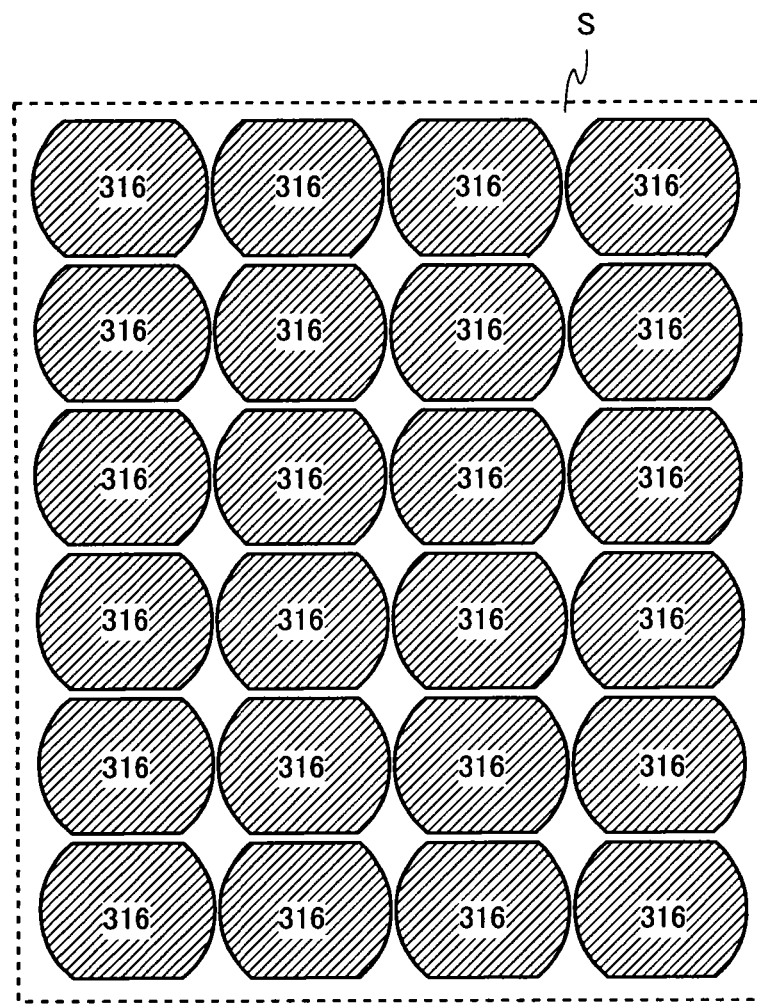
FIG. 17 is an explanatory drawing used to describe a base material portion of the circuit board according to the third modified example of Practical Example 1.

In addition, by forming the circuit board 31C (base material portion 316) into a partially cutaway circular shape, the area of portions to be wasted can be suitably reduced, compared with, for example, a case in which the base material portions 316 are formed into a circular shape when the base material portion 316 is cut out from the raw material (for example, aluminum plate) S thereof (see FIG. 17). Consequently, it is possible to manufacture a larger number of base material portions 316 from the same amount of raw material (for example, an aluminum plate of the same size) S. Thus, it is possible to suitably suppress manufacturing costs required for each piece of the circuit board 31C. While forming the circuit board 31C (base material portion 316) into a partially cutaway circular shape is one of preferred modes, the application of the present invention is not limited to such a mode, however. As a matter of course, the circuit board 31C may be formed into the already-discussed circular shape, polygonal shape, or the like. In addition, the number of arched cutout portions to be provided in a case where the base material portion 316 is formed into a partially cutaway circular shape is not limited in particular. That is, three or more arched cutout portions or a single arched cutout portion may be provided without limitation to the two arched cutout portions illustrated in FIG. 16.

Practical Example 2

Next, a description will be made of Practical Example 2 of the present embodiment. A circuit board 31D of a light-emitting module 30 in Practical Example 2 is the same in basic configuration as the circuit board 31 described in Practical Example 1. In addition, the already-described members will be denoted by like reference numerals and characters, and will not be discussed again here. The circuit board 31D of the present practical example differs from the circuit board of Practical Example 1 in the mode of mounting respective LED devices 8.

Figure 18:
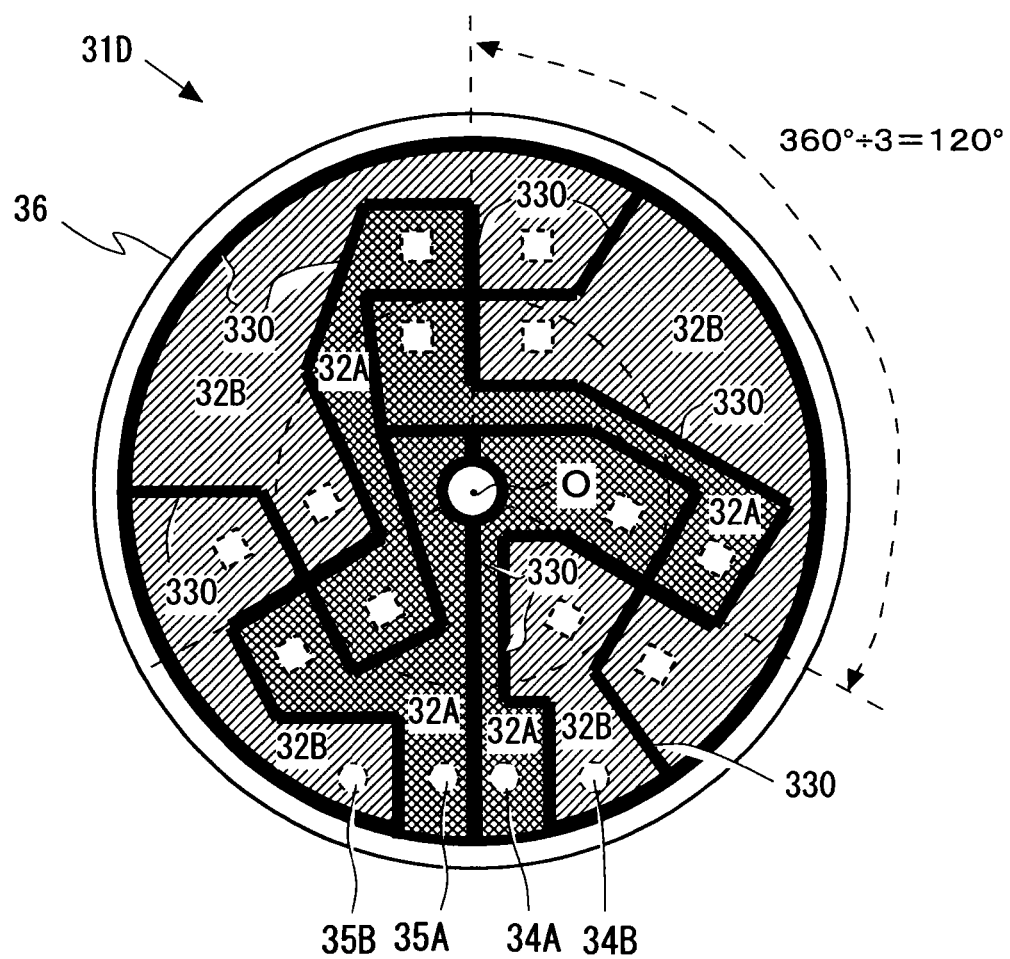
FIG. 18 is a drawing illustrating a current supply conductor layer of a circuit board according to Practical Example 2.
Figure 19:
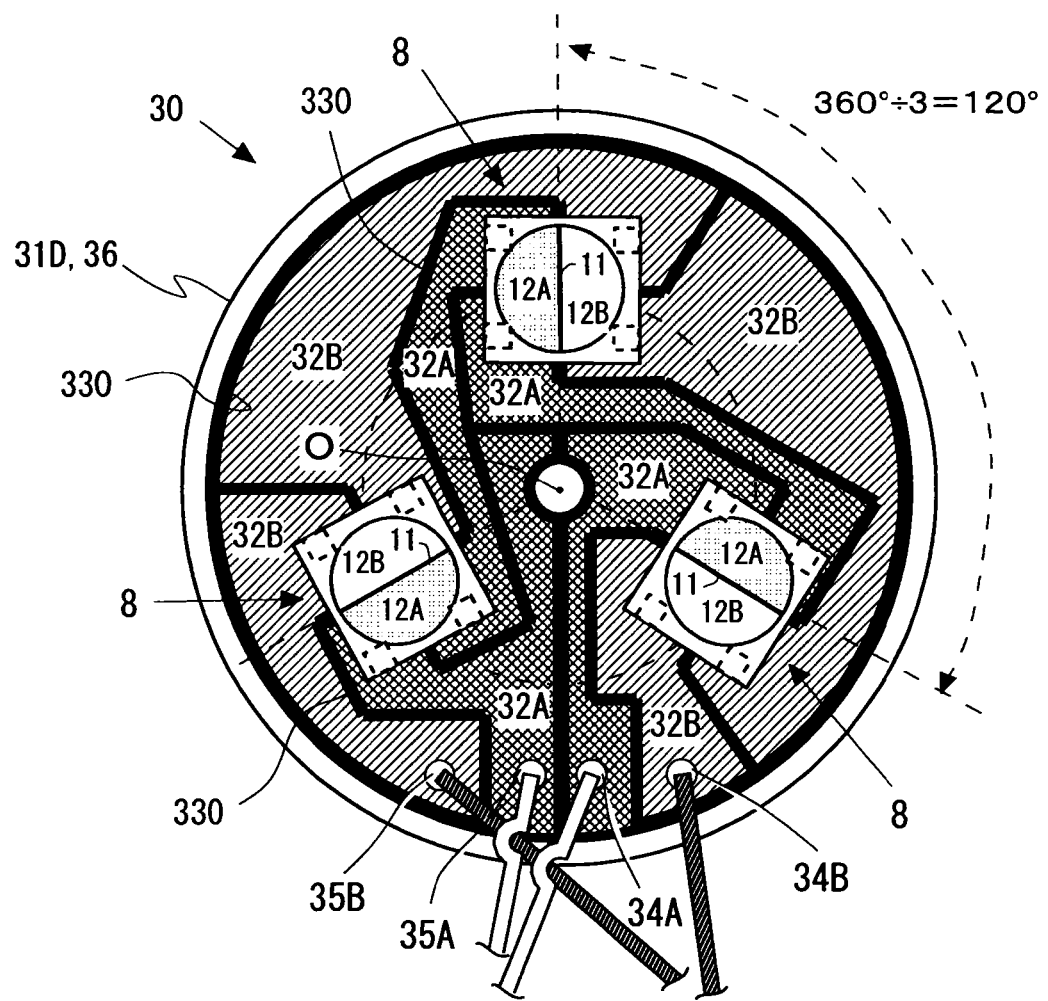
FIG. 19 is a drawing illustrating a state of LED devices being mounted on the circuit board according to Practical Example 2.

FIG. 18 is a drawing illustrating a current supply conductor layer 32 of the circuit board 31D according to Practical Example 2. FIG. 19 is a drawing illustrating a state in which respective LED devices 8 are mounted on the circuit board 31D according to Practical Example 2. Also in the circuit board 31D according to Practical Example 2, an insulating resin layer 36A, a current supply conductor layer 32, and an insulating resin layer are laminated in order on a surface of a base material portion 36, as in the circuit board 31 of Practical Example 1. The planar region of the current supply conductor layer 32 is planarly divided by an insulator 330. In addition, the circuit board 31D and the circuit board 31 of Practical Example 1 are the same in that the respective LED devices 8 are disposed circularly and equiangularly on the same circumference with the center O as a central point. Note that in FIG. 18, portions where external terminal portions are formed and portions to be solder-joined to electrodes formed on the lower surfaces of bases 2 of the LED devices 8 are indicated by virtual lines.

In FIG. 19, three pieces (three units) of LED devices 8 are mounted on the circuit board 31D. In addition, the respective LED devices 8 are equiangularly disposed on the same circumference with the center O as a central point, so that the predetermined arrangement angle θ formed between adjacent LED devices 8 equals 120° given by dividing the angle 360° around the center O by 3 which is the number of LED devices 8. For ease of understanding the relationship between the LED devices 8 and the current supply conductor layer 32, a pattern of the current supply conductor layer 32 is indicated in FIG. 19, as in, for example, FIG. 14, by seeing through the insulating resin layer 37 for the sake of convenience. That is, FIG. 19 illustrates, for the sake of convenience, the current supply conductor layer 32 and the insulator 330 the upper surfaces of which are covered with the insulating resin layer 37.

Also in the circuit board 31D according to the present practical example, the current supply conductor layer 32 is formed so as to cover almost the entire surface of the base material portion 36. In addition, this current supply conductor layer 32 is planarly divided by the insulator 330 (thick solid line in the figure) into a first current supply conductor layer 32A (cross-hatched in the figure) corresponding to the divided regional section 12A and a second current supply conductor layer 32B (diagonally hatched in the figure) corresponding to the divided regional section 12B. The insulator 330 has the same functions as those of the insulating member 33 described in Practical Example 1.

The present practical example differs from Practical Example 1 in that in the circuit board 31D of the present practical example, a partition 11 which divides off the divided regional section 12A and divided regional section 12B of each LED device 8 is arranged so as to extend along the radial direction of the circuit board 31D (base material portion 36). As described above, in the present practical example, the partition 11 which divides the divided regional sections 12A and 12B of each LED device 8 from each other is arranged along the radial direction of the circuit board 31D, rather than along the circumferential direction thereof. For this reason, the present practical example does not adopt any methods for concentrically arranging the first current supply conductor layer 32A and the second current supply conductor layer 32B. The layout pattern of the respective LED devices 8 in the circuit board 31D is approximately equivalent to a state of the layout pattern in the circuit board 31 according to Practical Example 1 being rotated just about 90°. The insulator 330 in the vicinity of each LED device 8 has an approximately fylfot (swastika) shape, as illustrated in the figure.

In Practical Example 2, the relative positional relationship of the divided regional sections 12A and the divided regional sections 12B with the partitions 11 is standardized in the respective LED devices 8, in order to more orderly divide the first current supply conductor layers 32A and the second current supply conductor layers 32B. In the example illustrated in FIG. 19, each divided regional section 12B is located on the clockwise traveling direction side and each divided regional section 12A is located on the opposite side of each divided regional section 12B across the partition 11, when each LED device 8 is viewed from the center O side. The positional relationship in arrangement between these divided regional sections 12A and 12B may be reversed, however. Consequently, the current supply conductor layer 32 can be orderly divided into the first current supply conductor layers 32A and the second current supply conductor layers 32B. Thus, it is possible to achieve the effective utilization of the mounting space of the circuit board 31D, thus allowing for the compact design of the light-emitting module 30.

As mentioned above, in the circuit board 31D of the light-emitting module 30 in Practical Example 2, each LED device 8 can be arranged so that the boundary portion (i.e., the partition 11) between the divided regional section 12A and the divided regional section 12B of each LED device 8 extends along the radial direction of the circuit board 31D. According to such a layout pattern, light emitted from the divided regional section 12A and the divided regional section 12B of each LED device 8 becomes easier to be mixed, compared with light emitted in Practical Example 1. Thus, it is possible to more effectively suppress color unevenness. Accordingly, there is provided a more favorable state of a color mixture of luminescence by the light-emitting module 30. In addition, since the current supply conductor layer 32 is planarly formed also in the present practical example, the present practical example can exert the effect of effectively accelerating the heat dissipation of the light-emitting module 30 as Practical Example 1.

Figure 20:
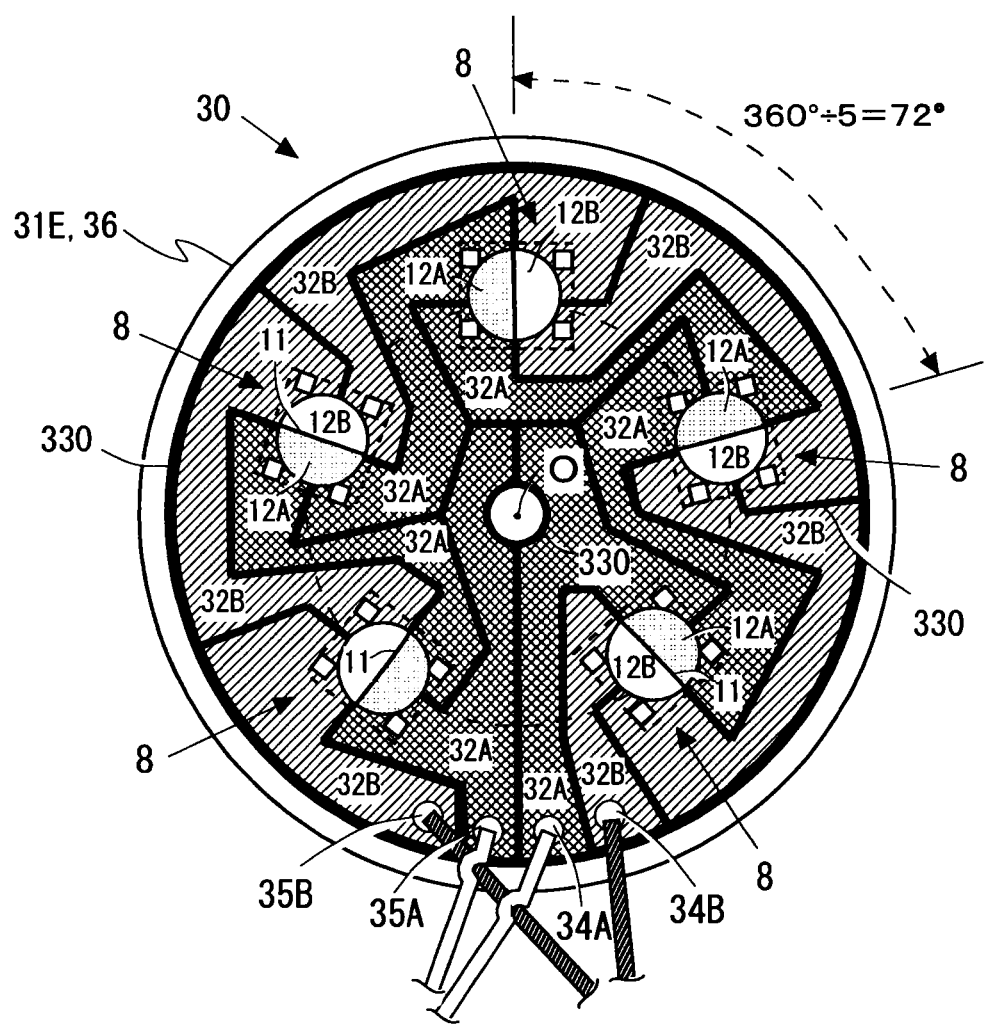
FIG. 20 is a drawing illustrating a state of LED devices being mounted on a circuit board according to a first modified example of Practical Example 2.
Figure 21:
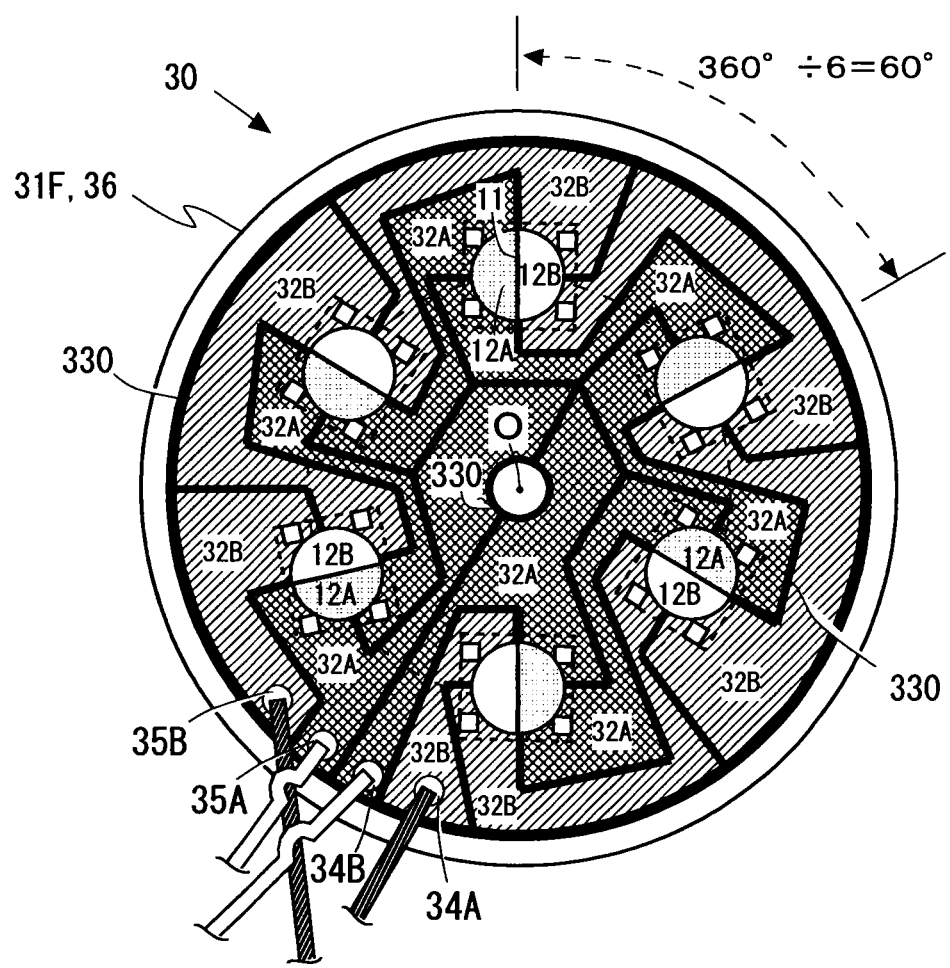
FIG. 21 is a drawing illustrating a state of LED devices being mounted on a circuit board according to a second modified example of Practical Example 2.
Figure 22:
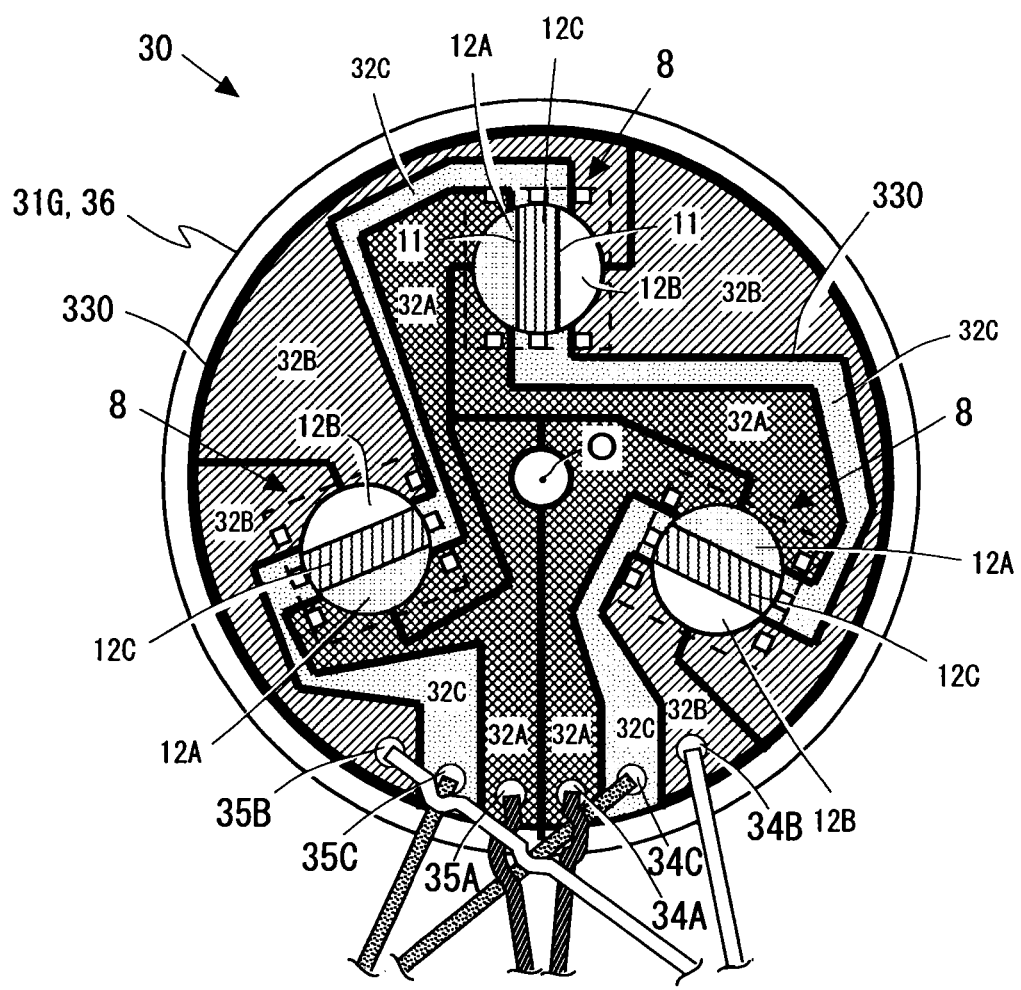
FIG. 22 is a drawing illustrating a state of LED devices being mounted on a circuit board according to a third modified example of Practical Example 2.

Hereinafter, a description will be made of variations in the circuit board of Practical Example 2. FIGS. 20 to 22 are drawings illustrating states in which respective LED devices 8 are mounted on the circuit boards according to the first to third modified examples of Practical Example 2. FIGS. 20 and 21 differ from FIG. 19 basically only in the number of LED devices 8 mounted on the circuit board 31D. As FIG. 19, these figures also illustrate patterns of portions of current supply conductor layers 32, which are otherwise covered with an insulating resin layer 37, by seeing through the insulating resin layer 37 for the sake of convenience.

In FIG. 20, five pieces (five units) of LED devices 8 are mounted on a circuit board 31E. In this case, the respective LED devices 8 are equiangularly disposed on the same circumference with the center O as a central point, so that the predetermined arrangement angle θ formed between adjacent LED devices 8 equals 72° given by dividing the angle 360° around the center O by 5 which is the number of LED devices 8. The rest of the configuration of the circuit board is basically the same as the configuration example illustrated in FIG. 19. Thus, the circuit board 31E can exert the same advantageous effect as described by referring to FIG. 19.

In the configuration example illustrated in FIG. 21, six pieces (six units) of LED devices 8 are mounted on a circuit board 31F. In this case, the respective LED devices 8 are equiangularly disposed on the same circumference with the center O as a central point, so that the predetermined arrangement angle θ formed between adjacent LED devices 8 equals 60° given by dividing the angle 360° around the center O by 6 which is the number of LED devices 8. The rest of the configuration of the circuit board is basically the same as the configuration examples illustrated in FIGS. 19 and 20. Thus, the circuit board 31F can exert the same advantageous effect as discussed in these configuration examples.

A light-emitting module 30 illustrated in FIG. 22 is such that the interior of the reflector of each LED device 8 is planarly divided by insulators 330 into three divided regional sections 12A to 12C. Accordingly, the current supply conductor layer 32 of a circuit board 31G is divided into three regions, i.e., a first current supply conductor layer 32A (cross-hatched in the figure), a second current supply conductor layer 32B (diagonally hatched in the figure), and a third current supply conductor layer 32C (dot-hatched in the figure) corresponding respectively to divided regional sections 12A to 12C.

Partitions 11 which divides off the respective divided regional sections 12A to 12C are disposed along the radial direction of the circuit board 31G in the same way as in FIGS. 19 to 21, thereby forming the respective divided regional sections 12A to 12C along the radial direction. Accordingly, light from the respective divided regional sections of the LED devices 8 becomes easy to be synthesized, as in the other configuration examples illustrated in FIGS. 19 to 21. Thus, it is possible to favorably mix the colors of these rays of light. In addition, the circuit board 31G has the same effect of being able to efficiently cool the respective LED devices 8 in the same way as in the heretofore-described configuration examples.

Practical Example 3

Next, a description will be made of a light-emitting module 30 according to Practical Example 3 in the present embodiment. In Practical Example 3, an LED device differs in configuration from those heretofore described. Accordingly, the light-emitting module 30 will be described here with a focus on the feature points of the LED device. FIG. 23 is an explanatory view used to describe the schematic configuration of an LED device 80 according to Practical Example 3. Constituent elements the same as those of the LED device 8 according to Practical Example 1 will be denoted by like reference numerals and characters and will not be discussed in detail here.

Figure 23A:
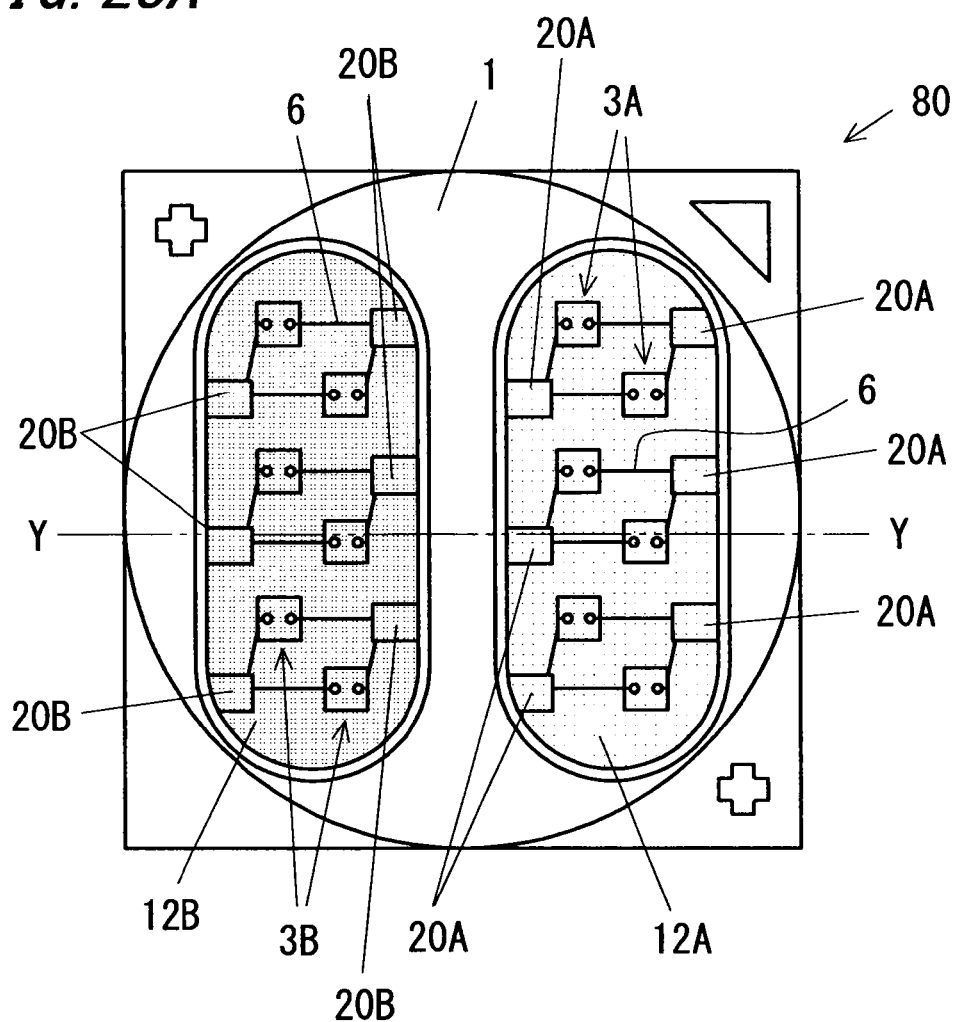
FIG. 23A is a schematic configuration diagram of an LED device according to Practical Example 3.
Figure 23B:
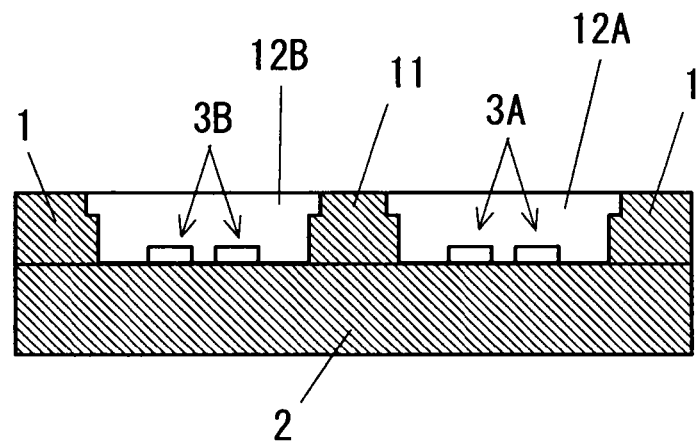
FIG. 23B is a Y-Y cross-sectional view in FIG. 23A.

FIG. 23A is a drawing illustrating a state of LED elements 3 of the LED device 80 being implemented. FIG. 23A illustrates the upper surface of the LED device 80, whereas FIG. 23B depicts the Y-Y cross section of FIG. 23A. A partition 11 is vertically built on a base 2 (base member) inside a package 1. Thus, the interior of the package 1 is divided by this partition 11 into a divided regional section 12A and a divided regional section 12B. The base 2 is made from, for example, alumina ceramics, but is not limited thereto.

Figure 24A:
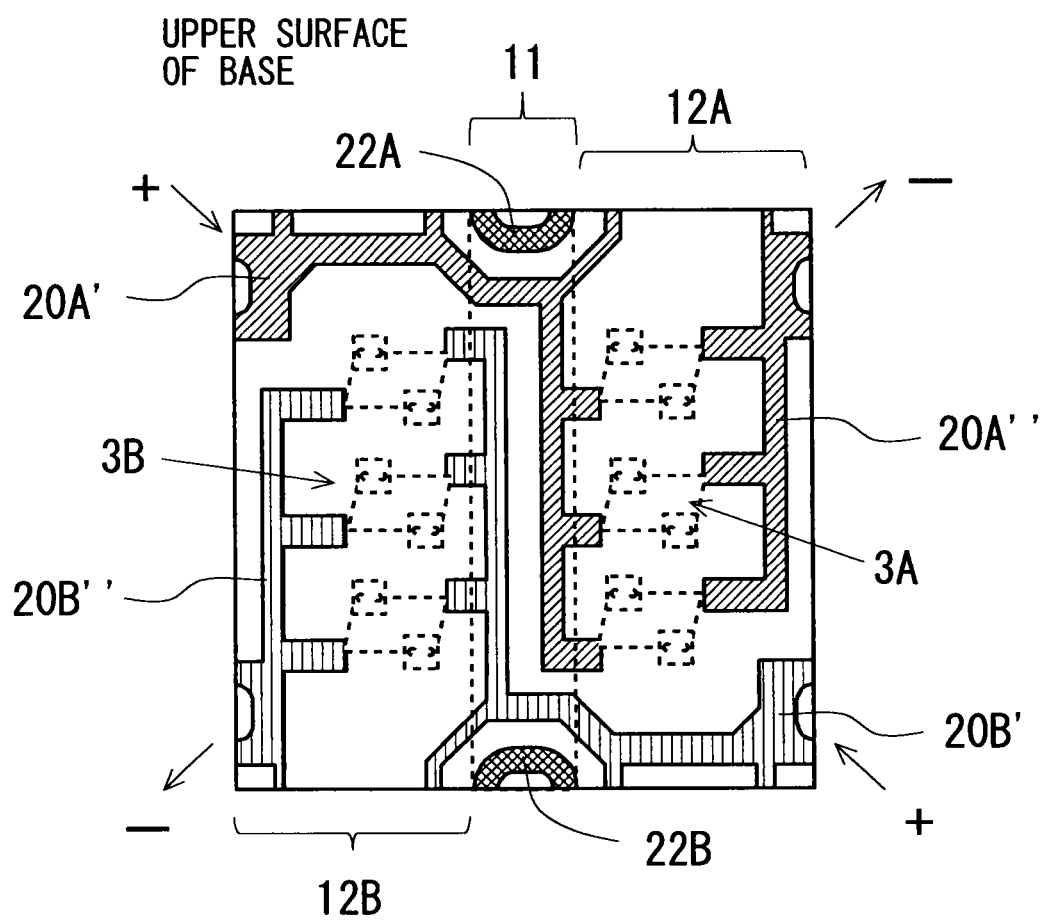
FIG. 24A is a top view of a base of the LED device according to Practical Example 3.
Figure 24B:
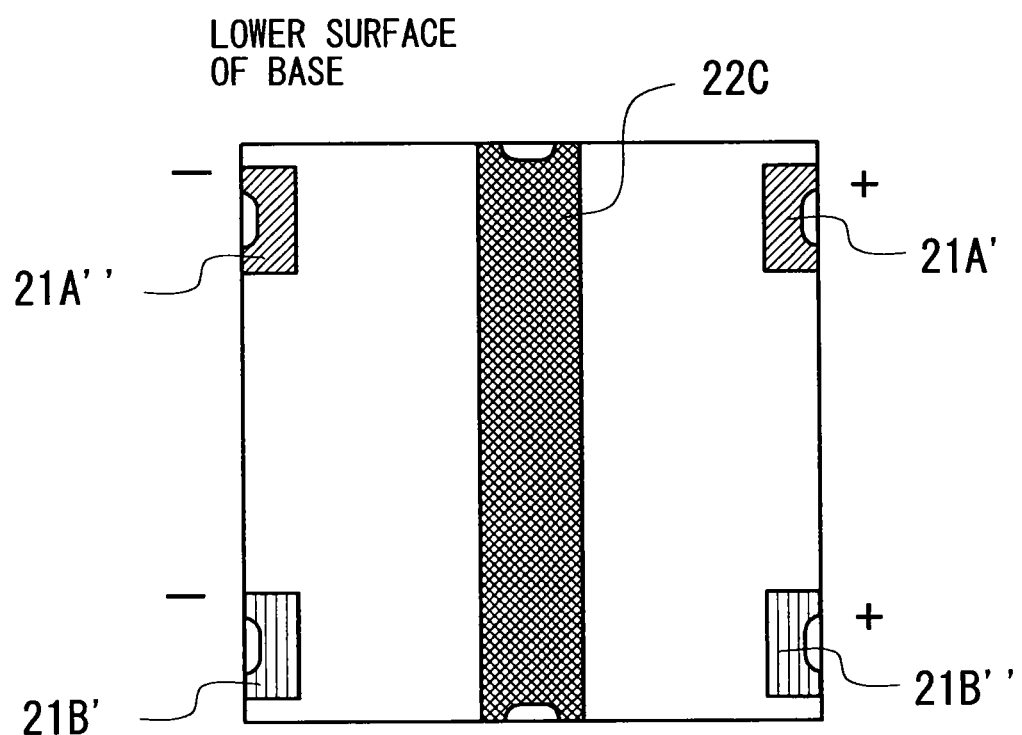
FIG. 24B is a bottom view of the base of the LED device according to Practical Example 3.

FIG. 24A is a top view (front surface view) of the base 2 of the LED device 80 according to Practical Example 3, whereas FIG. 24B is a bottom view (rear surface view) of the base 2. The hatched areas of the two figures are gold-plated. As illustrated in FIGS. 23A and 24A, LED elements 3A and 3B having a different drive current control system are arranged in the divided regional section 12A and the divided regional section 12B, respectively. The LED elements 3A corresponding to the divided regional section 12A are connected to traces 20A' and 20A" through wires 6. The LED elements 3B corresponding to the divided regional section 12B are connected to traces 20B' and 20B" also through metal wires 6. In this way, six LED elements 3A are connected in parallel to the divided regional section 12A, and six LED elements 3B are connected in parallel to the divided regional section 12B.

Reference characters 21A', 21A", 21B' and 21B" indicated in FIG. 24B denote electrodes used to supply drive currents provided through a current supply conductor layer 32 to the LED elements 3. The electrode 21A' is connected to the trace 20A' through a gold-plated portion formed on a side surface of the base 2. In addition, the electrode 21A" is connected to the trace 20A" through a gold-plated portion formed on a side surface of the base 2. Likewise, the electrode 21B' is connected to the trace 20B' through a gold-plated portion formed on a side surface of the base 2. In addition, the electrode 21B" is connected to the trace 20B" through a gold-plated portion formed on a side surface of the base 2.

Here, assume, for example, that a drive current of a first control system associated with the divided regional section 12A comes into the electrode 21A' (21A") from the first current supply conductor layer 32A. Then, the drive current flows through the trace 20A' (20A"), the LED elements 3A, and the trace 20A" (20A') in order, and goes out from the electrode 21A" (21A'). Likewise, assume, for example, that a drive current of a second control system associated with the divided regional section 12B comes into the electrode 21B' (21B") from the second current supply conductor layer 32B. Then, the drive current flows through the trace 20B' (20B"), the LED elements 3B, and the trace 20B" (20B') in order, and goes out from the electrode 21B" (21B').

Note that, for example, the electrodes 21A' and 21A" are solder-joined to the second current supply conductor layer 32A, and the electrodes 21B' and 21B" are solder-joined to the second current supply conductor layer 32B. Joining methods are not limited to this method, however. Plated portions 22A and 22B are formed on the upper surface of the base 2, and a plated portion 22C is formed on the lower surface of the base 2 (all of the plated portions are represented by cross-hatching). The plated portions 22A and 22B are connected to the plated portion 22C through gold-plated portions formed on side surfaces of the base 2 and, thereby, heat generated by the LED elements 3 transmits to the plated portion 22C. This plated portion 22C can be used to, for example, fix the LED device 80 onto the circuit board 31 by solder-joining the plated portion 22C to lands (not illustrated) formed on the circuit board 31 side. In addition to the above-described usage, the plated portion 22C can be used to release heat generated by the LED device 8 to the circuit board 31 side.

As mentioned above, in the LED device 80 of Practical Example 3, a pair of the electrodes 21A' and 21A" corresponding to the LED elements 3A is disposed in regions opposite to each other across the partition 11 within the planar region of the base 2. Thus, the trace 20A (20A' and 20A") for supplying a drive current to the LED elements 3A is arranged so as to intersect with the partition 11. Likewise, a pair of the electrodes 21B' and 21B" corresponding to the LED elements 3B is disposed in regions opposite to each other across the partition 11 within the planar region of the base 2. Thus, the trace 20B (20B' and 20B") for supplying a drive current to the LED elements 3B is arranged so as to intersect with the partition 11.

Figure 25:
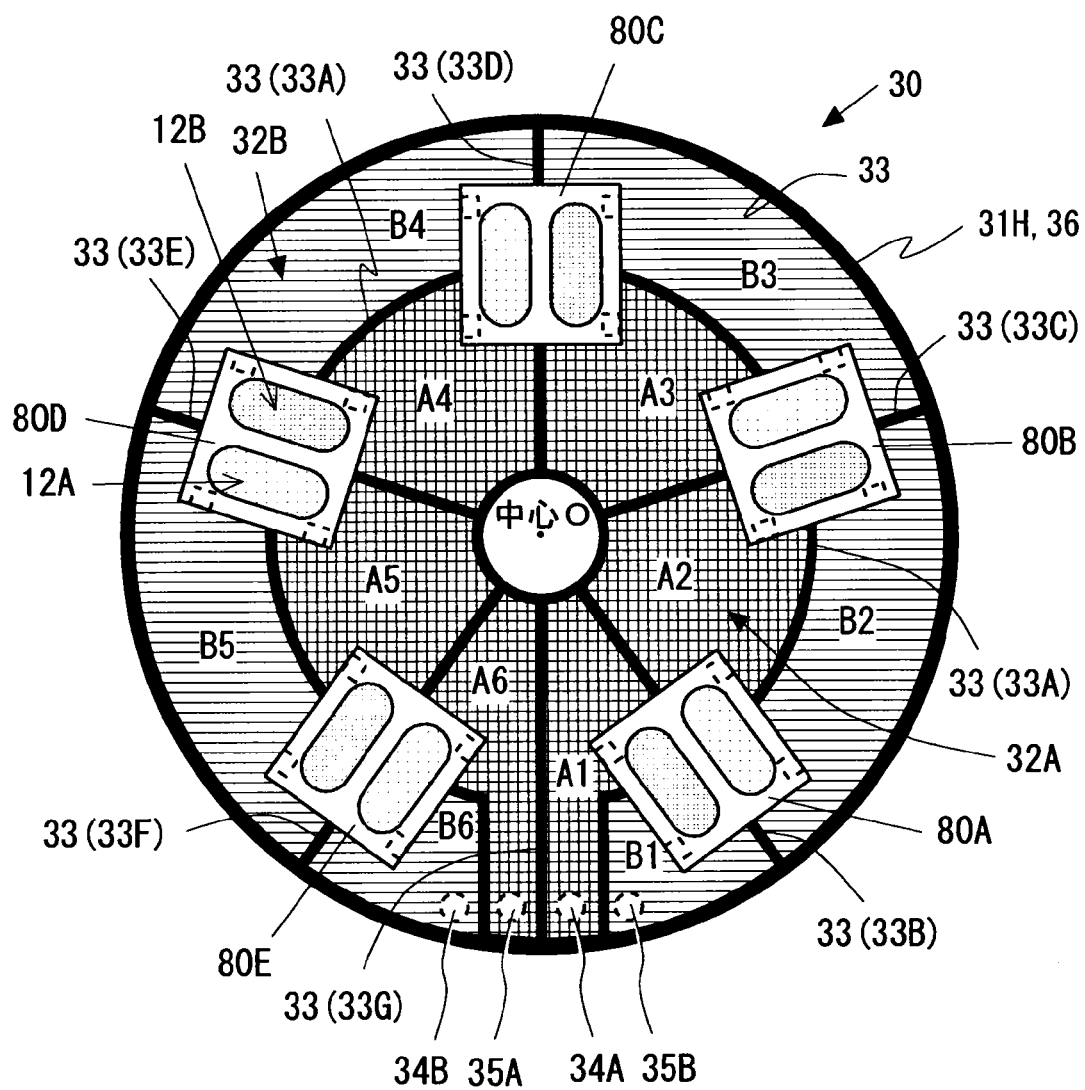
FIG. 25 is a drawing illustrating a state of LED devices being mounted on the circuit board according to Practical Example 3.

FIG. 25 is a drawing illustrating a state of LED devices 80 according to Practical Example 3 being mounted on a circuit board 31H. The circuit board 31H illustrated in the figure is the same as the circuit board 31 illustrated in FIGS. 10 to 12 in Practical Example 1. In addition, also in FIG. 25, the insulating resin layer 37 laminated on the upper portion of the current supply conductor layer 32 is excluded from the illustration for the sake of convenience, so as to make understandable the layout pattern of the current supply conductor layer 32 underlying the insulating resin layer 37.

As is understood from the figure, the first current supply conductor layer 32A and the second current supply conductor layer 32B are divided from each other by an annular insulator 33A (first insulator) which is a substantially circularly-formed insulator. The first current supply conductor layer 32A is further divided into conductor regions A1 to A6 and the second current supply conductor layer 32B is further divided into conductor regions B1 to B6 by radial insulators 33B to 33G (second insulators) radially formed in the radial direction of the circuit board 31H.

Here, the LED devices 80 according to the present practical example are specified as LED devices 80A to 80E in order from the one closest to a positive external terminal portion 34A. In each of the LED devices 80A to 80E, a drive current of a first control system to be supplied to LED elements 3A in each LED device 80 flows from the positive external terminal portion 34A to follow the routes of A1→divided regional section 12A of LED device 80A→A2→divided regional section 12A of LED device 80B→A3→divided regional section 12A of LED device 80C→A4→divided regional section 12A of LED device 80D→A5→divided regional section 12A of LED device 80E→A6, and reaches the negative external terminal portion 35A. Likewise, a drive current of a second control system to be supplied to LED elements 3B in each LED device 80 flows from the positive external terminal portion 34B to follow the routes of 36→divided regional section 12B of LED device 80E→B5→divided regional section 12B of LED device 80D→B4→divided regional section 12B of LED device 80C→B3→divided regional section 12B of LED device 80B→B2→divided regional section 12B of LED device 80A→B1, and reaches the negative external terminal portion 35B. In this way, drive currents in different control systems are independently supplied to the divided regional section 12A and divided regional section 12B of each LED device 80 through different paths of the current supply conductor layers 32. As a result, independent control can be realized in each LED device 80 for each control system of a drive current to be supplied to the LED elements 3 of the LED device 80.

Here, in the light-emitting module 30 of the present practical example, the partitions 11 of the packages 1 are radially disposed along the radial direction of the circuit board 31H, in order to more suitably reduce the color unevenness of the LED devices 80. In each LED device 80 according to Practical Example 3, the traces 20 for supplying drive currents to the LED elements 3 are arranged so as to cross (intersect with) the respective partitions 11, as described above. Accordingly, the insulator for planarly dividing the current supply conductor layer 32 needs not be formed into such a complicated shape as a fylfot shape, as in Practical Example 2. That is, the light-emitting module 30 according to Practical Example 3 solves the problem of eliminating the color unevenness of a tunable LED device capable of color tuning and, at the same time, allows the current supply conductor layer 32 to be orderly divided on a plane of the circuit board 31H. Consequently, it is possible to suppress the quantity of insulators to be used to divide the current supply conductor layer 32, thereby contributing to cost reductions.

Practical Example 4

Figure 26:
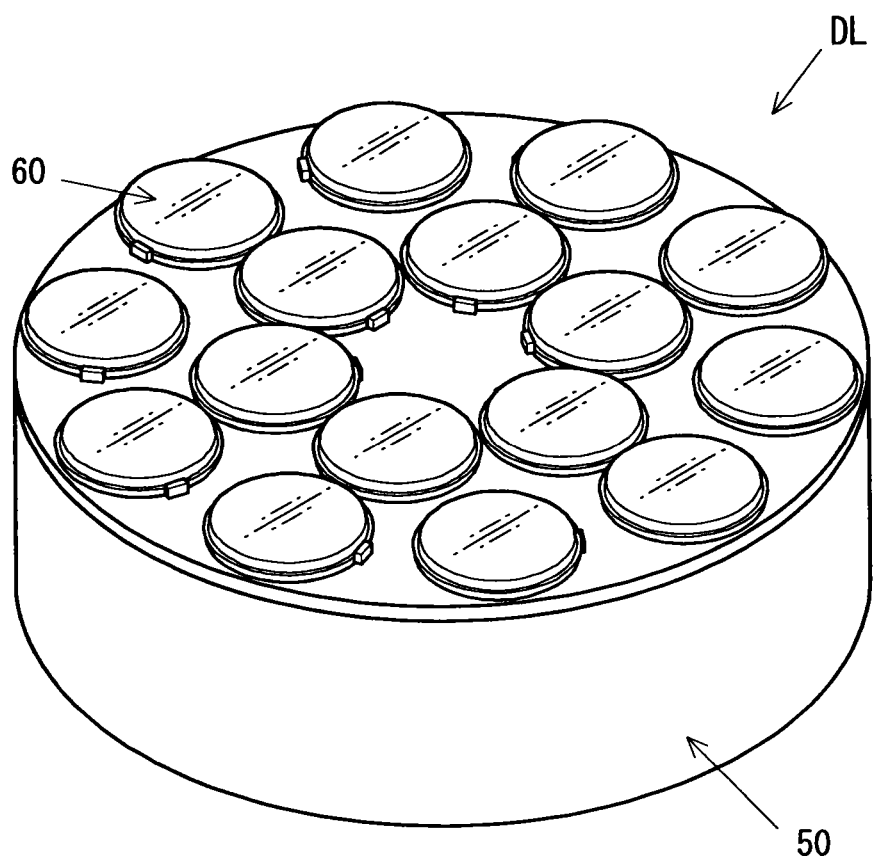
FIG. 26 is a perspective view of a lighting apparatus according to Practical Example 4.
Figure 27:
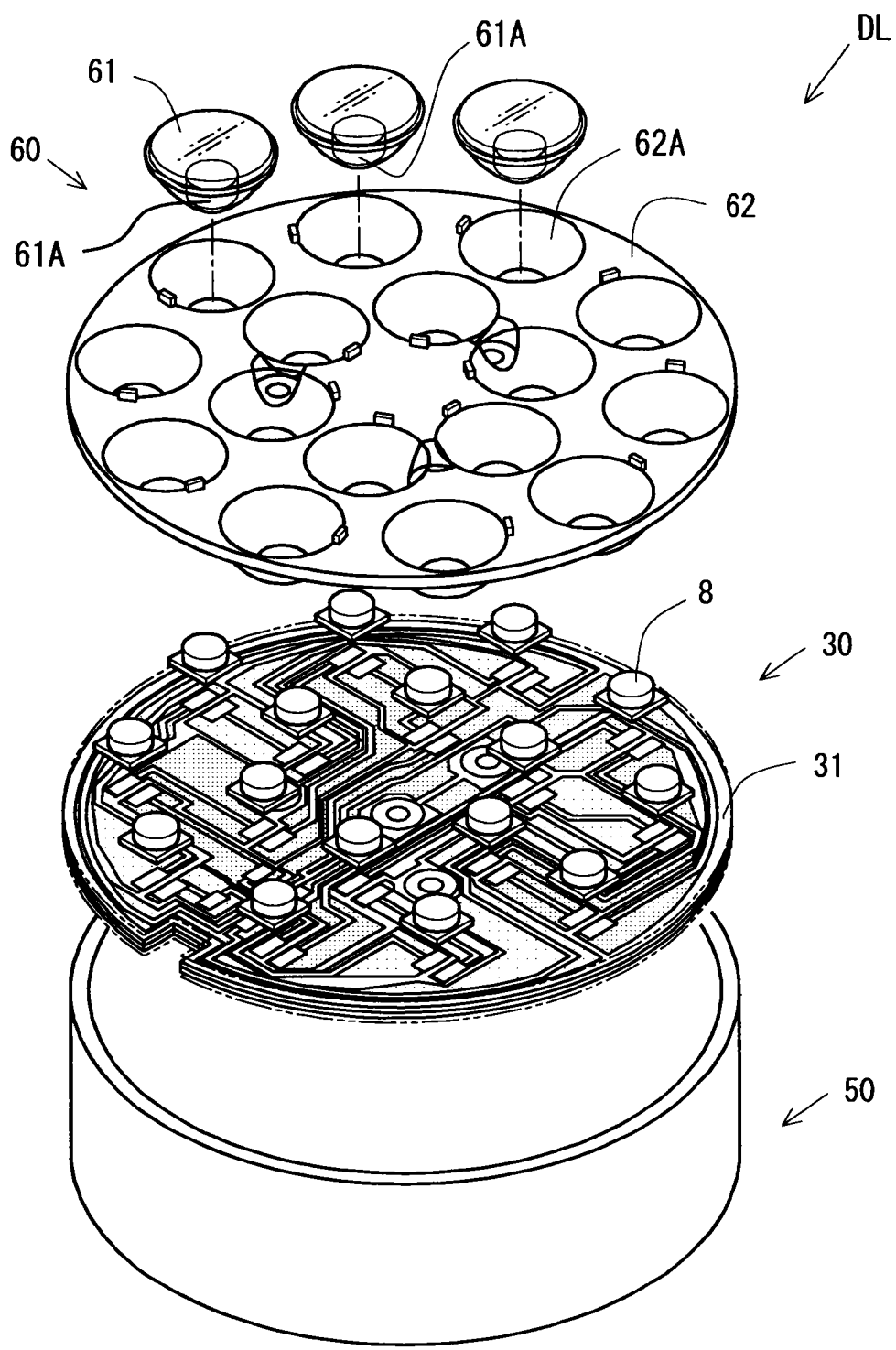
FIG. 27 is an exploded perspective view of the lighting apparatus according to Practical Example 4.

Next, a description will be made of Practical Example 4 in the present embodiment. FIG. 26 is a perspective view of a lighting apparatus DL according to Practical Example 4, whereas FIG. 27 is an exploded perspective view of the lighting apparatus DL. The lighting apparatus DL is configured by including a light-emitting module 30, a heat-radiating housing member 50, and a lens unit 60. The lens unit 60 is provided with lenses 61, a lens holder 62, and the like.

Each lens 61 includes a housing portion 61A capable of housing the package 1 of each LED device 8. The lens holder 62 includes holder portions 62A which are concave portions for housing the lenses 61. A heat-radiating housing member 50, which is the same as the one discussed in Practical Example 1 and is illustrated in a simplified manner here, includes a radiating fin portion 51 for accelerating the dissipation of heat transmitted from the light-emitting module 30 side.

Figure 28:
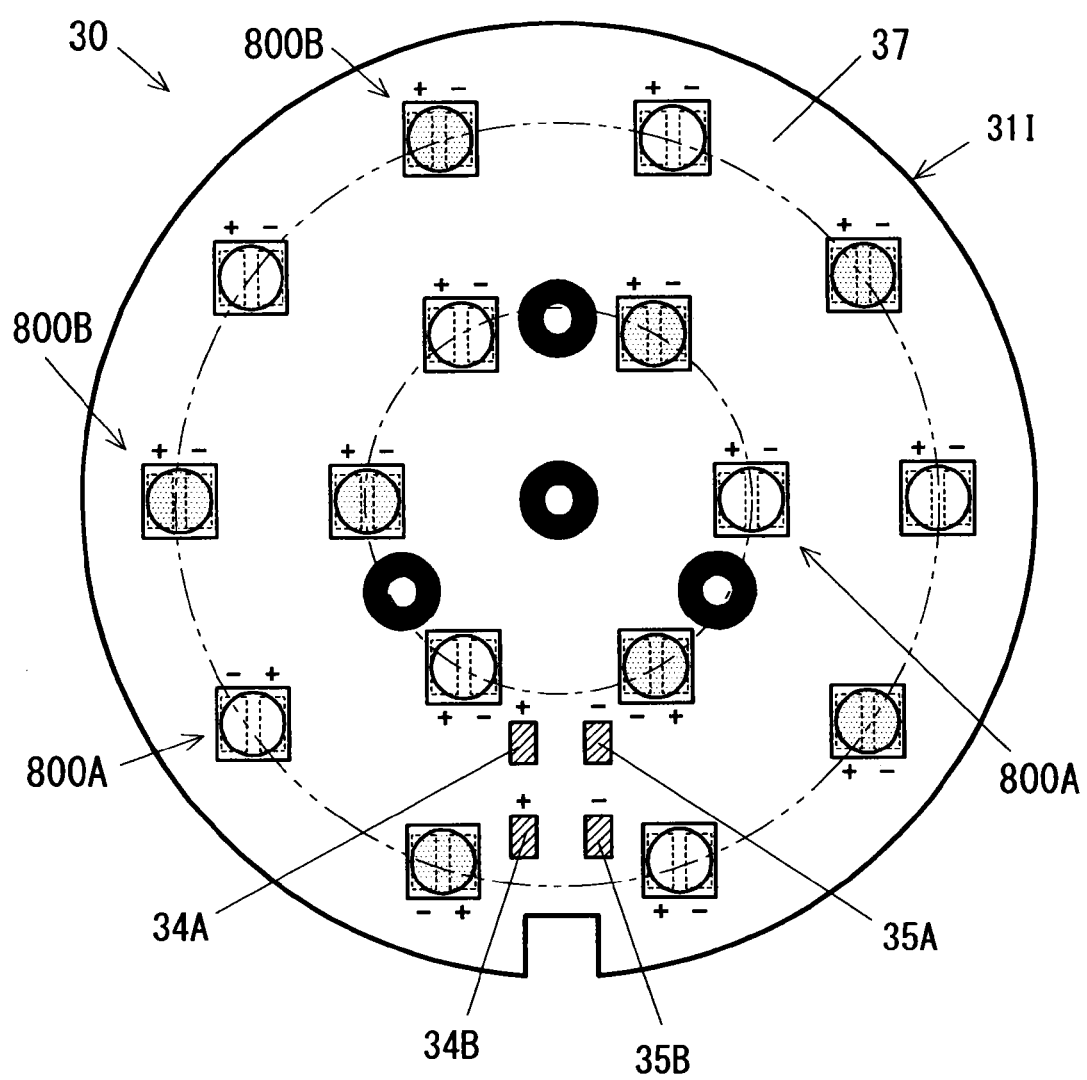
FIG. 28 is a drawing illustrating an upper surface of a light-emitting module according to Practical Example 4.
Figure 29:
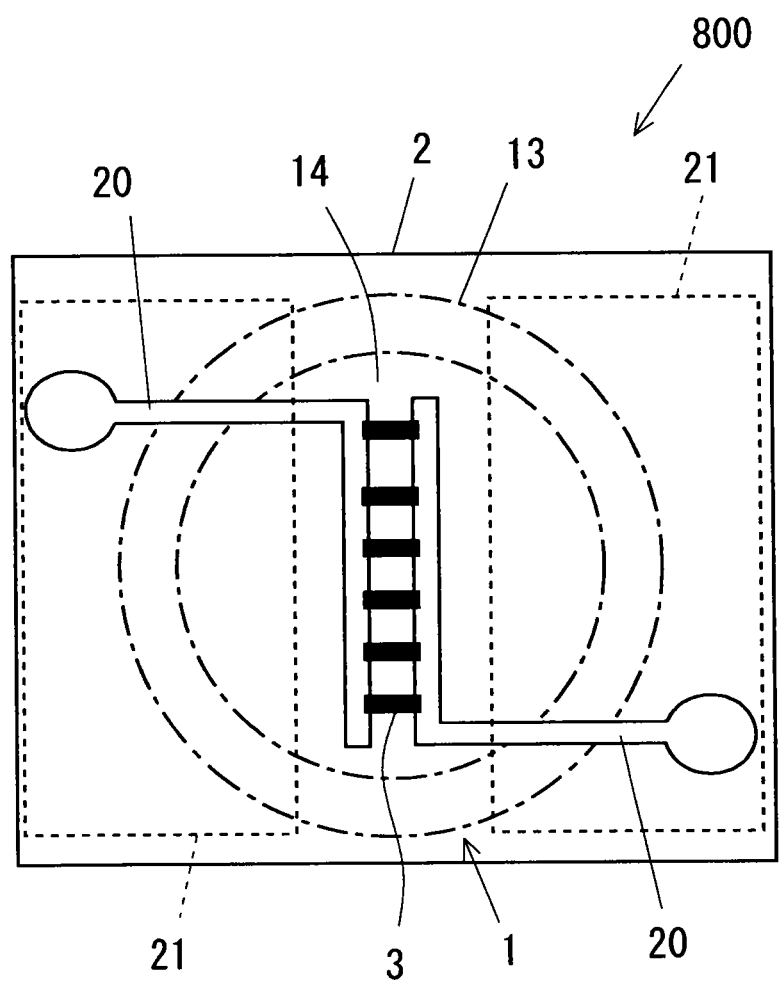
FIG. 29 is a schematic configuration diagram of an LED device according to Practical Example 4.

Next, a description will be made of the light-emitting module 30 according to Practical Example 4. FIG. 28 is a drawing illustrating a state of LED devices being mounted on a circuit board according to Practical Example 4. As illustrated in the figure, a plurality of LED devices 800 is mounted on a circuit board 31I. FIG. 29 is a schematic configuration diagram of each LED device 800 according to Practical Example 4. No partitions are arranged in a package 1A formed on a base 2 of each LED device 800. The package 1 is provided with a fluorescent portion 14 including an opening 13 located in the outgoing direction of light emitted by the LED device 800, and a translucent material for sealing up phosphors and this opening 13. Six LED elements 3 are housed inside the package 1 and connected in parallel to traces 20.

In FIG. 28, reference character 800A denotes "first LED device," and reference character 800B denotes "second LED device." In the first LED devices 800A and the second LED devices 800B, the types of phosphors to be used and the like are adjusted, so that spectrums of output light emitted from the fluorescent portion 14 differ from each other. The light-emitting module 30 according to the present practical example has the characteristic of being provided with plural types of LED devices different in output light spectrum from each other as described above. The light-emitting module 30 also has the characteristic that as will be described later, drive currents in different control systems are supplied to the fluorescent portions 14 of the LED devices different in output light spectrum through different paths of the power supply conductor layers of the circuit board supporting these LED devices mounted thereon. The package 1 portion of each LED device 800 is fitted into the housing portion 61A formed inside the lens 61 from above the housing portion. In addition, each lens 61 is attached to each holder portion 62A of the lens holder 62.

In the example illustrated in FIG. 28, a total of 16 units of LED devices 800, i.e., eight units each of the first LED devices 800A and second LED devices 800B are mounted on the circuit board 31I. Note here that the circuit board 31I is the same in laminated structure as the circuit board 31 described in Practical Example 1 (see FIG. 11). Referring to FIG. 11, the circuit board 31I is such that an insulating resin layer 36A is laminated on a base material portion 36 structured using aluminum as a heat-conducting material, and a current supply conductor layer 32 is further laminated on the base material portion 36. This current supply conductor layer 32 is planarly formed so as to cover almost the entire surface of the base material portion 36. In addition, an insulating resin layer 37 is laminated on the current supply conductor layer 32 as an uppermost layer. The current supply conductor layer 32 is exposed only at the portions thereof to be joined to electrodes 21 formed on the lower surface of each base 2 and external terminal portions with solder or the like, when the LED devices 800 are mounted on the circuit board 31I. The rest of the current supply conductor layer 32 is covered with the insulating resin layer 37.

Figure 30:
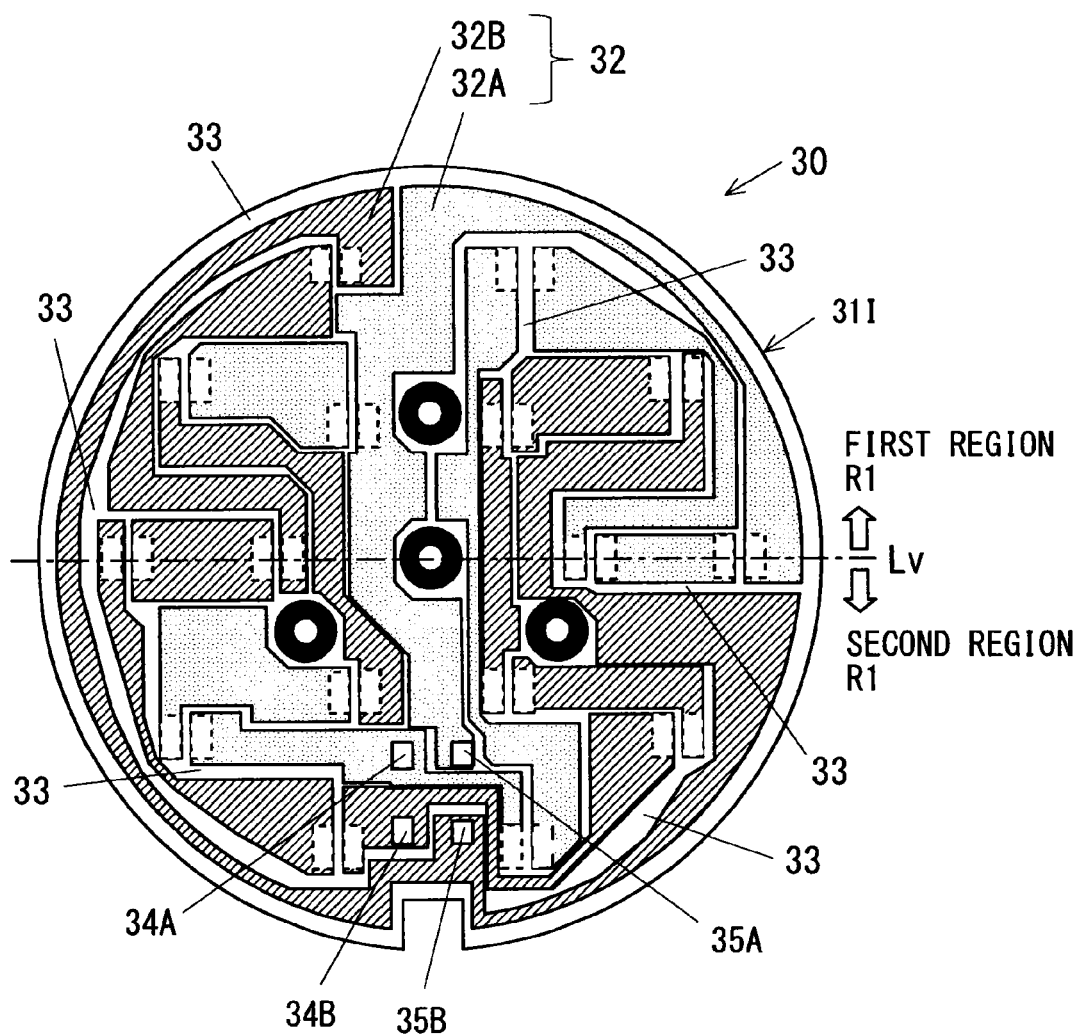
FIG. 30 is a drawing illustrating a current supply conductor layer of a circuit board according to Practical Example 4.

Next, a description will be made of the current supply conductor layer 32 of the circuit board 31I. FIG. 30 is a drawing illustrating the current supply conductor layer 32 of the circuit board 31I in the present practical example. The planar region of the current supply conductor layer 32 is planarly divided by an insulator 33. More specifically, the current supply conductor layer 32 is divided by the insulator 33 into a first current supply conductor layer 32A and a second current supply conductor layer 32B different from each other in the path through which a drive current flows. The first current supply conductor layer 32A supplies the drive current of LED elements 3 to the first LED devices 800A, whereas the second current supply conductor layer 32B supplies the drive current of LED elements 3 to the second LED devices 800B. In the present practical example, the luminescence control of the first LED devices 800A and the second LED devices 800B can be performed using independent control systems since the first current supply conductor layer 32A and the second current supply conductor layer 32B are isolated from each other.

Two regions divided off when the planar region of the circuit board 31I having a circular shape, more specifically, the planar region of the current supply conductor layer 32 is bisected by a virtual straight line Lv passing through the center of the circuit board 31I are defined as a first region R1 and a second region R2, respectively. As is obvious from FIG. 30, both the first current supply conductor layer 32A and the second current supply conductor layer 32B are included in each of the first region R1 and the second region R2. In the circuit board 31I according to the present practical example, the current supply conductor layer 32 is planarly divided by the insulator 33, so that the first current supply conductor layer 32A included in the first region R1 and the first current supply conductor layer 32A included in the second region R2 is substantially the same in area. In addition, the current supply conductor layer 32 is planarly divided by the insulator 33, so that the second current supply conductor layer 32B included in the first region R1 and the second current supply conductor layer 32B included in the second region R2 is substantially the same in area. That is, in the present practical example, the area of portions of respective drive current paths formed on the current supply conductor layer 32 belonging to the first region R1 and the area of portions of the respective drive current paths belonging to the second region R2 are substantially the same. Thus, areas of the power supply conductor layer 32 in which a drive current of the same control system flows can be made to be substantially the same in the first region R1 and the second region R2 when the planar region of the circuit board 31I is bisected by the virtual straight line Lv into the first region R1 and the second region R2. Consequently, it is possible to prevent the distribution of heat transmitted from each LED device 800 to the power supply conductor layers 32A and 32B from being excessively biased toward the planar direction of the circuit board. Consequently, it is possible to further enhance the heat dissipation performance of each LED device 800.

In addition, as illustrated in FIG. 28, the respective LED devices 800 mounted on the circuit board 31I are circularly arranged in an array, so that pitches among the LED devices 800 are equiangular (the way of this arrangement is indicated by chain lines in the figure). Specifically, three pieces each of first LED devices 800A and second LED device 800B are alternately disposed in an array on a circular line indicated by an inner single-dot chain line. In addition, five pieces each of first LED devices 800A and second LED devices 800B are alternately disposed in an array on a circular line indicated by an outer two-dot chain line. By disposing the LED devices 800 as described above, the first LED devices 800A and the second LED devices 800B in control systems different from each other are alternately placed adjacently to one another, without causing LED devices the same in control system to unevenly distribute in one area. Thus, it is possible to suitably suppress the color unevenness of synthetic light in the light-emitting module 30 as a whole. In addition, by equiangularly arranging the first LED devices 800A and the second LED devices 800B to be disposed on virtual circular lines (two circular lines in this configuration example), it is possible to further facilitate color mixing in the synthetic light of the light-emitting module 30.

In FIG. 30, void portions enclosed with dashed lines in the figure are virtual representations of portions to be solder-joined to the electrodes 21 of the bases 2 of the LED devices 800, i.e., portions of the current supply conductor layer 32 exposed after the lamination of the insulating resin layer 37. In addition, cross-hatched portions in the figure are virtual representations of portions where respective external terminal portions 34 and 35 are formed.

In the circuit board 31I according to the present practical example, the current supply conductor layer 32 is composed using a thermally-conductive material and is planarly formed over almost the entire surface of the base material portion 36. Accordingly, heat drawn from each LED device 8 by the current supply conductor layer 32 can be released with the heat spread in the planar direction of the circuit board 31I. That is, locally-concentrated heat in each LED device 800 can be efficiently drawn from the LED device 800, while suitably dispersing the heat in the planar direction of the circuit board 31I. In addition, the heat transmitted to the current supply conductor layer 32 from each LED device 800 is released from the heat-radiating housing member 50 into the atmosphere through the base material portion 36 composed likewise using a thermally-conductive material. Thus, it is possible to accelerate the cooling of the LED device 800.

<LED Lighting System LS>

Figure 31:
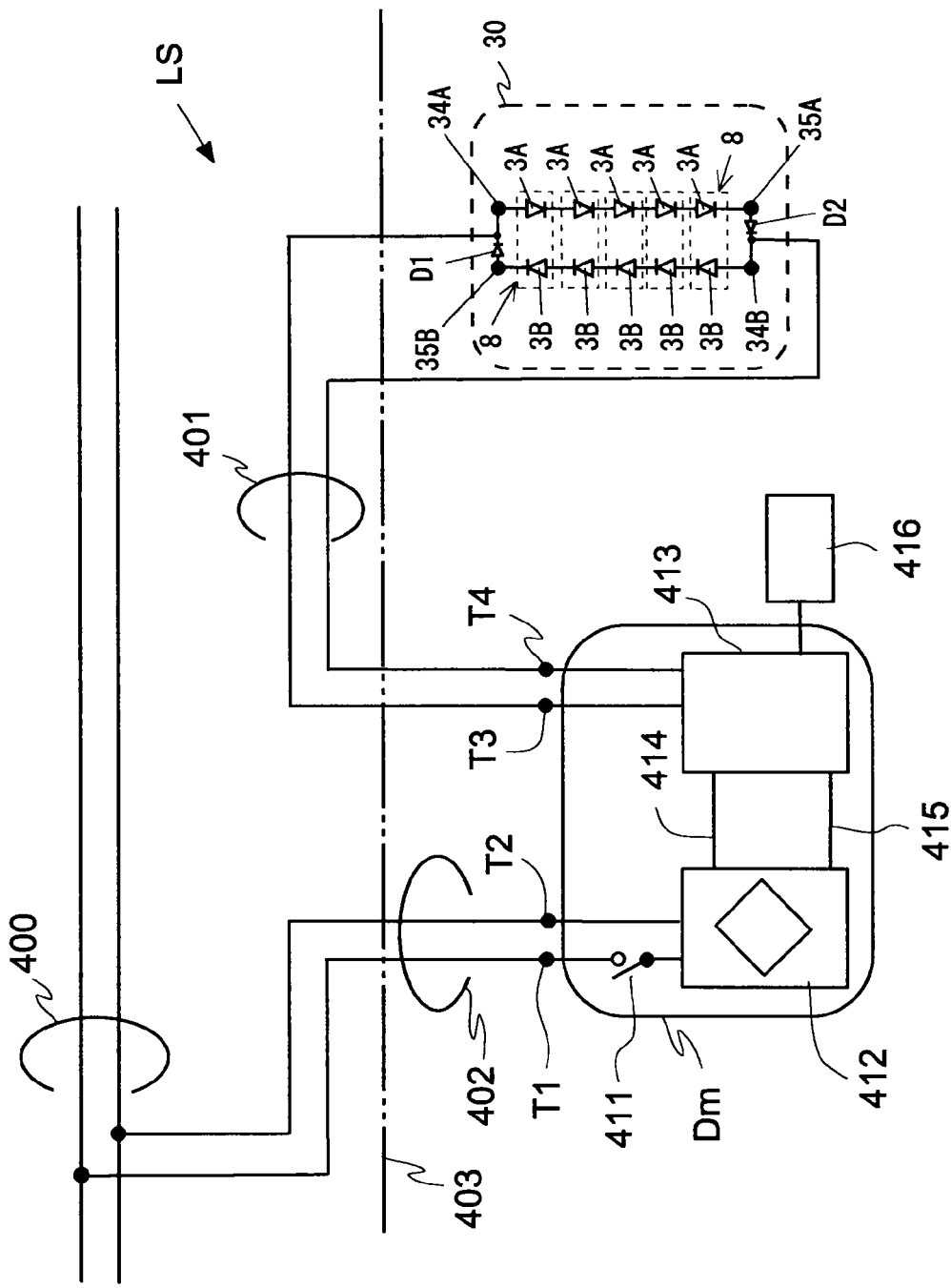
FIG. 31 is a drawing illustrating a schematic circuit configuration of a lighting system according to an embodiment.
Figure 32:
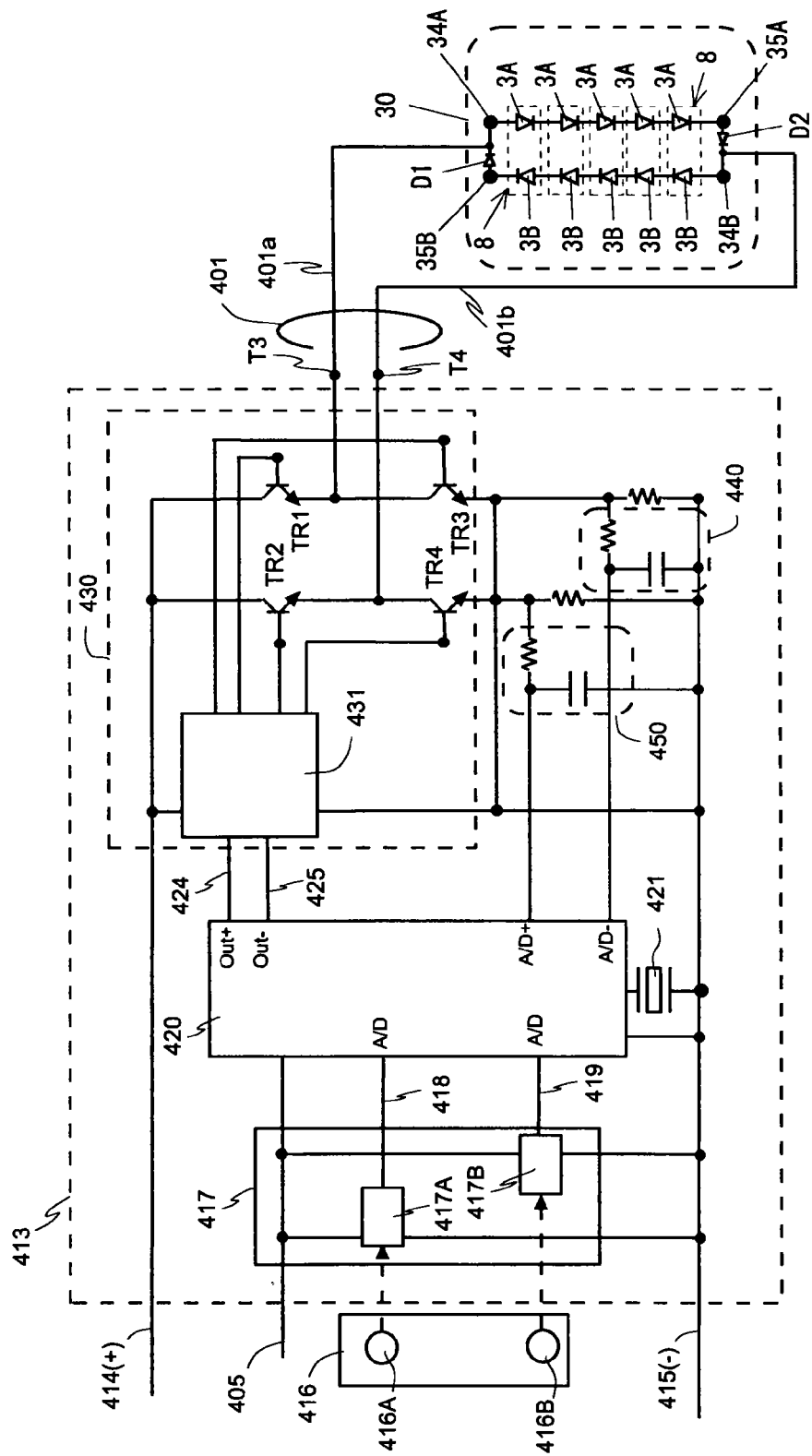
FIG. 32 is a drawing illustrating a configuration example of a control circuit illustrated in FIG. 31.

Next, a description will be made of a lighting system LS according to the present embodiment. FIG. 31 is a drawing illustrating an overview of the circuit configuration of the lighting system LS, whereas FIG. 32 is a drawing illustrating a configuration example of a control circuit depicted in FIG. 31.

The lighting system LS has a wiring structure in which a pair of power-feeding lines from a power supply is connected to a dimming device Dm, and the dimming device Dm and a light-emitting module 30 are connected to each other with a pair of power-feeding lines (drive current supply lines). The lighting system LS is suitably applied to a building in which a pair of lead-in lines is led to the installation position of the dimming device Dm from the power supply (commercial power source), and a pair of power-feeding lines is previously laid down between the installation positions of the dimming device Dm and the light-emitting module 30. The dimming device Dm is a control apparatus which supplies electrical power to the respective LED devices 8 through the power supply conductor layer 32 of the light-emitting module 30 for each drive current control system by means of PWM (Pulse Width Modulation) control, and performs the color tuning of the LED devices 8. That is, the dimming device Dm independently controls electrical power to be supplied to the power supply conductor layer 32 for each drive current path allocated to each LED device 8, thereby performing the color tuning of the LED device 8.

FIG. 31 illustrates an electrical wire installation space (upper side of the virtual line 403), and an installation space (lower side of the virtual line 403) of the lighting system LS in which the dimming device Dm (dimmer box) and the light-emitting module 30, to which electrical wires are connected, are disposed, with a virtual line 403 indicated by a two-dot chain line as the boundary between the spaces. The electrical wire installation space is generally provided on the inner side of a wall or behind a ceiling, and is isolated from the installation space of the lighting system LS by the wall or the ceiling. In the example illustrated in FIG. 31, a pair of commercial power bus lines 400 supplied with power from a commercial power source (for example, 100 V AC, 50 Hz), a pair of power-feeding lines 401 (401a and 401b) for lighting apparatus, and a pair of lead-in lines 402 for blinking lighting apparatus drawn from the commercial power bus lines 400 are wired to the electrical wire installation space.

A pair of input-side terminals T1 and T2 included in the dimming device Dm is connected to the lead-in lines 402. The dimming device Dm includes a pair of output-side terminals T3 and T4. The terminals T3 and T4 are connected to the power-feeding lines 401 (401a and 401b) for lighting apparatus. On the other hand, the respective external terminal portions 34A, 35B, 35A and 34B of the light-emitting module 30 are connected to the power-feeding lines 401 for lighting apparatus. Note that a description will be made here by citing the case in which the lighting system LS is built by applying the light-emitting module 30 according to Practical Example 1 (mainly FIGS. 10 to 12).

The dimming device Dm receives an AC voltage of the commercial power source supplied from the terminals T1 and T2. The dimming device Dm includes a full-wave rectification type DC power supply circuit (hereinafter simply referred to as "power supply circuit") 412. The dimming device Dm can provide stable DC power by means of this power supply circuit 412, irrespective of the conduction state of loads. The power supply circuit 412 is connected to a control circuit 413 through DC power supply lines 414 and 415. If a commercial AC power supply has an RMS value of 100 V, the power supply circuit 412 serves as a DC power source for supplying a DC voltage of approximately 140 V under no load through the power supply lines 414 and 415.

As illustrated in FIG. 32, the control circuit 413 is provided with a manipulated variable detection unit 417 connected to an operating unit 416, a control apparatus 420, and a drive unit 430. The drive unit 430 includes a driving logic circuit (control circuit) 431, and a drive circuit 432 which is an H-type bridge circuit. The output terminals of the drive circuit 432 are connected to the terminals T3 and T4, and to the light-emitting module 30 through the power-feeding lines 401 for lighting apparatus. In the respective LED devices 8 of the light-emitting module 30, the LED elements 3A and 3B are parallel-connected oppositely to each other (in reverse polarities).

The operating unit 416 is an operating device used to perform the adjustment (dimming) of the luminance (luminous intensity) and the adjustment (color-tuning) of the chromaticity (hue and color temperature) of light emitted from the light-emitting module 30. More specifically, the operating unit 416 includes an operating dial 416A for dimming, and an operating dial 416B for color tuning. A user can adjust the luminance (luminous intensity) and chromaticity (hue and color temperature) of the light-emitting module 30 by rotating the respective dials 416A and 416B.

The manipulated variable detection unit 417 is a signal generator for outputting signals according to the amounts of dial rotation (angles of dial rotation) which are the manipulated variables of the respective operating dials 416A and 416B. In the present embodiment, the manipulated variable detection unit 417 includes a variable resistor 417A the resistance value of which varies according to the amount of rotation (angle of rotation) of the operating dial 416A, and a variable resistor 417B the resistance value of which varies according to the amount of rotation (angle of rotation) of the operating dial 416B. The manipulated variable detection unit 417 is connected to the power supply circuit 412 through a wire 405. A predetermined DC voltage (for example, a maximum of 5 V under no load) generated at the power supply circuit 412 from the commercial AC power supply is applied to the manipulated variable detection unit 417 through the wire 405.

A voltage (for example, a maximum of 5 V) according to the resistance value of the variable resistor 417A is generated on a wire (signal line) 418 connecting between the manipulated variable detection unit 417 and the control apparatus 420. On the other hand, a voltage (for example, a maximum of 5 V) according to the resistance value of the variable resistor 417B is generated on a wire (signal line) 419 connecting between the manipulated variable detection unit 417 and the control apparatus 420. As described above, the manipulated variable detection unit 417 generates signal voltages according to the respective manipulated variables of the operating dials 416A and 416B.

Note that slide bars are applicable as substitutes for the operating dials 416A and 416B. If a slide bar is applied, a voltage (signal) according to the amount of displacement, instead of the amount of rotation, is generated at the manipulated variable detection unit 417. In addition, the manipulated variable detection unit 417 outputs a voltage according to a variable resistance value as a control signal. Alternatively, rotary encoders for detecting the amounts of rotation (angles of rotation) of the operating dials 416A and 416B may be provided so that pulses indicative of the amount of rotation of each rotary encoder is input to the control apparatus 420. In this case, it is possible to exclude such analog/digital converters for converting a voltage to a digital value as will be described later.

The control apparatus 420 is a control circuit which combines analog/digital converters (A/D converters), a microcomputer (MP), registers, timers, counters, and the like. As the microcomputer, it is possible to apply, for example, a microprocessor with a built-in memory whose master clock operates at an operating frequency (for example, 4 MHz) provided from an unillustrated crystal oscillator. The microcomputer is not limited to this processor, however. The microcomputer loads an operating program recorded in an unillustrated built-in ROM (Read Only Memory) into an unillustrated RAM (Random Access Memory) to execute processes according to the program.

Each analog/digital converter of the control apparatus 420 outputs the digital value of a voltage developed on the signal line 418. The digital value is set in an unillustrated register. Likewise, the analog/digital converter outputs the digital value of a voltage developed on the signal line 419, and the digital value is set in an unillustrated register. In addition, the timers and counters included in the control apparatus 420 are driven by a ceramic oscillator 421 which oscillates at a desired self-oscillation frequency (for example, 1 MHz). Thus, the control apparatus 420 self-excitedly outputs complementary pulses at a preset timing from wires 424 and 425 connecting between the control apparatus 420 and the driving logic circuit 431. These complementary pulses are previously set so that the repetition frequency thereof equals, for example, a predetermined frequency.

The microcomputer of the control apparatus 420 executes a control pulse generation process of generating control pulses (control signals) according to digital values (manipulated variables of the operating dials 416A and 416B) set in respective registers. The microcomputer then supplies (outputs) the generated pulses to the driving logic circuit 431. Note that the pulses (control signals) generated by the microcomputer are supplied to the driving logic circuit 431 through the wires 424 and 425.

In response to a supply of pulses (control signals) from the wires 424 and 425, the driving logic circuit 431 controls the on/off operation (switching operation) of transistors (switching elements) TR1 to TR4 according to the control signals. That is, the control circuit 431 turns off the transistors TR1 to TR4 in the absence of pulse input from the wires 424 and 425. On the other hand, the control circuit 431 turns on the transistors TR1 and TR4 and turns off the transistors TR2 and TR3, while a positive pulse is being input from the wire 424. Consequently, a DC current supplied from the power supply circuit 412 through the wire 414 passes through the transistor TR1 and flows through the power-feeding line 401a to be consumed in the lighting of LED elements 3A. Thereafter, the current passes through the power-feeding line 401b and the transistor TR4 and flows through the wire 415 (grounded).

In contrast, the driving logic circuit 431 turns on the transistors TR2 and TR3 and turns off the transistors TR1 and TR4, while a negative pulse is being input from the wire 425. Consequently, a DC current supplied from the power supply circuit 412 through the wire 414 passes through the transistor TR2 and flows through the wire 401b to be consumed in the lighting of LED elements 3B. Thereafter, the current passes through the wire 401a and the transistor TR3 and flows through the wire 415 (grounded).

Accordingly, positive and negative drive currents similar in shape to the pulses (control signals) output from the control apparatus 420 are alternately supplied to the light-emitting module 30. In other words, AC currents different in polarity are supplied to the LED elements 3A and the LED elements 3B. Note that in the present embodiment, the positive drive current is defined as a drive current of a first control system, and the negative drive current is defined as a drive current of a second control system. In addition, it is assumed here that a fluorescent portion 14A is higher in the color temperature of emitted light than a fluorescent portion 14B when the LED elements 3A and 3B of each LED device 8 are excited.

Figure 33:
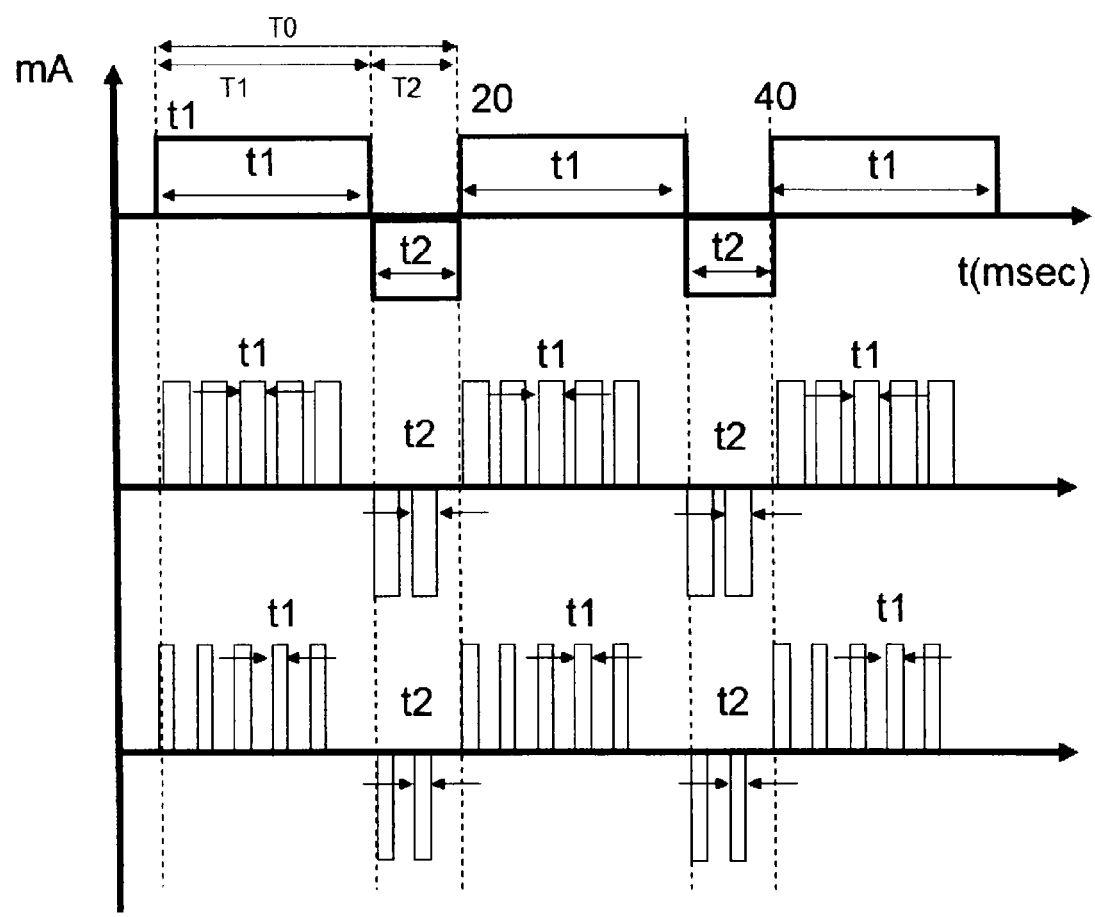
FIG. 33 is an explanatory drawing used to describe the waveform of a drive current supplied to a light-emitting module at the time of making a luminance adjustment.

FIG. 33 is an explanatory view used to describe the waveform of a drive current supplied to the light-emitting module 30 when a luminance adjustment is made. In one cycle (period T0), the drive unit 430 outputs a positive pulse during a period T1 in which a positive control signal is supplied, and outputs a negative pulse during a period T2 in which a negative control signal is supplied. When the operating dial 416A for dimming is operated, the microcomputer of the control apparatus 420 performs pulse width modulation (PWM) control to adjust a duty ratio.

Here, average currents supplied to the LED elements 3A and 3B in each LED device 8 of the light-emitting module 30 depend on the on-state time of pulses. That is, the value of an average drive current supplied to the respective LED elements 3A and 3B in one cycle rises with an increase in the on-state time of positive and negative pulses. Adversely, the value of an average drive current supplied to the LED elements 3A and 3B of each LED device 8 becomes smaller with a decrease in the on-state time of pulses due to the decrease of a duty ratio.

The upper section of FIG. 33 indicates pulses when the duty ratio is 1. In this case, a single pulse is output in each of periods T1 and T2 of positive and negative pulse supply. The middle section of FIG. 33 indicates a state of duty ratios in the periods T1 and T2 being made lower than the state of duty ratios indicated in the upper section of FIG. 33 through PWM control by the microcomputer. By a change in the duty ratio, the light-emitting module 30 is placed in a state of being supplied with a plurality of positive and negative pulses. The lower section of the figure indicates a state of duty ratios being made even lower than the state of duty ratios indicated in the middle section. In this case, pulse widths t1 and t2 of the respective positive and negative pulses decrease further, compared with the state indicated in the middle section of the figure.

The examples illustrated in the respective sections of FIG. 33 indicate the way the operating dial 416A for dimming is operated so that the luminance (luminous intensity) of the light-emitting module 30 is lowered (decreased) in succession. When the operating dial 416A is operated in this way, the microcomputer of the control apparatus 420 lowers the duty ratio by means of PWM control to shorten the on-state times t1 and t2 of pulses. As a result, an average current supplied to each LED device 8 of the light-emitting module 30 decreases, and the luminance of output light output by the light-emitting module 30 lowers (the luminous intensity of the output light decreases). Note however that the ratio between the on-state times t1 and t2 of pulses in one cycle (positive half-cycle period T1 and negative half-cycle period T2) remains unchanged here. Consequently, it is possible to increase and decrease the luminance (luminous intensity) of the output light without changing the chromaticity (hue and color temperature) of the light-emitting module 30.

Figure 34:
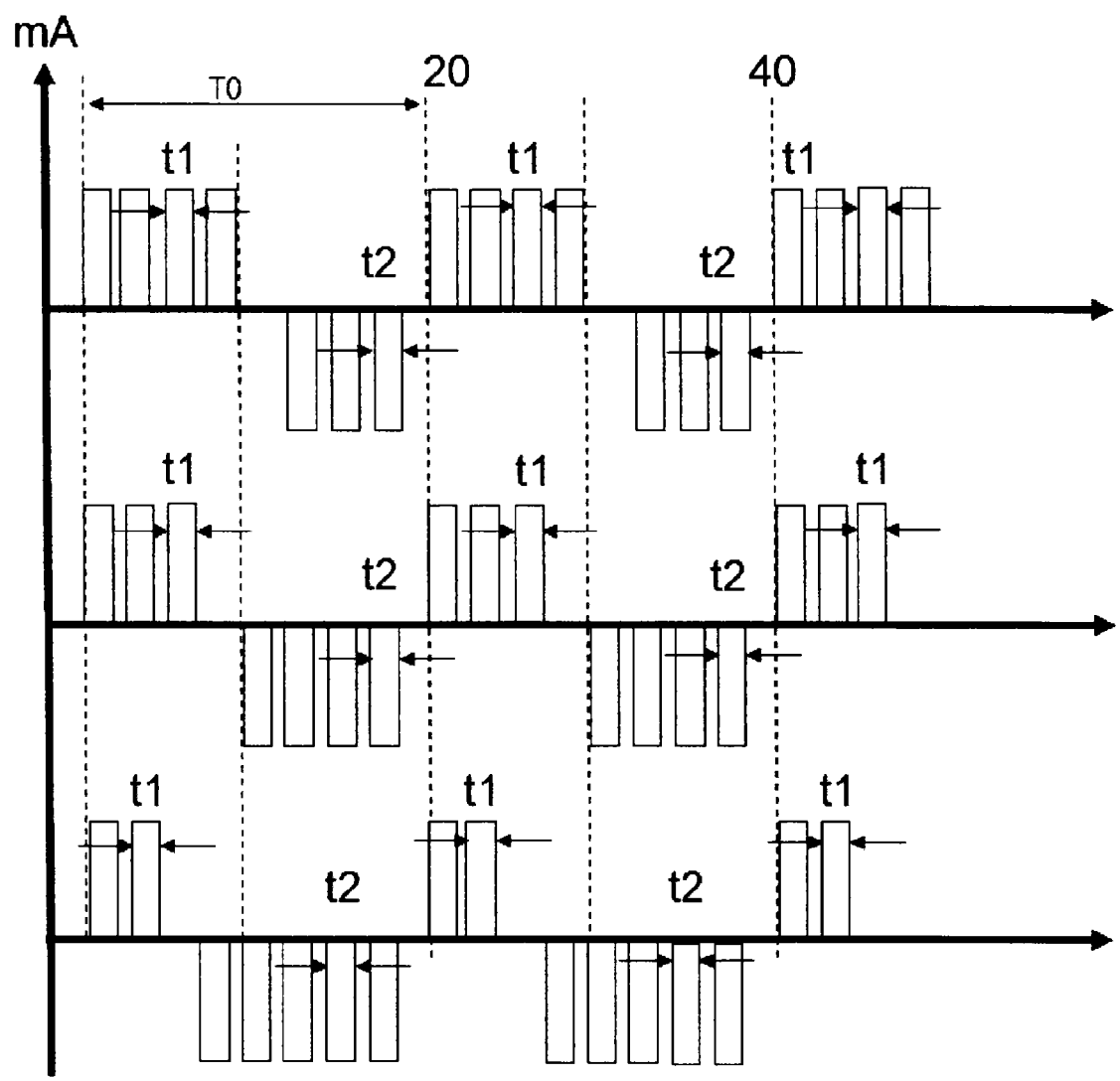
FIG. 34 is an explanatory drawing used to describe the waveform of a drive current supplied to the light-emitting module at the time of making a chromaticity adjustment.

FIG. 34 is an explanatory view of the waveform of a drive current supplied to the light-emitting module 30 when a chromaticity adjustment is made. States of pulses when the operating dial 416B is operated are indicated in the respective sections of FIG. 34. When the operating dial 416B is operated, the microcomputer of the control apparatus 420 changes the number of positive and negative pulses in one cycle (period T0), without changing pulse widths at that time. In the upper section of FIG. 34, the pulse widths t1 and t2 are the same in positive and negative half cycles, and the on-state time ratios of pulses in the positive and negative half cycles are 4:3.

In contrast, in the middle section of the figure, the on-state time ratios of pulses in the positive and negative half cycles are changed to 3:4. In addition, in the lower section of the figure, the on-state time ratios of pulses in the positive and negative half cycles are changed to 2:5. Changing such an on-state time ratio of pulses in positive and negative cycles causes a change in the lighting time ratio in one cycle between the LED elements 3A and LED element 3B of each LED device 8. Consequently, a change is made to the chromaticity (hue and color temperature) of synthetic light emitted as a result of the LED elements 3A supplied with a drive current of a first control system and the LED elements 3B supplied with a drive current of a second control system being turned on.

From the viewpoint of the sensitivity of human eyes, the prevention of switching loss, and noise generation, the repetition frequency T0 (self-oscillation frequency) used to output the above-described positive and negative pulses may be determined within the range of, for example, 30 Hz to 50 kHz. The range is preferably from 50 Hz to 400 Hz, and even more preferably from 50 or 60 Hz to 120 Hz. The self-oscillation frequency may be determined independently from the frequency of a commercial power source. The present embodiment does not preclude, however, the selection of the same frequency as the frequency of the commercial power source.

Note that as illustrated in FIG. 32, integrating circuits 450 and 440 are arranged in the control circuit 413 in the present embodiment. The integrating circuit 450 feeds back a voltage proportional to the average value of a positive current (drive current of the first control system) used to drive the LED elements 3A to the control apparatus 420. Likewise, the integrating circuit 440 feeds back a voltage proportional to the average value of a negative current (drive current of the second control system) used to drive the LED elements 3B to the control apparatus 420. The control apparatus 420 observes the feedback voltages of the integrating circuits 440 and 450 by using analog/digital converters to utilize the voltages for the generation of control signals (pulses).

Hereinafter, a description will be made of examples of the operation of the dimming device Dm. When a master power switch 411 (see FIG. 31) is closed, rectification and voltage conversion operation based on the power supply circuit 412 are performed to supply DC power to the control circuit 413. The microcomputer of the control apparatus 420 starts initialization operation by a heretofore-known method, loads an operating program recorded in an unillustrated built-in ROM (Read Only Memory) into an unillustrated RAM (Random Access Memory), and performs processes according to the program.

When an adjustment is made to the luminance of the light-emitting module 30, there are performed such a operation and the operation of a dimming device 410 as described below. If, for example, the user fully rotates the operating dial (operating knob) 416A clockwise to set the luminance (luminous intensity) of lighting to a maximum, a DC voltage of a maximum of 5.0 volts develops on the signal line 418. The control apparatus 420 converts the voltage generated on the signal line 418 to a digital signal by a built-in analog/digital converter to read the digital signal, and provides a control signal to the driving logic circuit 431 of the drive circuit 430 through the signal lines 424 and 425. The driving logic circuit 431 drives the drive circuit (H-type bridge) 432 according to the control signal. At that time, the drive circuit 432 is driven at 50 Hz which is a preset self-oscillation frequency.

The waveform of the control signal at this time is as indicated in the upper section of FIG. 33. Accordingly, a positive current flows through the power-feeding line 401a as the drive current of the first control system during a time t1 which is the on-state time of the positive pulse (control signal), and is input to the light-emitting module 30 from the positive external terminal portion 34A. This drive current of the first control system is supplied to the LED elements 3A of each LED device 8 through the first current supply conductor layer 32A. Thus, light is emitted from the fluorescent portion 14A. Note that a diode D1 indicated in FIG. 31 is a diode for backflow prevention used to prevent a positive current (drive current of the first control system) from flowing in the LED elements 3B of each LED device 8.

On the other hand, a negative current flows through the power-feeding line 401b as the drive current of the second control system during a time t2 which is the on-state time of a negative pulse (control signal), and is input to the light-emitting module 30 from the positive external terminal portion 34B. This drive current of the second control system is supplied to the LED elements 3B of each LED device 8 through the second current supply conductor layer 32B. Thus, light is emitted from the fluorescent portion 14B. A diode D2 indicated in FIG. 31 is a diode for backflow prevention used to prevent a negative current (drive current of the second control system) from flowing in the LED elements 3A of each LED device 8. The LED elements 3A and 3B of each LED device 8 in the light-emitting module 30 alternately light up since an AC current of approximately 50 Hz is turned on in the power-feeding lines 401 (401a and 401b).

Here, the ratio between a current flowing during the time t1 and a current flowing during the time t2 governs the chromaticity of synthetic light emitted by the respective LED elements 3A and 3B in the light-emitting module 30. In the state indicated in the upper section of FIG. 33, the lighting time of LED elements 3A relatively high in color temperature is longer than the lighting time of LED elements 3B low in color temperature. Accordingly, the luminescent color of the light-emitting module 30 appears as a slightly bluish white color.

On the other hand, if, for example, the user rotates the operating dial (dimming knob) 416A counterclockwise to set the luminance of lighting to a median value, a DC voltage of approximately 2.5 volts develops on the signal line 418. In this case, the microcomputer of the control apparatus 420 converts the voltage to a digital signal by a built-in analog/digital converter to read the digital signal, controls the drive of the drive unit 430, and supplies an AC current to the light-emitting module 30. A pulse waveform at this time is in the state indicated in the middle section of FIG. 33. That is, although the ratio between the on-state time of a positive pulse in the period T1 and the on-state time of a negative pulse in the period T2 remains unchanged, a single pulse at the maximum level of luminance changes to a plurality of pulses since a duty ratio has lowered. Here, the pulse width of the positive pulse and the pulse width of the negative pulse are the same. Consequently, the luminance of output light from the LED elements 3A and 3B of the light-emitting module 30 lowers since the average current is smaller than the value thereof at the maximum level of luminance.

Assume that thereafter, the user further rotates the operating dial (dimming knob) 416A counterclockwise to set the luminance of lighting to a minimum value. Then, a DC voltage of approximately 0.5 volts develops on the signal line 418. In this case, the microcomputer of the control apparatus 420 converts the value of the voltage by an analog/digital converter to read the voltage value, and controls the drive unit 430 according to the voltage value. That is, the control apparatus 420 further lowers the duty ratios of positive and negative pulses in the periods T1 and T2, as indicated in the lower section of FIG. 33. Thus, the ratio between the on-state time of a positive pulse in the period T1 and the on-state time of a negative pulse in the period T2 remains unchanged, whereas the pulse width of each pulse decreases further. Consequently, output light from both LED elements 3A and 3B of the light-emitting module 30 has the lowest level of luminance since the average current becomes even smaller, compared with the value thereof at a median level of luminance.

Next, a description will be made of examples of the user's operation and the operation of the dimming device Dm in a case where an adjustment is made to the chromaticity (hue and color temperature) of the light-emitting module 30. As described earlier, the current waveform indicated in the middle section of FIG. 33 exhibits a slightly bluish white color since the average current supplied to LED elements 3A is larger than the average current of LED elements 3B. Here, a description will be made of a case where the user intends to make a change from a state of color, in which the current waveform indicated in the middle section of FIG. 33 is supplied to the light-emitting module 30, to a slightly reddish white color low in Kelvin temperature. In that case, the user rotates the operating dial (color tuning knob) 416B to the left (counterclockwise). Then, the DC voltage (for example, approximately 4 volts) developed on the signal line 419 lowers to, for example, approximately 3.0 volts.

The microcomputer of the control apparatus 420 reads the digital value of the DC voltage on the signal line 419 converted by an analog/digital converter to change the pulse waveform for controlling the drive unit 430. For example, the microcomputer of the control apparatus 420 changes a pulse waveform supplied to the driving logic circuit 431 of the drive unit 430 from the state indicated in the middle section of FIG. 33 to the state indicated in the upper section of FIG. 34. That is, the microcomputer changes the on-state time ratio between a positive current (pulse) and a negative current (pulse), which is 5:2 in the state indicated in the middle section of FIG. 33, to 4:3, as indicated in the upper section of FIG. 34. Consequently, the average current of the first control system supplied to the LED elements 3A of each LED device 8 decreases, whereas the average current of the second control system supplied to the LED elements 3B increases. As a result, the luminescent color, i.e., color temperature of the light-emitting module 30 slightly lowers, thus exhibiting a reddish white color. At that time, the on-state time ratios of pulses in positive and negative cycles change, but the total number of pulses (sum of average currents) in each of the positive and negative cycles remains unchanged. Thus, the luminance of the light-emitting module 30 remains unchanged.

Assume that thereafter, the user rotates the operating dial (chromaticity knob) 416B to the left (counterclockwise) up to the limit with the intension to change to a reddish white color lowest in color temperature. Then, the DC voltage of the signal line 419, which is approximately 3.0 volts, lowers to approximately 1.0 volts. Upon detection of the digital-converted DC voltage of the signal line 419, the microcomputer of the control apparatus 420 changes a control signal (pulse) for driving a full-bridge driver 250 through a driving logic circuit 220. That is, the microcomputer provides control signals to the drive unit 430, so that the waveform of a current flowing through the power-feeding line 401a changes from the state indicated in the upper section of FIG. 34, through the state indicated in the middle section of the figure, to the state indicated in the lower section of the figure. Consequently, the average current of LED elements 3A driven by the drive current of the first control system decreases further, whereas the average current of LED elements 3B driven by the drive current of the second control system increases further. As a result, the color temperature of the light-emitting module 30 lowers further, thus exhibiting a strongly reddish white color. Note that also at this time, the whole luminance of the light-emitting module 30 remains unchanged.

As has been described heretofore, according to the lighting system LS in accordance with the present embodiment, AC currents from an AC power supply, such as a commercial power source, are converted to DC currents, and AC currents of a desired frequency based on a self-oscillation frequency (positive and negative currents supplied in each period T0) are generated from the DC currents and supplied to the LED elements 3A and 3B of each LED device 8 in the light-emitting module 30, respectively, as drive currents. Consequently, it is possible to enhance the degree of freedom in designing the dimming device Dm. According also to this lighting system LS, it is possible to adjust the luminance (brightness) of the light-emitting module 30 without having to change the chromaticity (hue and color temperature) of synthetic light output from the light-emitting module 30. It is also possible to adjust the chromaticity (hue and color temperature) without having to change the luminance (brightness).

Next, a description will be made of a variation of the lighting system LS different from the lighting system described using FIGS. 31 to 34. FIG. 35 is a block diagram illustrating the internal configuration of a second lighting system LS'.

Reference numeral 30 indicated in FIG. 35 denotes a light-emitting module 30 according to any one of the practical examples described above. Here, a description will be made by citing a case in which the second lighting system LS' is configured by applying a light-emitting module 30 according to Practical Example 1 (mainly FIGS. 10 to 12). In the light-emitting module 30, the LED elements 3A and 3B of each LED device 8 are connected in antiparallel (parallel-connected with reverse polarities).

In addition, the second lighting system LS' is provided with a solid state relay (SSR) 502 the secondary side of which is connected in series with the light-emitting module 30; a driver circuit 503 for supplying a pulse signal used to control the conduction/nonconduction of the secondary side with respect to the primary side of the solid state relay 502; a commercial power source 504 which is an AC power supply connected in series with each LED device 8 of the light-emitting module 30; a DC power supply 505 for applying a DC voltage to the driver circuit 503; a resistor 506 connected to the secondary side of the solid state relay 502; and the like.

In the light-emitting module 30, the LED elements 3A of each LED device 8 are connected in series with one another, so that the forward directions thereof are oriented in the same direction. The drive current of the first control system is supplied to these LED elements 3A. Likewise, the LED elements 3B of each LED device 8 are connected in series with one another, so that the forward directions thereof are oriented in the same direction. The drive current of the second control system is supplied to these LED elements 3B. A group of LED elements 3A connected in series with one another and a group of LED elements 3B connected in series with one another are connected in parallel to each other.

One end of the commercial power source 504 is connected to one connection node 507 of the light-emitting module 30, and one secondary-side terminal of the solid state relay 502 is connected to the other connection node 508. One end of the resistor 506 is connected to the other secondary-side terminal 510 of the solid state relay 502, and the other end of the resistor 506 is connected to the other end of the commercial power source 504. Accordingly, the light-emitting module 30 (LED device 8), the secondary side circuit of the solid state relay 502 and the resistor 506 are connected in series with the commercial power source 504. In addition, the external terminal portions 34A and 35B of the light-emitting module 30 are connected to the connection node 507, and the external terminal portions 35A and 34B of the light-emitting module 30 are connected to the connection node 508.

A pulse signal output from the driver circuit 503 is input to the primary side of the solid state relay 502 to control the conduction/nonconduction of the secondary side thereof. As pulse signals, the driver circuit 503 outputs a first pulse signal Ps1 (first control system) for phase-controlling a half cycle in which an AC voltage from the commercial power source 504 is positive, and a second pulse signal Ps2 (second control system) for phase-controlling a half cycle in which the AC voltage from the commercial power source 504 is negative. The first pulse signal Ps1 is input to the solid state relay 502, thereby setting a first period during which the secondary side is conductive in the half cycle in which the AC voltage from the commercial power source 504 is positive. In addition, the second pulse signal Ps2 is input to the solid state relay 502, thereby setting a second period during which the secondary side is conductive in the half cycle in which the AC voltage from the commercial power source 504 is negative.

The second lighting system LS' is further provided with an operating unit 509 for externally inputting the first period and the second period. The driver circuit 503 receives a signal output by the operating unit 509, thereby setting the output timings of the first pulse signal Ps1 and the second pulse signal Ps2 to be output from the driver circuit 503. The second lighting system LS' is further provided with an infrared signal receiver 511 for receiving an infrared signal from a remote controller 510 used to set and input the above-described first and second periods. The infrared signal receiver 511 outputs a command to the driver circuit 503 according to the infrared signal received from the remote controller 510. This command sets the output timings of the first pulse signal Ps1 and the second pulse signal Ps2 to be output from the driver circuit 503. Accordingly, in this configuration example, a signal provided from the operating unit 509 or the infrared signal receiver 511 to the driver circuit 503 serves as the dimming control signal of each LED device 8 in the light-emitting module 30.

In the second lighting system LS' configured as mentioned above, the light emission time of each of the LED elements 3A and LED elements 3B in each LED device 8 is controlled according to the output timings of the first pulse signal Ps1 and the second pulse signal Ps2 output from the driver circuit 503. As a result, it is possible to freely perform the color tuning of each LED device 8.

The embodiments having been discussed heretofore are only examples used to describe the present invention. Accordingly, various modifications may be made to the abovementioned embodiments without departing from the main idea of the present invention. In addition, although an LED device which outputs white light is adopted by way of example as each LED device 8 of the light-emitting module 30 in the present embodiment, the present invention may be applied, as a matter of course, to light-emitting devices which output light in other colors. Yet additionally, a circuit board, a light-emitting module, a lighting apparatus, and a lighting system supporting semiconductor light-emitting devices (LED devices) according to the present invention mounted thereon are not limited to the abovementioned embodiments, but can include all possible combinations thereof.

EXPLANATION OF REFERENCE NUMERALS

1 ... Package
2 ... Base
3, 3A and 3B ... Semiconductor light-emitting element (LED element)
8 ... Semiconductor light-emitting device (LED device)
11 ... Partition
12, 12A, 12B ... Divided regional section
13 ... Opening
20, 20A, 20B ... Trace
21A, 21B ... Electrode
30 ... Light-emitting module
31 ... Circuit board
32, 32A, 32B ... Current supply conductor layer
33 ... Insulating member
36 ... Base material portion
37 ... Electrically-insulating protective coating layer
50 ... Heat-radiating housing member
51 ... Radiating fin portion
52 ... Housing

What is claimed is:
1. A light-emitting module comprising: a semiconductor light-emitting device provided with at least a semiconductor light-emitting element and a phosphor; and a circuit board for supporting the semiconductor light-emitting device mounted thereon, wherein, on the circuit board, at least a semiconductor light-emitting device including a plurality of semiconductor light-emitting elements each having a different path of a drive current to be supplied or a plurality of semiconductor light-emitting devices each having a different path of a drive current to be supplied to each semiconductor light-emitting element is mounted, the circuit board is provided with a base material portion formed using a heat-conducting material; and a power supply conductor layer for supplying the drive currents for semiconductor light-emitting elements to the semiconductor light-emitting devices, the power supply conductor layer is formed planarly using the heat-conducting material so as to cover a planar surface of the base material portion, and the planar region of the power supply conductor layer is planarly divided by an insulator for each of the drive current paths.

2. The light-emitting module according to claim 1, wherein the regions of the power supply conductor layer each having a different path of the drive current are formed so as not to overlap one on top of another.

3. The light-emitting module according to claim 1, wherein a heat-radiating housing member is attached to the base material portion, so as to be in thermal contact with a non-mounting surface thereof on which the semiconductor light-emitting device is not mounted, thereby dissipating heat transmitted from the semiconductor light-emitting device side through the power supply conductor layer to the base material portion into the atmosphere from the heat-radiating housing member.

4. The light-emitting module according to claim 1, wherein a drive current in a different control system flows in each region of the power supply conductor layer divided off by the insulator for each of the drive current paths.

5. The light-emitting module according to claim 1, wherein the semiconductor light-emitting device includes a package for housing the semiconductor light-emitting element and the phosphor, the package is provided with an opening open in the emission direction of the semiconductor light-emitting device and at least two divided regional sections open in divided openings which are defined by dividing the interior of the package into two or more regions and are parts of the opening, each of the divided regional sections includes a fluorescent portion including the phosphor and a translucent material for sealing the divided regional sections, spectrums of light output from the fluorescent portion being different from each other between at least one divided regional section and another divided regional section, and a drive current is supplied to a divided regional section different in the spectrum of output light through a different path of the power supply conductor layer.

6. The light-emitting module according to claim 5, wherein the interior of the package is segmented into two divided regional sections by a partition erected from the base member, two trace sections for supporting semiconductor light-emitting elements mounted thereon, which are housed in the respective divided regional sections, are arranged in the base member, and each trace section intersects with the partition as a result of a pair of electrodes being provided in regions opposed to each other across the partition within the planar region of the base member.

7. The light-emitting module according to claim 5, wherein the semiconductor light-emitting element provided in one divided regional section and the semiconductor light-emitting element provided in another divided regional section, the semiconductor light-emitting elements being different in the spectrum of output light from each other, are opposite in polarity to each other and connected in parallel with each other.

8. The light-emitting module according to claim 1, wherein the insulator includes a first insulator circularly formed within the plane of the circuit board, and regions of the power supply conductor layer each having a different path of the drive current are insulated from each other by the first insulator.

9. The light-emitting module according to claim 8, wherein the insulator further includes a second insulator for planarly dividing off the regions of the power supply conductor layer divided off by the first insulator, the semiconductor light-emitting device is mounted on the circuit board, so as to cross the upper portion of the one second insulator, and one and the other regions divided off by the one second insulator are electrically connected to each other by the internal trace of the semiconductor light-emitting device.

10. The light-emitting module according to claim 1, wherein the semiconductor light-emitting device includes a package for housing the semiconductor light-emitting element and the phosphor, the package is provided with an opening open in the emission direction of the semiconductor light-emitting device, and a fluorescent portion including the phosphor and a translucent material for sealing the opening, the circuit board supports a plurality of the semiconductor light-emitting devices mounted thereon, the spectrums of light output from the fluorescent portions differ from each other between at least one semiconductor light-emitting device and another semiconductor light-emitting device, and drive currents are supplied to the fluorescent portions different in the spectrum of output light through different paths of the power supply conductor layer.

11. The light-emitting module according to claim 10, wherein when the planar region of the power supply conductor layer is bisected into a first region and a second region by a virtual straight line, an area of the planar region belonging to the first region, and an area of the planar region belonging to the second region in each drive current path are substantially the same.

12. The light-emitting module according to claim 10, wherein the plurality of the semiconductor light-emitting devices is disposed circularly and equiangularly on the circuit board, and one and another semiconductor light-emitting devices supplied with drive currents in control systems different from each other through different paths of the power supply conductor layer are annularly disposed in an alternate manner.

13. The light-emitting module according to claim 4, wherein a plurality of the semiconductor light-emitting devices is mounted on the circuit board, and the power supply conductor layer is such that, among traces for implementing the semiconductor light-emitting elements provided in each semiconductor light-emitting device, those that use the same drive current control system are connected in series with one another.

14. The light-emitting module according to claim 1, wherein the current supply conductor layer is formed so that the ratio of an area in which the current supply conductor layer is formed to the entire surface area of the base material portion is 70% or higher.

15. A circuit board for supporting a semiconductor light-emitting device provided with at least a semiconductor light-emitting element and a phosphor, wherein, on the circuit board, at least a semiconductor light-emitting device including a plurality of semiconductor light-emitting elements each having a different path of a drive current to be supplied or a plurality of semiconductor light-emitting devices each having a different path of a drive current to be supplied to each semiconductor light-emitting element is mounted, the circuit board comprises a base material portion formed using a heat-conducting material; and a power supply conductor layer for supplying the drive currents for semiconductor light-emitting elements to the semiconductor light-emitting devices, the power supply conductor layer is formed planarly using the heat-conducting material so as to cover a planar surface of the base material portion, and the planar region of the power supply conductor layer is planarly divided by an insulator for each drive current path.

16. A lighting apparatus comprising a light-emitting module according to claim 1.

17. A lighting system comprising:
   a light-emitting module according to claim 1; and
   a control apparatus for independently controlling electrical power to be supplied to the power supply conductor layer for each of the drive current paths to adjust the color of light emitted from the semiconductor light-emitting device.

* * * * *